United States Patent
Nguyen et al.

(10) Patent No.: US 12,278,591 B2
(45) Date of Patent: Apr. 15, 2025

(54) ROOFING SHINGLES FOR MIMICKING THE APPEARANCE OF PHOTOVOLTAIC MODULES

(71) Applicant: GAF Energy LLC, Parsippany, NJ (US)

(72) Inventors: Thierry Nguyen, San Francisco, CA (US); Matthew Grigsby, San Francisco, CA (US); Anna Wojtowicz, Santa Clara, CA (US); Richard Perkins, San Jose, CA (US); Henry Krevor, San Carlos, CA (US); Caleb Cheung, San Jose, CA (US); Rory Runser, San Diego, CA (US); Dan Hua, San Jose, CA (US); Janany Kugathasan, Langley (CA)

(73) Assignee: GAF Energy LLC, Parsippany, NJ (US)

( * ) Notice: Subject to any disclaimer, the term of this patent is extended or adjusted under 35 U.S.C. 154(b) by 0 days.

(21) Appl. No.: 18/487,775

(22) Filed: Oct. 16, 2023

(65) Prior Publication Data

US 2024/0120877 A1    Apr. 11, 2024

Related U.S. Application Data

(63) Continuation of application No. 18/157,407, filed on Jan. 20, 2023, now Pat. No. 11,824,486.
(Continued)

(51) Int. Cl.
*H02S 20/25* (2014.01)
*E04D 1/20* (2006.01)
(Continued)

(52) U.S. Cl.
CPC ............... *H02S 20/25* (2014.12); *E04D 1/20* (2013.01); *E04D 1/265* (2013.01); *F24S 2020/13* (2018.05)

(58) Field of Classification Search
CPC . E04D 1/18; E04D 1/265; H02S 20/25; F24S 2020/13
See application file for complete search history.

(56) References Cited

U.S. PATENT DOCUMENTS

| | | |
|---|---|---|
| 1,981,467 A | 11/1934 | Radtke |
| 3,156,497 A | 11/1964 | Lessard |

(Continued)

FOREIGN PATENT DOCUMENTS

| | | |
|---|---|---|
| CA | 2829440 A | 5/2019 |
| CH | 700095 A2 | 6/2010 |

(Continued)

OTHER PUBLICATIONS

Sunflare, Procducts: "Sunflare Develops Prototype for New Residential Solar Shingles"; 2019 «sunflaresolar.com/news/sunflare-develops-prototype-for-new-residential-solar-shingles» retrieved Feb. 2, 2021.

(Continued)

*Primary Examiner* — Adriana Figueroa
(74) *Attorney, Agent, or Firm* — GREENBERG TRAURIG, LLP

(57) ABSTRACT

A system including a plurality of photovoltaic modules and a plurality of roofing shingles installed on a roof deck. Each of the photovoltaic modules includes a plurality of solar cells. Each of the plurality of roofing shingles includes a core layer and a cap layer composed of a first polymer material and having a first surface and a pattern printed on (Continued)

the first surface. The pattern includes a depiction of a plurality of solar cells that extends between the first end and the second end.

20 Claims, 19 Drawing Sheets

Related U.S. Application Data

(60) Provisional application No. 63/301,173, filed on Jan. 20, 2022.

(51) Int. Cl.
*E04D 1/26* (2006.01)
*F24S 20/00* (2018.01)

(56) References Cited

U.S. PATENT DOCUMENTS

| | | |
|---|---|---|
| 3,581,779 A | 6/1971 | Gilbert, Jr. |
| 3,607,529 A * | 9/1971 | Chalmers .................. E04D 1/28 156/291 |
| 4,258,948 A | 3/1981 | Hoffmann |
| 4,349,220 A | 9/1982 | Carroll et al. |
| 4,499,702 A | 2/1985 | Turner |
| 4,636,577 A | 1/1987 | Peterpaul |
| 5,167,579 A | 12/1992 | Rotter |
| 5,437,735 A | 8/1995 | Younan et al. |
| 5,590,495 A | 1/1997 | Bressler et al. |
| 5,642,596 A | 7/1997 | Waddington |
| 6,008,450 A | 12/1999 | Ohtsuka et al. |
| 6,033,270 A | 3/2000 | Stuart |
| 6,046,399 A | 4/2000 | Kapner |
| 6,201,180 B1 | 3/2001 | Meyer et al. |
| 6,220,329 B1 | 4/2001 | King et al. |
| 6,308,482 B1 | 10/2001 | Strait |
| 6,320,114 B1 | 11/2001 | Kuechler |
| 6,320,115 B1 | 11/2001 | Kataoka et al. |
| 6,336,304 B1 | 1/2002 | Mimura et al. |
| 6,341,454 B1 | 1/2002 | Koleoglou |
| 6,407,329 B1 | 6/2002 | Iino et al. |
| 6,576,830 B2 | 6/2003 | Nagao et al. |
| 6,928,781 B2 | 8/2005 | Desbois et al. |
| 6,972,367 B2 | 12/2005 | Federspiel et al. |
| 7,138,578 B2 | 11/2006 | Komamine |
| 7,155,870 B2 | 1/2007 | Almy |
| 7,178,295 B2 | 2/2007 | Dinwoodie |
| 7,487,771 B1 | 2/2009 | Eiffert et al. |
| 7,587,864 B2 | 9/2009 | McCaskill et al. |
| 7,678,990 B2 | 3/2010 | McCaskill et al. |
| 7,678,991 B2 | 3/2010 | McCaskill et al. |
| 7,748,191 B2 | 7/2010 | Podirsky |
| 7,819,114 B2 | 10/2010 | Augenbraun et al. |
| 7,824,191 B1 | 11/2010 | Podirsky |
| 7,832,176 B2 | 11/2010 | McCaskill et al. |
| 8,118,109 B1 | 2/2012 | Hacker |
| 8,168,880 B2 | 5/2012 | Jacobs et al. |
| 8,173,889 B2 | 5/2012 | Kalkanoglu et al. |
| 8,210,570 B1 | 7/2012 | Railkar et al. |
| 8,276,329 B2 | 10/2012 | Lenox |
| 8,312,693 B2 | 11/2012 | Cappelli |
| 8,319,093 B2 | 11/2012 | Kalkanoglu et al. |
| 8,333,040 B2 | 12/2012 | Shiao et al. |
| 8,371,076 B2 | 2/2013 | Jones et al. |
| 8,375,653 B2 | 2/2013 | Shiao et al. |
| 8,404,967 B2 | 3/2013 | Kalkanoglu et al. |
| 8,410,349 B2 | 4/2013 | Kalkanoglu et al. |
| 8,418,415 B2 | 4/2013 | Shiao et al. |
| 8,438,796 B2 | 5/2013 | Shiao et al. |
| 8,468,754 B2 | 6/2013 | Railkar et al. |
| 8,468,757 B2 | 6/2013 | Krause et al. |
| 8,505,249 B2 | 8/2013 | Geary |
| 8,512,866 B2 | 8/2013 | Taylor |
| 8,513,517 B2 | 8/2013 | Kalkanoglu et al. |
| 8,586,856 B2 | 11/2013 | Kalkanoglu et al. |
| 8,601,754 B2 | 12/2013 | Jenkins et al. |
| 8,629,578 B2 | 1/2014 | Kurs et al. |
| 8,646,228 B2 | 2/2014 | Jenkins |
| 8,656,657 B2 | 2/2014 | Livsey et al. |
| 8,671,630 B2 | 3/2014 | Lena et al. |
| 8,677,702 B2 | 3/2014 | Jenkins |
| 8,695,289 B2 | 4/2014 | Koch et al. |
| 8,713,858 B1 | 5/2014 | Xie |
| 8,713,860 B2 | 5/2014 | Railkar et al. |
| 8,733,038 B2 | 5/2014 | Kalkanoglu et al. |
| 8,776,455 B2 | 7/2014 | Azoulay |
| 8,789,321 B2 | 7/2014 | Ishida |
| 8,793,940 B2 | 8/2014 | Kalkanoglu et al. |
| 8,793,941 B2 | 8/2014 | Bosler et al. |
| 8,826,607 B2 | 9/2014 | Shiao et al. |
| 8,835,751 B2 | 9/2014 | Kalkanoglu et al. |
| 8,863,451 B2 | 10/2014 | Jenkins et al. |
| 8,898,970 B2 | 12/2014 | Jenkins et al. |
| 8,925,262 B2 | 1/2015 | Railkar et al. |
| 8,943,766 B2 | 2/2015 | Gombarick et al. |
| 8,946,544 B2 | 2/2015 | Jabos et al. |
| 8,950,128 B2 | 2/2015 | Kalkanoglu et al. |
| 8,959,848 B2 | 2/2015 | Jenkins et al. |
| 8,966,838 B2 | 3/2015 | Jenkins |
| 8,966,850 B2 | 3/2015 | Jenkins et al. |
| 8,994,224 B2 | 3/2015 | Mehta et al. |
| 9,032,672 B2 | 5/2015 | Livsey et al. |
| 9,153,950 B2 | 10/2015 | Yamanaka et al. |
| 9,166,087 B2 | 10/2015 | Chihlas et al. |
| 9,169,646 B2 | 10/2015 | Rodrigues et al. |
| 9,170,034 B2 | 10/2015 | Bosler et al. |
| 9,178,465 B2 | 11/2015 | Shiao et al. |
| 9,202,955 B2 | 12/2015 | Livsey et al. |
| 9,212,832 B2 | 12/2015 | Jenkins |
| 9,217,584 B2 | 12/2015 | Kalkanoglu et al. |
| 9,270,221 B2 | 2/2016 | Zhao |
| 9,273,885 B2 | 3/2016 | Rordigues et al. |
| 9,276,141 B2 | 3/2016 | Kalkanoglu et al. |
| 9,331,224 B2 | 5/2016 | Koch et al. |
| 9,356,174 B2 | 5/2016 | Duarte et al. |
| 9,359,014 B1 | 6/2016 | Yang et al. |
| 9,412,890 B1 | 8/2016 | Meyers |
| 9,528,270 B2 | 12/2016 | Jenkins et al. |
| 9,605,432 B1 | 3/2017 | Robbins |
| 9,711,672 B2 | 7/2017 | Wang |
| 9,755,573 B2 | 9/2017 | Livsey et al. |
| 9,786,802 B2 | 10/2017 | Shiao et al. |
| 9,831,818 B2 | 11/2017 | West |
| 9,912,284 B2 | 3/2018 | Svec |
| 9,923,515 B2 | 3/2018 | Rodrigues et al. |
| 9,938,729 B2 | 4/2018 | Coon |
| 9,966,898 B1 * | 5/2018 | Flanigan .................. E04D 1/12 |
| 9,991,412 B2 | 6/2018 | Gonzalez et al. |
| 9,998,067 B2 | 6/2018 | Kalkanoglu et al. |
| 10,027,273 B2 | 7/2018 | West et al. |
| 10,115,850 B2 | 10/2018 | Rodrigues et al. |
| 10,128,660 B1 | 11/2018 | Apte et al. |
| 10,156,075 B1 | 12/2018 | McDonough |
| 10,187,005 B2 | 1/2019 | Rodrigues et al. |
| 10,256,765 B2 | 4/2019 | Rodrigues et al. |
| 10,283,661 B2 | 5/2019 | Brounne |
| 10,284,136 B1 | 5/2019 | Mayfield et al. |
| 10,454,408 B2 | 10/2019 | Livsey et al. |
| 10,530,292 B1 | 1/2020 | Cropper et al. |
| 10,560,048 B2 | 2/2020 | Fisher et al. |
| 10,563,406 B2 | 2/2020 | Kalkanoglu et al. |
| D879,031 S | 3/2020 | Lance et al. |
| 10,579,028 B1 | 3/2020 | Jacob |
| 10,784,813 B2 | 9/2020 | Kalkanoglu et al. |
| D904,289 S | 12/2020 | Lance et al. |
| 11,012,026 B2 | 5/2021 | Kalkanoglu et al. |
| 11,177,639 B1 | 11/2021 | Nguyen et al. |
| 11,217,715 B2 | 1/2022 | Sharenko |
| 11,251,744 B1 | 2/2022 | Bunea et al. |
| 11,258,399 B2 | 2/2022 | Kalkanoglu et al. |
| 11,283,394 B2 | 3/2022 | Perkins et al. |
| 11,309,828 B2 | 4/2022 | Sirski et al. |
| 11,394,344 B2 | 7/2022 | Perkins et al. |

(56) References Cited

U.S. PATENT DOCUMENTS

| | | |
|---|---|---|
| 11,424,379 B2 | 8/2022 | Sharenko et al. |
| 11,431,280 B2 | 8/2022 | Liu et al. |
| 11,431,281 B2 | 8/2022 | Perkins et al. |
| 11,444,569 B2 | 9/2022 | Clemente et al. |
| 11,454,027 B2 | 9/2022 | Kuiper et al. |
| 11,459,757 B2 | 10/2022 | Nguyen et al. |
| 11,486,144 B2 | 11/2022 | Bunea et al. |
| 11,489,482 B2 | 11/2022 | Peterson et al. |
| 11,496,088 B2 | 11/2022 | Sirski et al. |
| 11,508,861 B1 | 11/2022 | Perkins et al. |
| 11,512,480 B1 | 11/2022 | Achor et al. |
| 11,527,665 B2 | 12/2022 | Boitnott |
| 11,545,927 B2 | 1/2023 | Abra et al. |
| 11,545,928 B2 | 1/2023 | Perkins et al. |
| 11,658,470 B2 | 5/2023 | Nguyen et al. |
| 11,661,745 B2 | 5/2023 | Bunea et al. |
| 11,689,149 B2 | 6/2023 | Clemente et al. |
| 11,705,531 B2 | 7/2023 | Sharenko et al. |
| 11,728,759 B2 | 8/2023 | Nguyen et al. |
| 11,732,490 B2 | 8/2023 | Achor et al. |
| 11,811,361 B1 | 11/2023 | Farhangi et al. |
| 11,824,486 B2 | 11/2023 | Nguyen et al. |
| 11,824,487 B2 | 11/2023 | Nguyen et al. |
| 11,843,067 B2 | 12/2023 | Nguyen et al. |
| 2002/0053360 A1 | 5/2002 | Kinoshita et al. |
| 2002/0129849 A1 | 9/2002 | Heckeroth |
| 2003/0101662 A1 | 6/2003 | Ullman |
| 2003/0132265 A1 | 7/2003 | Villela et al. |
| 2003/0217768 A1 | 11/2003 | Guha |
| 2004/0000334 A1 | 1/2004 | Ressler |
| 2005/0030187 A1 | 2/2005 | Peress et al. |
| 2005/0115603 A1 | 6/2005 | Yoshida et al. |
| 2005/0144870 A1 | 7/2005 | Dinwoodie |
| 2005/0178428 A1 | 8/2005 | Laaly et al. |
| 2005/0193673 A1 | 9/2005 | Rodrigues et al. |
| 2006/0042683 A1 | 3/2006 | Gangemi |
| 2006/0046084 A1 | 3/2006 | Yang et al. |
| 2007/0074757 A1 | 4/2007 | Mellott et al. |
| 2007/0175153 A1* | 8/2007 | O'Hara .................. E04D 1/28 52/518 |
| 2007/0181174 A1 | 8/2007 | Ressler |
| 2007/0193618 A1 | 8/2007 | Bressler et al. |
| 2007/0249194 A1 | 10/2007 | Liao |
| 2007/0295385 A1 | 12/2007 | Sheats et al. |
| 2008/0006323 A1 | 1/2008 | Kalkanoglu et al. |
| 2008/0035140 A1 | 2/2008 | Placer et al. |
| 2008/0315061 A1 | 2/2008 | Placer et al. |
| 2008/0078440 A1 | 4/2008 | Lim et al. |
| 2008/0185748 A1 | 8/2008 | Kalkanoglu |
| 2008/0271774 A1 | 11/2008 | Kalkanoglu et al. |
| 2008/0302030 A1 | 12/2008 | Stancel et al. |
| 2009/0000222 A1 | 1/2009 | Kalkanoglu et al. |
| 2009/0014057 A1 | 1/2009 | Croft et al. |
| 2009/0014058 A1 | 1/2009 | Croft et al. |
| 2009/0019795 A1 | 1/2009 | Szacsvay et al. |
| 2009/0044850 A1 | 2/2009 | Kimberley |
| 2009/0114261 A1 | 5/2009 | Stancel et al. |
| 2009/0133340 A1 | 5/2009 | Shiao et al. |
| 2009/0159118 A1 | 6/2009 | Kalkanoglu et al. |
| 2009/0178350 A1 | 7/2009 | Kalkanoglu et al. |
| 2009/0229652 A1 | 9/2009 | Mapel et al. |
| 2009/0275247 A1 | 11/2009 | Richter et al. |
| 2010/0019580 A1 | 1/2010 | Croft et al. |
| 2010/0095618 A1 | 4/2010 | Edison et al. |
| 2010/0101634 A1 | 4/2010 | Frank et al. |
| 2010/0116325 A1 | 5/2010 | Nikoonahad |
| 2010/0131108 A1 | 5/2010 | Meyer |
| 2010/0139184 A1 | 6/2010 | Williams et al. |
| 2010/0146878 A1 | 6/2010 | Koch et al. |
| 2010/0159221 A1 | 6/2010 | Kourtakis et al. |
| 2010/0170169 A1 | 7/2010 | Railkar et al. |
| 2010/0186798 A1 | 7/2010 | Tormen et al. |
| 2010/0242381 A1 | 9/2010 | Jenkins |
| 2010/0275527 A1* | 11/2010 | Karol .................. E04D 1/265 52/556 |
| 2010/0313499 A1 | 12/2010 | Gangemi |
| 2010/0325976 A1 | 12/2010 | DeGenfelder et al. |
| 2010/0326488 A1 | 12/2010 | Aue et al. |
| 2010/0326501 A1 | 12/2010 | Zhao et al. |
| 2011/0030761 A1 | 2/2011 | Kalkanoglu et al. |
| 2011/0036386 A1 | 2/2011 | Browder |
| 2011/0036389 A1 | 2/2011 | Hardikar et al. |
| 2011/0048507 A1 | 3/2011 | Livsey et al. |
| 2011/0058337 A1 | 3/2011 | Han et al. |
| 2011/0061326 A1 | 3/2011 | Jenkins |
| 2011/0100436 A1 | 5/2011 | Cleereman et al. |
| 2011/0104488 A1 | 5/2011 | Muessig et al. |
| 2011/0132427 A1 | 6/2011 | Kalkanoglu et al. |
| 2011/0168238 A1 | 7/2011 | Metin et al. |
| 2011/0239555 A1 | 10/2011 | Cook et al. |
| 2011/0302859 A1 | 12/2011 | Crasnianski |
| 2011/0314753 A1 | 12/2011 | Farmer et al. |
| 2012/0034799 A1 | 2/2012 | Hunt |
| 2012/0060434 A1 | 3/2012 | Jacobs |
| 2012/0060902 A1 | 3/2012 | Drake |
| 2012/0085392 A1 | 4/2012 | Albert et al. |
| 2012/0137600 A1 | 6/2012 | Jenkins |
| 2012/0176077 A1 | 7/2012 | Oh et al. |
| 2012/0212065 A1 | 8/2012 | Cheng et al. |
| 2012/0233940 A1 | 9/2012 | Perkins et al. |
| 2012/0240490 A1 | 9/2012 | Gangemi |
| 2012/0260977 A1 | 10/2012 | Stancel |
| 2012/0266942 A1 | 10/2012 | Komatsu et al. |
| 2012/0279150 A1 | 11/2012 | Pislkak et al. |
| 2012/0282437 A1 | 11/2012 | Clark et al. |
| 2012/0291848 A1 | 11/2012 | Sherman et al. |
| 2013/0008499 A1 | 1/2013 | Verger et al. |
| 2013/0014455 A1 | 1/2013 | Grieco |
| 2013/0118558 A1 | 5/2013 | Sherman |
| 2013/0193769 A1 | 8/2013 | Mehta et al. |
| 2013/0247988 A1 | 9/2013 | Reese et al. |
| 2013/0284267 A1 | 10/2013 | Plug et al. |
| 2013/0306137 A1 | 11/2013 | Ko |
| 2014/0090697 A1 | 4/2014 | Rodrigues et al. |
| 2014/0150843 A1 | 6/2014 | Pearce et al. |
| 2014/0173997 A1 | 6/2014 | Jenkins |
| 2014/0179220 A1 | 6/2014 | Railkar et al. |
| 2014/0182222 A1 | 7/2014 | Kalkanoglu et al. |
| 2014/0208675 A1 | 7/2014 | Beerer et al. |
| 2014/0254776 A1 | 9/2014 | O'Connor et al. |
| 2014/0266289 A1 | 9/2014 | Della Sera et al. |
| 2014/0311556 A1 | 10/2014 | Feng et al. |
| 2014/0352760 A1 | 12/2014 | Haynes et al. |
| 2014/0366464 A1 | 12/2014 | Rodrigues et al. |
| 2014/0366470 A1* | 12/2014 | Edwards .................. E04D 1/30 52/302.1 |
| 2015/0089895 A1 | 4/2015 | Leitch |
| 2015/0162459 A1 | 6/2015 | Lu et al. |
| 2015/0340516 A1 | 11/2015 | Kim et al. |
| 2015/0349173 A1 | 12/2015 | Morad et al. |
| 2016/0105144 A1 | 4/2016 | Haynes et al. |
| 2016/0142008 A1 | 5/2016 | Lopez et al. |
| 2016/0254776 A1 | 9/2016 | Rodrigues et al. |
| 2016/0276508 A1 | 9/2016 | Huang et al. |
| 2016/0359451 A1 | 12/2016 | Mao et al. |
| 2017/0159292 A1 | 6/2017 | Chihlas et al. |
| 2017/0179319 A1 | 6/2017 | Yamashita et al. |
| 2017/0179726 A1 | 6/2017 | Garrity et al. |
| 2017/0237390 A1 | 8/2017 | Hudson et al. |
| 2017/0331415 A1 | 11/2017 | Koppi et al. |
| 2018/0094438 A1 | 4/2018 | Wu et al. |
| 2018/0097472 A1 | 4/2018 | Anderson et al. |
| 2018/0115275 A1 | 4/2018 | Flanigan et al. |
| 2018/0254738 A1 | 9/2018 | Yang et al. |
| 2018/0294765 A1 | 10/2018 | Friedrich et al. |
| 2018/0351502 A1 | 12/2018 | Almy et al. |
| 2018/0367089 A1 | 12/2018 | Stutterheim et al. |
| 2019/0030867 A1 | 1/2019 | Sun et al. |
| 2019/0081436 A1 | 3/2019 | Onodi et al. |
| 2019/0123679 A1 | 4/2019 | Rodrigues et al. |
| 2019/0253022 A1 | 8/2019 | Hardar et al. |
| 2019/0305717 A1 | 10/2019 | Allen et al. |
| 2020/0109320 A1 | 4/2020 | Jiang |
| 2020/0144958 A1 | 5/2020 | Rodrigues et al. |

(56) References Cited

U.S. PATENT DOCUMENTS

| | | |
|---|---|---|
| 2020/0220819 A1 | 7/2020 | Vu et al. |
| 2020/0224419 A1 | 7/2020 | Boss et al. |
| 2020/0343397 A1 | 10/2020 | Hem-Jensen |
| 2021/0083619 A1 | 3/2021 | Hegedus |
| 2021/0115223 A1 | 4/2021 | Bonekamp et al. |
| 2021/0159353 A1 | 5/2021 | Li et al. |
| 2021/0301536 A1 | 9/2021 | Baggs et al. |
| 2021/0343886 A1 | 11/2021 | Sharenko et al. |
| 2022/0149213 A1 | 5/2022 | Mensink et al. |

FOREIGN PATENT DOCUMENTS

| | | |
|---|---|---|
| CN | 202797032 U | 3/2013 |
| CN | 217150978 U | 8/2022 |
| DE | 1958248 A1 | 11/1971 |
| EP | 1039361 A1 | 9/2000 |
| EP | 1837162 A1 | 9/2007 |
| EP | 1774372 A1 | 7/2011 |
| EP | 2446481 A2 | 5/2012 |
| EP | 2784241 A1 | 10/2014 |
| EP | 3772175 A1 | 2/2021 |
| JP | 10046767 A | 2/1998 |
| JP | 2002-106151 A | 4/2002 |
| JP | 2001-098703 A | 10/2002 |
| JP | 2017-027735 A | 2/2017 |
| JP | 2018053707 A | 4/2018 |
| KR | 20090084060 A | 8/2009 |
| KR | 20100132595 A | 12/2010 |
| KR | 10-1348283 B1 | 1/2014 |
| KR | 10-2019-0000367 A | 1/2019 |
| KR | 10-2253483 B1 | 5/2021 |
| NL | 2026856 B1 | 6/2022 |
| WO | 2010/151777 A2 | 12/2010 |
| WO | 2011/049944 A1 | 4/2011 |
| WO | 2015/133632 A1 | 9/2015 |
| WO | 2018/000589 A1 | 1/2018 |
| WO | 2019/201416 A1 | 10/2019 |
| WO | 2020-159358 A1 | 8/2020 |
| WO | 2021-247098 A1 | 12/2021 |

OTHER PUBLICATIONS

RGS Energy, 3.5KW Powerhouse 3.0 system installed in an afternoon; Jun. 7, 2019 «facebook.com/RGSEnergy/» retrieved Feb. 2, 2021.

Tesla, Solar Roof «tesla.com/solarroof» retrieved Feb. 2, 2021.

"Types of Roofing Underlayment", Owens Corning Roofing; «https://www.owenscorning.com/en-us/roofing/tools/how-roofing-underlayment-helps-protect-your-home» retrieved Nov. 1, 2021.

* cited by examiner

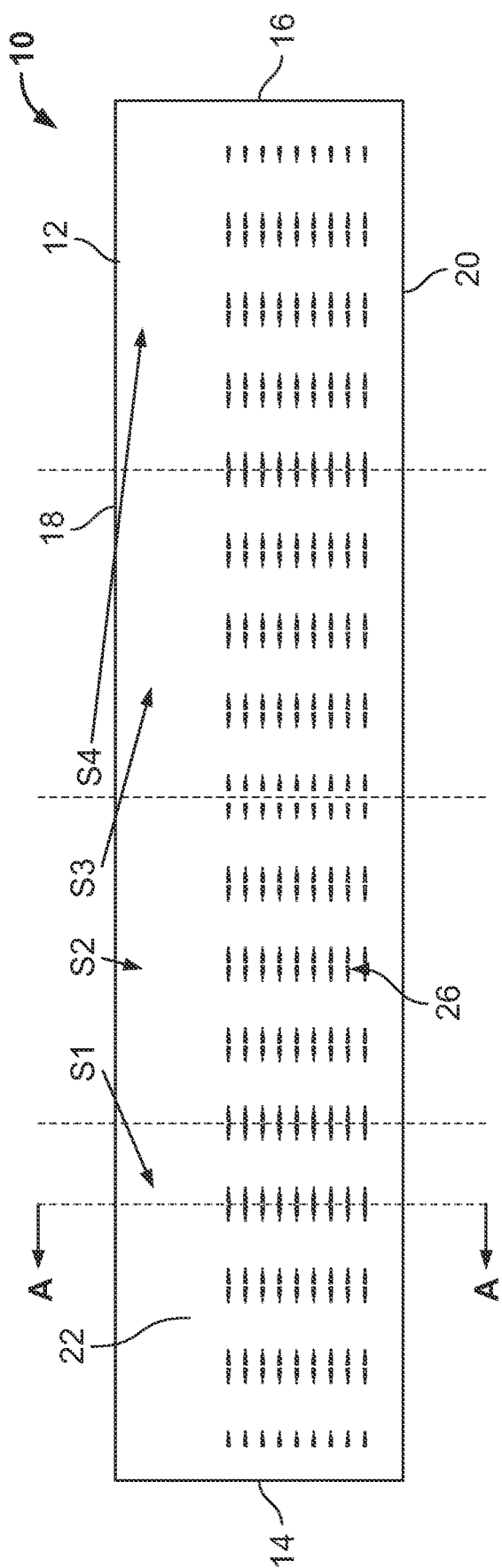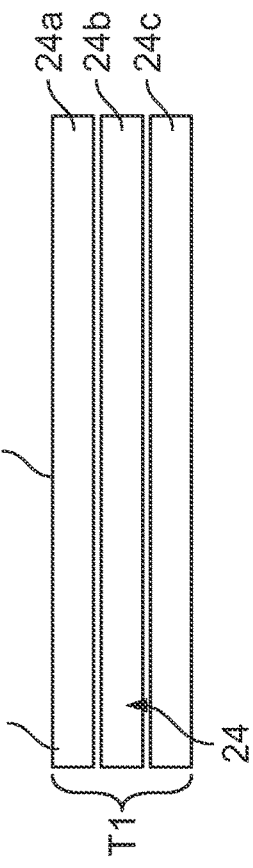

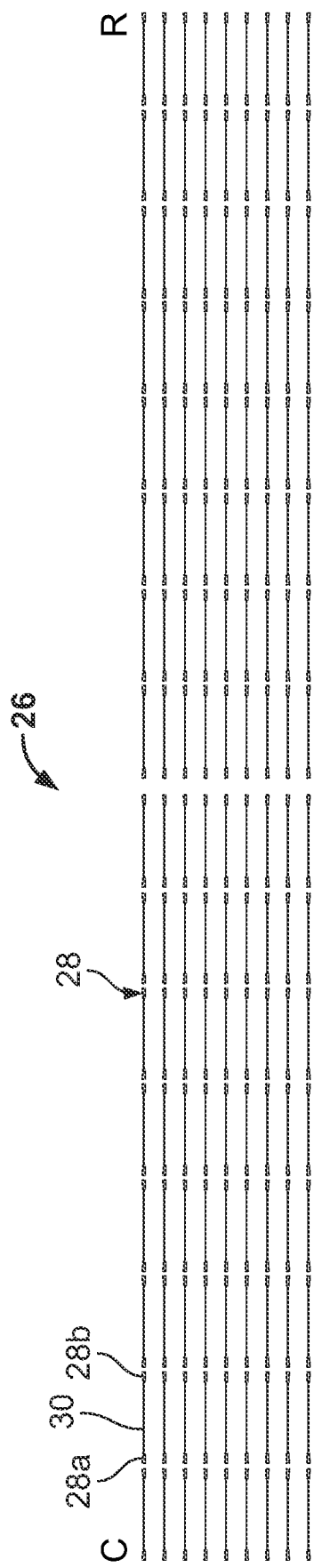

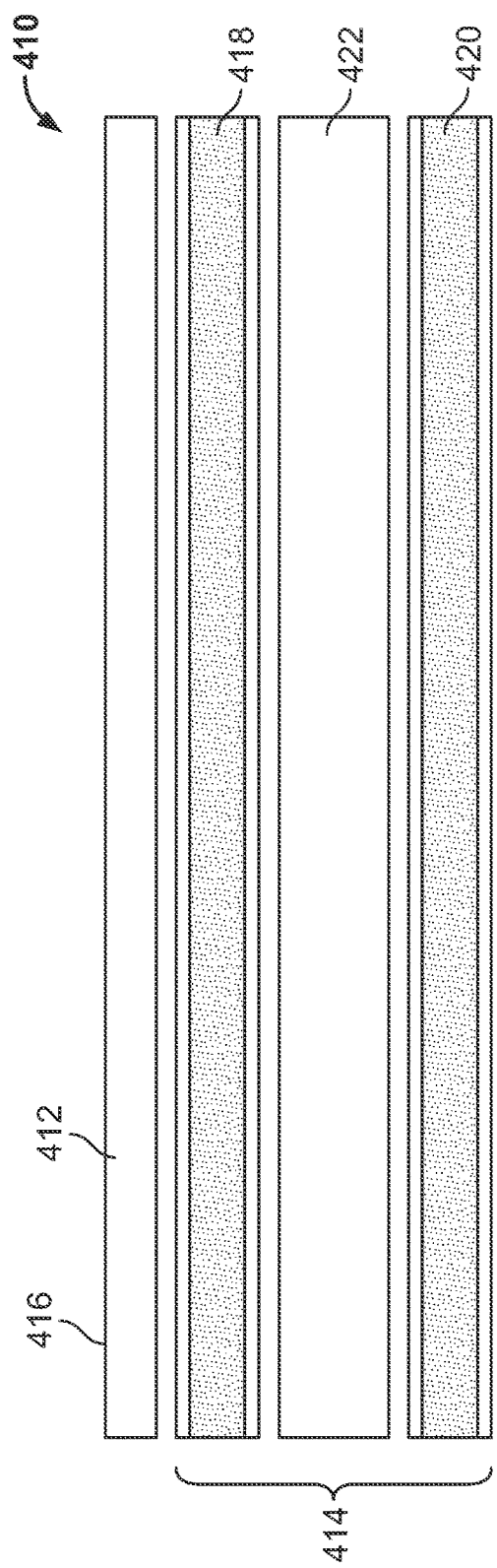
FIG. 10
FIG. 11
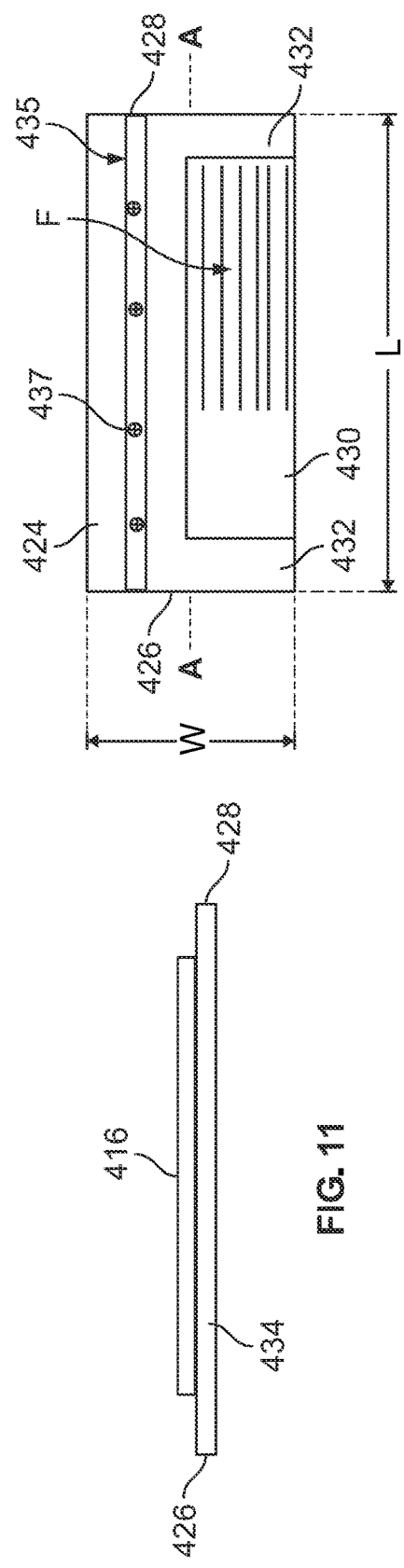
FIG. 12

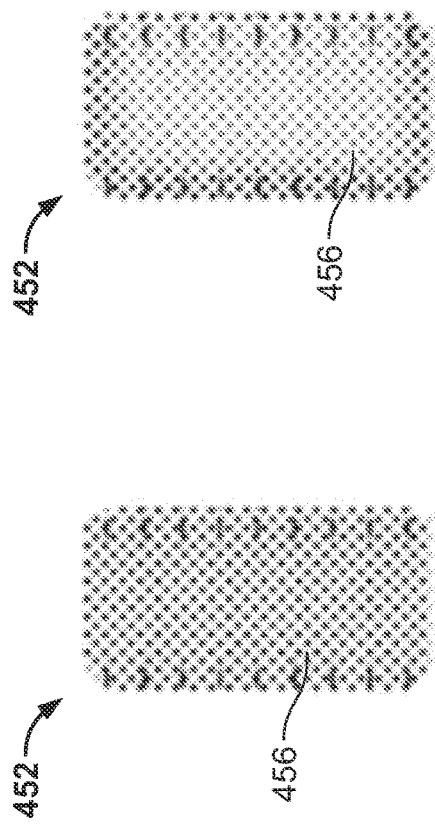
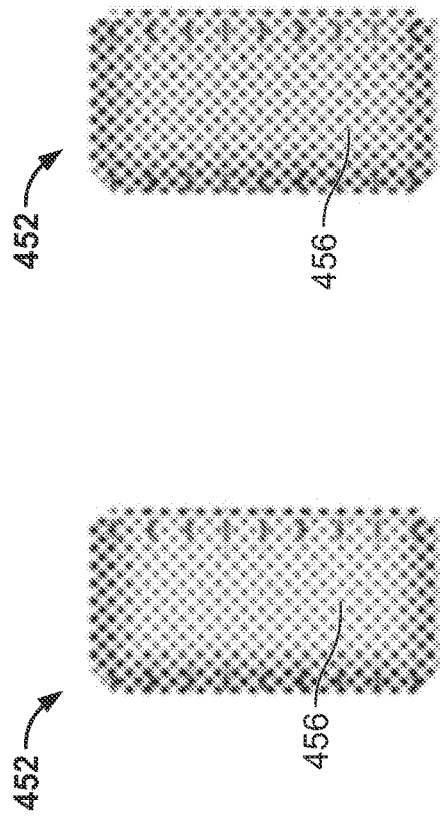

ROOFING SHINGLES FOR MIMICKING THE APPEARANCE OF PHOTOVOLTAIC MODULES

CROSS-REFERENCE TO RELATED APPLICATION

This application is a continuation of U.S. patent application Ser. No. 18/157,407, filed Jan. 20, 2023, entitled "ROOFING SHINGLES FOR MIMICKING THE APPEARANCE OF PHOTOVOLTAIC MODULES," which claims the benefit of U.S. Provisional Patent Application Ser. No. 63/301,173, filed Jan. 20, 2022, entitled "ROOFING MODULES FOR MIMICKING THE APPEARANCE OF PHOTOVOLTAIC MODULES," the contents of which are incorporated herein by reference in their entirety.

FIELD OF THE INVENTION

The present invention relates to roofing shingles, and, more particularly, roofing shingles that aesthetically mimic photovoltaic modules.

BACKGROUND

Photovoltaic systems having solar panels are commonly installed on roofing of structures.

SUMMARY

In some embodiments, a system includes a plurality of photovoltaic modules installed on a roof deck, wherein each of the plurality of photovoltaic modules includes a plurality of solar cells; and a plurality of roofing shingles installed on the roof deck, wherein each of the plurality of roofing shingles includes a first end and a second end opposite the first end, a cap layer, wherein the cap layer is composed of a first polymer material, and wherein the cap layer includes a first surface and a pattern printed on the first surface, wherein the pattern includes a depiction of a plurality of solar cells, wherein the depiction of a plurality of solar cells extends between the first end and the second end, and a core layer underneath the cap layer.

In some embodiments, the core layer includes a first layer, wherein the first layer is composed of a continuous fiber thermoplastic composite tape (CFT), a second layer, wherein the second layer is composed of a continuous fiber thermoplastic composite tape (CFT), and a third layer between the first layer and the second layer, wherein the third layer is composed of a second polymer material. In some embodiments, at least one of the first polymer material and the second polymer material is thermoplastic polyolefin (TPO). In some embodiments, the cap layer has a thickness of 10 mil to 50 mil. In some embodiments, each of the first layer of the core layer and the second layer of the core layer has a thickness of 4 mil to 15 mil, and wherein the third layer has a thickness of 20 mil to 100 mil.

In some embodiments, the pattern includes a plurality of pads, wherein the plurality of pads depict a visual appearance of electrical bussing of the depiction of the plurality of solar cells, wherein the plurality of pads is arranged in a plurality of sets, each of which includes a first pad and a second pad, and wherein the sets of the first and second pads are arranged in a matrix including a plurality of rows and a plurality of columns. In some embodiments, the first pad and the second pad in each set of each column are spaced apart from one another by 20 mm to 150 mm, and wherein each of the sets of pads of one of the rows in each column is spaced apart from another of the sets of pads in another adjacent one of the rows by 10 mm to 50 mm. In some embodiments, the second pad of each of the sets of pads in one of the rows in one of the columns is spaced apart from the first pad of another of set sets of pads in the one of the rows of another adjacent one of the columns by 1 mm to 15 mm. In some embodiments, each of the plurality of pads includes a length of 5 mm to 30 mm and a width of 1 mm to 10 mm. In some embodiments, the depiction of a plurality of solar cells is composed of a plurality of dots, and wherein the each of the plurality of dots has a diameter of 1 mm to 5 mm.

In some embodiments, the pattern includes shading that is composed of a color in a CMYK color bracket of [0, 0, 0, X], and wherein X is 60 to 100. In some embodiments, the shading of the pattern is substantially constant from the first end to the second end. In some embodiments, X increases from the first end to the second end. In some embodiments, X decreases from the first end to the second end.

In some embodiments, a roofing shingle includes a first end and a second end opposite the first end, a cap layer, wherein the cap layer is composed of a first polymer material, and wherein the cap layer includes a first surface and a pattern printed on the first surface, wherein the pattern includes a depiction of a plurality of solar cells, wherein the depiction of a plurality of solar cells extends between the first end and the second end, and a core layer underneath the cap layer.

In some embodiments, the pattern includes a plurality of pads, wherein the plurality of pads depict a visual appearance of electrical bussing of the depiction of the plurality of solar cells, wherein the plurality of pads is arranged in a plurality of sets, each of which includes a first pad and a second pad, and wherein the sets of the first and second pads are arranged in a matrix including a plurality of rows and a plurality of columns. In some embodiments, the first pad and the second pad in each set of each column are spaced apart from one another by 20 mm to 150 mm, and wherein each of the sets of pads of one of the rows in each column is spaced apart from another of the sets of pads in another adjacent one of the rows by 10 mm to 50 mm. In some embodiments, the depiction of a plurality of solar cells is composed of a plurality of dots, and wherein the each of the plurality of dots has a diameter of 1 mm to 5 mm. In some embodiments, the pattern includes shading that is composed of a color in a CMYK color bracket of [0, 0, 0, X], and wherein X is 60 to 100.

In some embodiments, a kit includes a plurality of photovoltaic modules configured to be installed on a roof deck, wherein each of the plurality of photovoltaic modules includes a plurality of solar cells; and a plurality of roofing shingles configured to be installed on the roof deck, wherein each of the plurality of roofing shingles includes a first end and a second end opposite the first end, a cap layer, wherein the cap layer is composed of a first polymer material, and wherein the cap layer includes a first surface and a pattern printed on the first surface, wherein the pattern includes a depiction of a plurality of solar cells, wherein the depiction of a plurality of solar cells extends between the first end and the second end, and a core layer underneath the cap layer.

BRIEF DESCRIPTION OF THE DRAWINGS

FIG. 1 is a top plan view of some embodiments of a roofing shingle;

FIG. 2 is cross-sectional view, taken along lines A-A and looking in the direction of the arrows, of the roofing shingle of FIG. 1;

FIGS. 4 and 5 illustrate some embodiments of printed patterns mimicking the aesthetic appearance of solar cells employed by the roofing shingle shown in FIG. 1;

FIG. 10 is a schematic view of some embodiments of a roofing shingle;

FIG. 11 is a side elevational view of some embodiments of a roofing shingle;

FIG. 12 is top plan view of some embodiments of the roofing shingle shown in FIG. 11;

FIGS. 15A through 15E illustrate embodiments of patterns; and

DETAILED DESCRIPTION

Figure 3A:
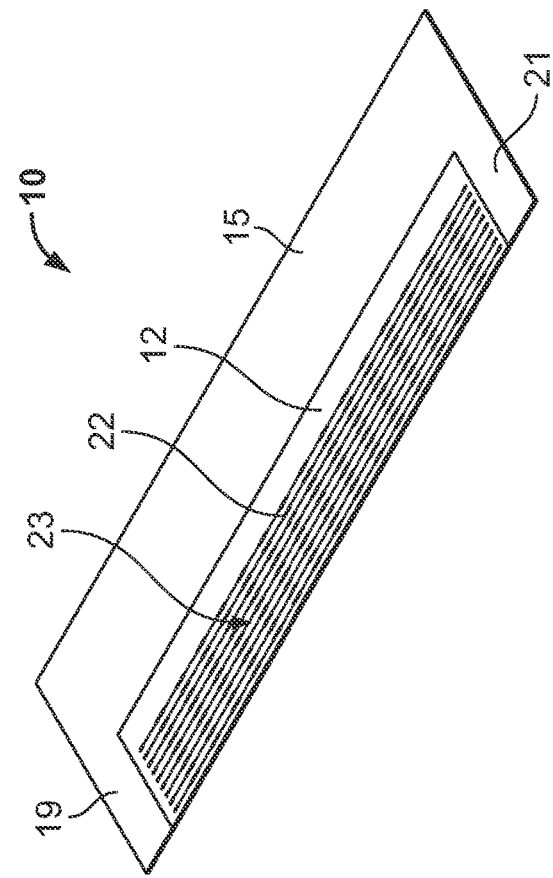
FIGS. 3A through 3C illustrate some embodiments of a roofing shingle.

Referring to FIGS. 1 and 2, in some embodiments, a roofing shingle 10 includes a base 12 having a first end 14, a second end 16 opposite the first end 14, a first edge 18, a second edge 20 opposite the first edge 18, and a first surface 22 extending from the first end 14 to the second end 16 and extending from the first edge 18 to the second edge 20. In some embodiments, the base 12 is includes a plurality of layers 24. In some embodiments, the base 12 includes at least one layer. In some embodiments, the base 12 includes three layers 24a, 24b, 24c. In some embodiments, the layer 24a is an upper layer or a cap. In some embodiments, the layer 24b is an intermediate layer or a substrate. In some embodiments, the layer 24c is a base layer or a core. In some embodiments, the layers 24a, 24b, 24c are laminated. In some embodiments, the layers 24a, 24b, 24c are ultrasonically welded to one another. In some embodiments, the layers 24a, 24b, 24c are heat welded to one another. In some embodiments, the layers 24a, 24b, 24c are thermally bonded to one another. In some embodiments, the layers 24a, 24b, 24c are adhered to one another by an adhesive. In some embodiments, the plurality of layers 24 includes only two layers. In some embodiments, the plurality of layers 24 includes more than three layers. In some embodiments, the base 12 includes only one layer.

In some embodiments, the layer 24a is composed of a polymeric material. In some embodiments, the layer 24a is composed of thermoplastic polyolefin (TPO). In some embodiments, the layer 24a is composed of carbon black TPO. In some embodiments, the layer 24a is composed of a single ply TPO roofing membrane. In some embodiments, non-limiting examples of TPO membranes are disclosed in U.S. Pat. No. 9,359,014 to Yang et al., which is incorporated by reference herein in its entirety. In some embodiments, the layer 24a is composed of polyethylene terephthalate ("PET"). In some embodiments, the layer 24a is composed of ethylene tetrafluoroethylene ("ETFE"). In some embodiments, the layer 24a is composed of an acrylic such as polymethyl methacrylate ("PMMA"). In some embodiments, the layer 24a is composed of polyvinyl chloride. In some embodiments, the layer 24a is composed of ethylene propylene diene monomer (EPDM) rubber. In some embodiments, the layer 24a is composed of polyvinyl chloride (PVC). In an embodiment, the layer 24a includes a flame retardant additive. In some embodiments, the flame retardant additive may be clays, nanoclays, silicas, carbon black, metal hydroxides such as aluminum hydroxide, metal foils, graphite, and combinations thereof. In some embodiments, the layer 24a is composed of metal. In some embodiments, the layer 24a is composed of aluminum. In some embodiments, the layer 24a is composed of galvanized aluminum. In some embodiments, the layer 24a is composed of an FR-4 glass-reinforced epoxy laminate material. In some embodiments, the layer 24a includes a coating. In some embodiments, the coating is a KYNAR® coating.

In some embodiments, the layer 24b is composed of a polymeric material. In some embodiments, the layer 24b is composed of thermoplastic polyolefin (TPO). In some embodiments, the layer 24b is composed of carbon black TPO. In some embodiments, the layer 24b is composed of a single ply TPO roofing membrane. In some embodiments, the layer 24b is composed of polyethylene terephthalate ("PET"). In some embodiments, the layer 24b is composed of ethylene tetrafluoroethylene ("ETFE"). In some embodiments, the layer 24b is composed of an acrylic such as polymethyl methacrylate ("PMMA"). In some embodiments, the layer 24b is composed of polyvinyl chloride. In some embodiments, the layer 24b is composed of ethylene propylene diene monomer (EPDM) rubber. In some embodiments, the layer 24b is composed of polyvinyl chloride (PVC). In some embodiments, the layer 24b includes a flame retardant additive. In some embodiments, the flame retardant additive may be clays, nanoclays, silicas, carbon black, metal hydroxides such as aluminum hydroxide, metal foils, graphite, and combinations thereof. In some embodiments, the layer 24b is composed of metal. In some embodiments, the layer 24b is composed of aluminum. In some embodiments, the layer 24b is composed of galvanized aluminum. In some embodiments, the layer 24b is composed of an FR-4 glass-reinforced epoxy laminate material.

In some embodiments, the layer 24c is composed of a polymeric material. In some embodiments, the layer 24c is composed of thermoplastic polyolefin (TPO). In some embodiments, the layer 24c is composed of carbon black TPO. In some embodiments, the layer 24c is composed of a single ply TPO roofing membrane. In some embodiments, the layer 24c is composed of polyethylene terephthalate ("PET"). In some embodiments, the layer 24c is composed of ethylene tetrafluoroethylene ("ETFE"). In some embodiments, the layer 24c is composed of an acrylic such as polymethyl methacrylate ("PMMA"). In some embodiments, the layer 24c is composed of polyvinyl chloride. In some embodiments, the layer 24c is composed of ethylene propylene diene monomer (EPDM) rubber. In some embodiments, the layer 24c is composed of polyvinyl chloride (PVC). In an embodiment, the layer 24c includes a flame retardant additive. In some embodiments, the flame retardant additive may be clays, nanoclays, silicas, carbon black, metal hydroxides such as aluminum hydroxide, metal foils, graphite, and combinations thereof. In some embodiments, the layer 24c is composed of metal. In some embodiments, the layer 24c is composed of aluminum. In some embodiments, the layer 24c is composed of galvanized aluminum. In some embodiments, the layer 24c is composed of an FR-4 glass-reinforced epoxy laminate material.

In some embodiments, each of the layers 24a, 24b, 24c is composed of a polymeric material. In some embodiments, each of the layers 24a, 24b, 24c is composed of thermoplastic polyolefin (TPO). In some embodiments, each of the layers 24a, 24b, 24c is composed of carbon black TPO. In some embodiments, each of the layers 24a, 24b, 24c is composed of a single ply TPO roofing membrane. In some embodiments, each of the layers 24a, 24b, 24c is composed of polyethylene terephthalate ("PET"). In some embodiments, each of the layers 24a, 24b, 24c is composed of ethylene tetrafluoroethylene ("ETFE"). In some embodiments, each of the layers 24a, 24b, 24c is composed of an acrylic such as polymethyl methacrylate ("PMMA"). In some embodiments, each of the layers 24a, 24b, 24c is composed of polyvinyl chloride. In some embodiments, each of the layers 24a, 24b, 24c is composed of ethylene propylene diene monomer (EPDM) rubber. In some embodiments, each of the layers 24a, 24b, 24c is composed of polyvinyl chloride (PVC). In an embodiment, each of the layers 24a, 24b, 24c includes a flame retardant additive. In some embodiments, the flame retardant additive may be clays, nanoclays, silicas, carbon black, metal hydroxides such as aluminum hydroxide, metal foils, graphite, and combinations thereof. In some embodiments, each of the layers 24a, 24b, 24c is composed of metal. In some embodiments, each of the layers 24a, 24b, 24c is composed of aluminum. In some embodiments, each of the layers 24a, 24b, 24c is composed of galvanized aluminum. In some embodiments, each of the layers 24a, 24b, 24c is composed of an FR-4 glass-reinforced epoxy laminate material.

In some embodiments, the first layer 24a includes a composite material. In some embodiments, the second layer 24b includes a composite material. In some embodiments, the third layer 24c includes a composite material. In some embodiments, the composite materials may absorb less solar radiation than conventional composite materials (e.g., conventional black building materials, conventional black roofing materials, etc.). In some embodiments, the composite materials may have a solar reflectance that is at least 20% greater than conventional composite materials. In some embodiments, the composite materials may be used as a roof attachment and a water shedding layer. In some embodiments, the composite materials may have a relative temperature index (RTI) of greater than 90° C. In some embodiments, the composite material may be a black thermoplastic polyolefin membrane.

As used herein, the term "building material" may include, without limitation, at least one of a roofing material, a siding, a flooring, or any combination thereof. As used herein, the term "roofing material" may include any material of a roof and may include, for example and without limitation, at least one of roofing shingles, photovoltaic modules, roofing membranes (e.g., such as waterproofing membranes), underlayments, tiles, any component thereof, or any combination thereof. In some embodiments, the roofing material may comprise, consist of, or consist essentially of a photovoltaic module. In some embodiments, the roofing material may comprise, consist of, or consist essentially of a component of a roofing shingle. For example, in some embodiments, the roofing material may comprise, consist of, or consist essentially of a backsheet or a portion of a backsheet (e.g., a bottom flap, a head flap, etc.). Further examples of roofing materials include, without limitation, at least one of rolled roofing, flexible rolled roofing, or any combination thereof.

In some embodiments, the composite material is a roofing composite material. In some embodiments, the roofing composite material may comprise, consist of, or consist essentially of one or more layers. For example, in some embodiments, the roofing composite material may comprise, consist of, or consist essentially of at least one of a substrate, a cap, a core, or any combination thereof. In some embodiments, the substrate may have a first surface and a second surface opposite the first surface. In some embodiments, the cap may be on the first surface of the substrate. In some embodiments, the cap may be in contact with the first surface of the substrate. In some embodiments, the core may be on the second surface of the substrate. In some embodiments, the core may be in contact with the second surface of the substrate. In some embodiments, one or more layers may be located between the cap and the substrate. In some embodiments, one or more layers may be located between the core and the substrate.

In some embodiments, the substrate may comprise, consist of, or consist essentially of a scrim (e.g., a polymeric scrim, such as a polyester scrim), a plywood substrate, a glass substrate, a cellulosic substrate, a roof shingle, a mat, a fabric, a glass mat, a fiberglass mat, an underlayment, a roofing membrane, a roof deck, a photovoltaic (PV) panel, a modified bitumen (MODBIT) substrate, a roll good, a board (such as but not limited to at least one of a foam board (e.g., a polyisocyanurate (ISO) foam board), a cover board, or any combination thereof), a pipe, a base sheet, a chimney, a wax paper, or any combination thereof.

In some embodiments, the cap may comprise, consist of, or consist essentially of at least one of the following: one or more polymers, at least one infrared-reflective pigment, a stabilizer package, one or more fillers, or any combination thereof. In some embodiments, the cap may comprise, consist of, or consist essentially of at least one of the following: one or more thermoplastic polyolefins, at least one infrared-reflective black pigment, a stabilizer package, one or more fillers, or any combination thereof. In some embodiments, the stabilizer package may comprise at least one ultraviolet (UV) absorber. In some embodiments, the cap may not comprise a white colorant. In some embodiments, the term white colorant includes white pigments. In some embodiments, the term infrared-reflective black pigment includes infrared-reflective black colorants. In some embodiments, the cap may comprise, consist of, or consist essentially of one or more thermoplastic polyolefins, an ultraviolet absorber, an infrared-reflective black pigment, and optionally one or more fillers, wherein the cap does not comprise at least one of a white colorant, a white pigment, or any combination thereof.

In some embodiments, the white colorant may comprise, consist of, or consist essentially of titanium dioxide ($TiO_2$) particles having a particle size of 200 nm or greater. For example, in some embodiments, the white colorant may comprise, consist of, or consist essentially of titanium dioxide ($TiO_2$) particles having a particle size of 200 nm to 500 nm. In some embodiments, the white colorant may comprise, consist of, or consist essentially of titanium dioxide ($TiO_2$) particles having a particle size of 200 nm to 475 nm. In some embodiments, the white colorant may comprise, consist of, or consist essentially of titanium dioxide ($TiO_2$) particles having a particle size of 200 nm to 450 nm. In some embodiments, the white colorant may comprise, consist of, or consist essentially of titanium dioxide ($TiO_2$) particles having a particle size of 200 nm to 425 nm. In some embodiments, the white colorant may comprise, consist of, or consist essentially of titanium dioxide ($TiO_2$) particles having a particle size of 200 nm to 400 nm. In some embodiments, the white colorant may comprise, consist of, or consist essentially of titanium dioxide ($TiO_2$) particles having a particle size of 200 nm to 375 nm. In some embodiments, the white colorant may comprise, consist of, or consist essentially of titanium dioxide ($TiO_2$) particles having a particle size of 200 nm to 350 nm. In some embodiments, the white colorant may comprise, consist of, or consist essentially of titanium dioxide ($TiO_2$) particles having a particle size of 200 nm to 325 nm. In some embodiments, the white colorant may comprise, consist of, or consist essentially of titanium dioxide ($TiO_2$) particles having a particle size of 200 nm to 300 nm. In some embodiments, the white colorant may comprise, consist of, or consist essentially of titanium dioxide ($TiO_2$) particles having a particle size of 200 nm to 275 nm. In some embodiments, the white colorant may comprise, consist of, or consist essentially of titanium dioxide ($TiO_2$) particles having a particle size of 200 nm to 250 nm. In some embodiments, the white colorant may comprise, consist of, or consist essentially of titanium dioxide ($TiO_2$) particles having a particle size of 200 nm to 225 nm.

In some embodiments, the white colorant may comprise, consist of, or consist essentially of titanium dioxide ($TiO_2$) particles having a particle size of 225 nm to 500 nm. In some embodiments, the white colorant may comprise, consist of, or consist essentially of titanium dioxide ($TiO_2$) particles having a particle size of 250 nm to 500 nm. In some embodiments, the white colorant may comprise, consist of, or consist essentially of titanium dioxide ($TiO_2$) particles having a particle size of 275 nm to 500 nm. In some embodiments, the white colorant may comprise, consist of, or consist essentially of titanium dioxide ($TiO_2$) particles having a particle size of 300 nm to 500 nm. In some embodiments, the white colorant may comprise, consist of, or consist essentially of titanium dioxide ($TiO_2$) particles having a particle size of 325 nm to 500 nm. In some embodiments, the white colorant may comprise, consist of, or consist essentially of titanium dioxide ($TiO_2$) particles having a particle size of 350 nm to 500 nm. In some embodiments, the white colorant may comprise, consist of, or consist essentially of titanium dioxide ($TiO_2$) particles having a particle size of 375 nm to 500 nm. In some embodiments, the white colorant may comprise, consist of, or consist essentially of titanium dioxide ($TiO_2$) particles having a particle size of 400 nm to 500 nm. In some embodiments, the white colorant may comprise, consist of, or consist essentially of titanium dioxide ($TiO_2$) particles having a particle size of 425 nm to 500 nm. In some embodiments, the white colorant may comprise, consist of, or consist essentially of titanium dioxide ($TiO_2$) particles having a particle size of 450 nm to 500 nm. In some embodiments, the white colorant may comprise, consist of, or consist essentially of titanium dioxide ($TiO_2$) particles having a particle size of 475 nm to 500 nm. In some embodiments, the white colorant may comprise, consist of, or consist essentially of titanium dioxide ($TiO_2$) particles having a particle size of 250 nm to 450 nm.

In some embodiments, the cap does not comprise at least one of a white colorant, a white pigment, or any combination thereof. In some embodiments, the cap may comprise an amount of a white colorant, provided that the overall color appearance of the composite material remains black. For example, in some embodiments, the cap may comprise less than 10% by weight of the white colorant based on the total weight of the cap. In some embodiments, the cap may comprise less than 9% by weight of the white colorant based on the total weight of the cap. In some embodiments, the cap may comprise less than 8% by weight of the white colorant based on the total weight of the cap. In some embodiments, the cap may comprise less than 7% by weight of the white colorant based on the total weight of the cap. In some embodiments, the cap may comprise less than 6% by weight of the white colorant based on the total weight of the cap. In some embodiments, the cap may comprise less than 5% by weight of the white colorant based on the total weight of the cap. In some embodiments, the cap may comprise less than 4% by weight of the white colorant based on the total weight of the cap. In some embodiments, the cap may comprise less than 3% by weight of the white colorant based on the total weight of the cap. In some embodiments, the cap may comprise less than 2% by weight of the white colorant based on the total weight of the cap. In some embodiments, the cap may comprise less than 1% by weight of the white colorant based on the total weight of the cap. In some embodiments, the cap may comprise from 0.1% to 1% by weight of the white colorant based on the total weight of the cap.

In some embodiments, the ultraviolet absorber may comprise, consist of, or consist essentially of titanium dioxide ($TiO_2$) particles having a particle size of less than 200 nm. In some embodiments, the ultraviolet absorber may comprise, consist of, or consist essentially of titanium dioxide ($TiO_2$) particles having a particle size of less than 190 nm. In some embodiments, the ultraviolet absorber may comprise, consist of, or consist essentially of titanium dioxide ($TiO_2$) particles having a particle size of less than 180 nm. In some embodiments, the ultraviolet absorber may comprise, consist of, or consist essentially of titanium dioxide ($TiO_2$) particles having a particle size of less than 170 nm. In some embodiments, the ultraviolet absorber may comprise, consist of, or consist essentially of titanium dioxide ($TiO_2$) particles having a particle size of less than 165 nm. In some embodiments, the ultraviolet absorber may comprise, consist of, or consist essentially of titanium dioxide ($TiO_2$) particles having a particle size of less than 150 nm. In some embodiments, the ultraviolet absorber may comprise, consist of, or consist essentially of titanium dioxide ($TiO_2$) particles having a particle size of less than 140 nm. In some embodiments, the ultraviolet absorber may comprise, consist of, or consist essentially of titanium dioxide ($TiO_2$) particles having a particle size of less than 130 nm. In some embodiments, the ultraviolet absorber may comprise, consist of, or consist essentially of titanium dioxide ($TiO_2$) particles having a particle size of less than 120 nm. In some embodiments, the ultraviolet absorber may comprise, consist of, or consist essentially of titanium dioxide ($TiO_2$) particles having a particle size of less than 110 nm. In some embodiments, the ultraviolet absorber may comprise, consist of, or consist essentially of titanium dioxide ($TiO_2$) particles having a particle size of less than 100 nm.

In some embodiments, the ultraviolet absorber may comprise, consist of, or consist essentially of titanium dioxide ($TiO_2$) particles having a particle size of 1 nm to less than 200 nm. In some embodiments, the ultraviolet absorber may comprise, consist of, or consist essentially of titanium dioxide ($TiO_2$) particles having a particle size of 50 nm to 165 nm. In some embodiments, the ultraviolet absorber may comprise, consist of, or consist essentially of titanium dioxide ($TiO_2$) particles having a particle size of 50 nm to 150 nm. In some embodiments, the ultraviolet absorber may comprise, consist of, or consist essentially of titanium dioxide (TiO$_2$) particles having a particle size of 50 nm to 135 nm. In some embodiments, the ultraviolet absorber may comprise, consist of, or consist essentially of titanium dioxide (TiO$_2$) particles having a particle size of 50 nm to 120 nm. In some embodiments, the ultraviolet absorber may comprise, consist of, or consist essentially of titanium dioxide (TiO$_2$) particles having a particle size of 50 nm to 105 nm. In some embodiments, the ultraviolet absorber may comprise, consist of, or consist essentially of titanium dioxide (TiO$_2$) particles having a particle size of 65 nm to 165 nm. In some embodiments, the ultraviolet absorber may comprise, consist of, or consist essentially of titanium dioxide (TiO$_2$) particles having a particle size of 80 nm to 165 nm. In some embodiments, the ultraviolet absorber may comprise, consist of, or consist essentially of titanium dioxide (TiO$_2$) particles having a particle size of 95 nm to 165 nm. In some embodiments, the ultraviolet absorber may comprise, consist of, or consist essentially of titanium dioxide (TiO$_2$) particles having a particle size of 110 nm to 165 nm. In some embodiments, the ultraviolet absorber may comprise, consist of, or consist essentially of titanium dioxide (TiO$_2$) particles having a particle size of 70 nm to 135 nm. In some embodiments, the ultraviolet absorber may comprise, consist of, or consist essentially of titanium dioxide (TiO$_2$) particles having a particle size of 125 nm to 150 nm. In some embodiments, the ultraviolet absorber may comprise, consist of, or consist essentially of titanium dioxide (TiO$_2$) particles having a particle size of 110 nm to 165 nm. In some embodiments, the ultraviolet absorber may comprise, consist of, or consist essentially of titanium dioxide (TiO$_2$) particles having a particle size of 1 nm to 50 nm.

In some embodiments, the ultraviolet absorber is present in the cap in an amount of 0.1% by weight to 10% by weight based on the total weight of the cap. In some embodiments, the ultraviolet absorber is present in the cap in an amount of 1% by weight to 10% by weight based on the total weight of the cap. In some embodiments, the ultraviolet absorber is present in the cap in an amount of 2% by weight to 9% by weight based on the total weight of the cap. In some embodiments, the ultraviolet absorber is present in the cap in an amount of 2% by weight to 8% by weight based on the total weight of the cap. In some embodiments, the ultraviolet absorber is present in the cap in an amount of 2% by weight to 7% by weight based on the total weight of the cap. In some embodiments, the ultraviolet absorber is present in the cap in an amount of 3% by weight to 9% by weight based on the total weight of the cap. In some embodiments, the ultraviolet absorber is present in the cap in an amount of 3% by weight to 8% by weight based on the total weight of the cap. In some embodiments, the ultraviolet absorber is present in the cap in an amount of 4% by weight to 8% by weight based on the total weight of the cap. In some embodiments, the ultraviolet absorber is present in the cap in an amount of 1% by weight to 5% by weight based on the total weight of the cap. In some embodiments, the ultraviolet absorber is present in the cap in an amount of 1% by weight to 4% by weight based on the total weight of the cap. In some embodiments, the ultraviolet absorber is present in the cap in an amount of 1% by weight to 3% by weight based on the total weight of the cap. In some embodiments, the ultraviolet absorber is present in the cap in an amount of 1% by weight to 2% by weight based on the total weight of the cap. In some embodiments, the ultraviolet absorber is present in the cap in an amount of 1% by weight to 2% by weight based on the total weight of the cap. In some embodiments, the ultraviolet absorber is present in the cap in an amount of 1% by weight to 10% by weight based on the total weight of the cap.

In some embodiments, the infrared-reflective pigment may comprise, consist of, or consist essentially of an infrared-reflective black pigment. Examples of infrared-reflective black pigments include, without limitation, one or more of the following commercially available products: "new black" (Ferro product no. V-799) and "old black" (Ferro product no. V-7970), which are available from Ferro Corporation (Cleveland, Ohio) and sold as Cool Colors™ and Eclipse™ pigments. Other infrared-reflective pigments include, for example and without limitation, one or more of the following: "turquoise" (Ferro product no. PC-5686), "blue" (Ferro product no. PC-9250), "camouflage green" (Ferro product no. V-12600), "IR green" (Ferro product no. V-12650), "autumn gold" (Ferro product no. PC9158), "yellow" (Ferro product no. PC-9416), and "red" (Ferro product nos. V-13810 and V-13815).

In some embodiments, the infrared reflective pigment is present in the cap in an amount of 0.01% by weight to 15% by weight based on the total weight of the cap. In some embodiments, the infrared reflective pigment is present in the cap in an amount of 1% by weight to 15% by weight based on the total weight of the cap. In some embodiments, the infrared reflective pigment is present in the cap in an amount of 1% by weight to 14% by weight based on the total weight of the cap. In some embodiments, the infrared reflective pigment is present in the cap in an amount of 1% by weight to 13% by weight based on the total weight of the cap. In some embodiments, the infrared reflective pigment is present in the cap in an amount of 1% by weight to 12% by weight based on the total weight of the cap. In some embodiments, the infrared reflective pigment is present in the cap in an amount of 1% by weight to 11% by weight based on the total weight of the cap. In some embodiments, the infrared reflective pigment is present in the cap in an amount of 1% by weight to 10% by weight based on the total weight of the cap. In some embodiments, the infrared reflective pigment is present in the cap in an amount of 1% by weight to 9% by weight based on the total weight of the cap. In some embodiments, the infrared reflective pigment is present in the cap in an amount of 1% by weight to 8% by weight based on the total weight of the cap. In some embodiments, the infrared reflective pigment is present in the cap in an amount of 1% by weight to 7% by weight based on the total weight of the cap. In some embodiments, the infrared reflective pigment is present in the cap in an amount of 1% by weight to 6% by weight based on the total weight of the cap. In some embodiments, the infrared reflective pigment is present in the cap in an amount of 1% by weight to 5% by weight based on the total weight of the cap. In some embodiments, the infrared reflective pigment is present in the cap in an amount of 1% by weight to 4% by weight based on the total weight of the cap. In some embodiments, the infrared reflective pigment is present in the cap in an amount of 1% by weight to 3% by weight based on the total weight of the cap.

In some embodiments, the infrared reflective pigment is present in the cap in an amount of 2% by weight to 15% by weight based on the total weight of the cap. In some embodiments, the infrared reflective pigment is present in the cap in an amount of 3% by weight to 15% by weight based on the total weight of the cap. In some embodiments, the infrared reflective pigment is present in the cap in an amount of 4% by weight to 15% by weight based on the total weight of the cap. In some embodiments, the infrared reflective pigment is present in the cap in an amount of 5% by weight to 15% by weight based on the total weight of the cap. In some embodiments, the infrared reflective pigment is present in the cap in an amount of 6% by weight to 15% by weight based on the total weight of the cap. In some embodiments, the infrared reflective pigment is present in the cap in an amount of 7% by weight to 15% by weight based on the total weight of the cap. In some embodiments, the infrared reflective pigment is present in the cap in an amount of 8% by weight to 15% by weight based on the total weight of the cap. In some embodiments, the infrared reflective pigment is present in the cap in an amount of 9% by weight to 15% by weight based on the total weight of the cap. In some embodiments, the infrared reflective pigment is present in the cap in an amount of 10% by weight to 15% by weight based on the total weight of the cap. In some embodiments, the infrared reflective pigment is present in the cap in an amount of 11% by weight to 15% by weight based on the total weight of the cap. In some embodiments, the infrared reflective pigment is present in the cap in an amount of 12% by weight to 15% by weight based on the total weight of the cap. In some embodiments, the infrared reflective pigment is present in the cap in an amount of 13% by weight to 15% by weight based on the total weight of the cap.

In some embodiments, the infrared reflective pigment is present in the cap in an amount of 0.01% by weight to 10% by weight based on the total weight of the cap. In some embodiments, the infrared reflective pigment is present in the cap in an amount of 2% by weight to 9% by weight based on the total weight of the cap. In some embodiments, the infrared reflective pigment is present in the cap in an amount of 2% by weight to 8% by weight based on the total weight of the cap. In some embodiments, the infrared reflective pigment is present in the cap in an amount of 2% by weight to 7% by weight based on the total weight of the cap. In some embodiments, the infrared reflective pigment is present in the cap in an amount of 2% by weight to 6% by weight based on the total weight of the cap. In some embodiments, the infrared reflective pigment is present in the cap in an amount of 3% by weight to 9% by weight based on the total weight of the cap. In some embodiments, the infrared reflective pigment is present in the cap in an amount of 3% by weight to 8% by weight based on the total weight of the cap. In some embodiments, the infrared reflective pigment is present in the cap in an amount of 4% by weight to 6% by weight based on the total weight of the cap.

In some embodiments, the cap has a CIELAB color value comprises an L value range of $0 \leq L^* < 40$. In some embodiments, the cap has a CIELAB color value comprises an L value range of $0 \leq L^* < 35$. In some embodiments, the cap has a CIELAB color value comprises an L value range of $0 \leq L^* < 30$. In some embodiments, the cap has a CIELAB color value comprises an L value range of $0 \leq L^* < 25$. In some embodiments, the cap has a CIELAB color value comprises an L value range of $0 \leq L^* < 20$. In some embodiments, the cap has a CIELAB color value comprises an L value range of $0 \leq L^* < 15$. In some embodiments, the cap has a CIELAB color value comprises an L value range of $0 \leq L^* < 10$. In some embodiments, the cap has a CIELAB color value comprises an L value range of $0 \leq L^* < 5$. In some embodiments, the cap has a CIELAB color value comprises an L value range of $0 \leq L^* < 4$. In some embodiments, the cap has a CIELAB color value comprises an L value range of $0 \leq L^* < 3$. In some embodiments, the cap has a CIELAB color value comprises an L value range of $0 \leq L^* < 2$. In some embodiments, the cap has a CIELAB color value comprises an L value range of $0 \leq L^* < 1$.

In some embodiments, the core may comprise, consist of, or consist essentially of at least one of the following: one or more polymers (e.g., thermoplastic polyolefins), a stabilizer package, one or more fillers, or any combination thereof.

In some embodiments, the base 12 has a thickness T1 of 1 mm to 10 mm. In some embodiments, the base 12 has a thickness T1 of 1 mm to 9 mm. In some embodiments, the base 12 has a thickness T1 of 1 mm to 8 mm. In some embodiments, the base 12 has a thickness T1 of 1 mm to 7 mm. In some embodiments, the base 12 has a thickness T1 of 1 mm to 6 mm. In some embodiments, the base 12 has a thickness T1 of 1 mm to 5 mm. In some embodiments, the base 12 has a thickness T1 of 1 mm to 4 mm. In some embodiments, the base 12 has a thickness T1 of 1 mm to 3 mm. In some embodiments, the base 12 has a thickness T1 of 1 mm to 2 mm. In some embodiments, the base 12 has a thickness T1 of 2 mm to 10 mm. In some embodiments, the base 12 has a thickness T1 of 2 mm to 9 mm. In some embodiments, the base 12 has a thickness T1 of 2 mm to 8 mm. In some embodiments, the base 12 has a thickness T1 of 2 mm to 7 mm. In some embodiments, the base 12 has a thickness T1 of 2 mm to 6 mm. In some embodiments, the base 12 has a thickness T1 of 2 mm to 5 mm. In some embodiments, the base 12 has a thickness T1 of 2 mm to 4 mm. In some embodiments, the base 12 has a thickness T1 of 2 mm to 3 mm. In some embodiments, the base 12 has a thickness T1 of 3 mm to 10 mm. In some embodiments, the base 12 has a thickness T1 of 3 mm to 9 mm. In some embodiments, the base 12 has a thickness T1 of 3 mm to 8 mm. In some embodiments, the base 12 has a thickness T1 of 3 mm to 7 mm. In some embodiments, the base 12 has a thickness T1 of 3 mm to 6 mm. In some embodiments, the base 12 has a thickness T1 of 3 mm to 5 mm. In some embodiments, the base 12 has a thickness T1 of 3 mm to 4 mm.

In some embodiments, the base 12 has a thickness T1 of 4 mm to 10 mm. In some embodiments, the base 12 has a thickness T1 of 4 mm to 9 mm. In some embodiments, the base 12 has a thickness T1 of 4 mm to 8 mm. In some embodiments, the base 12 has a thickness T1 of 4 mm to 7 mm. In some embodiments, the base 12 has a thickness T1 of 4 mm to 6 mm. In some embodiments, the base 12 has a thickness T1 of 4 mm to 5 mm. In some embodiments, the base 12 has a thickness T1 of 5 mm to 10 mm. In some embodiments, the base 12 has a thickness T1 of 5 mm to 9 mm. In some embodiments, the base 12 has a thickness T1 of 5 mm to 8 mm. In some embodiments, the base 12 has a thickness T1 of 5 mm to 7 mm. In some embodiments, the base 12 has a thickness T1 of 5 mm to 6 mm.

In some embodiments, the base 12 has a thickness T1 of 6 mm to 10 mm. In some embodiments, the base 12 has a thickness T1 of 6 mm to 9 mm. In some embodiments, the base 12 has a thickness T1 of 6 mm to 8 mm. In some embodiments, the base 12 has a thickness T1 of 6 mm to 7 mm. In some embodiments, the base 12 has a thickness T1 of 7 mm to 10 mm. In some embodiments, the base 12 has a thickness T1 of 7 mm to 9 mm. In some embodiments, the base 12 has a thickness T1 of 7 mm to 8 mm. In some embodiments, the base 12 has a thickness T1 of 8 mm to 10 mm. In some embodiments, the base 12 has a thickness T1 of 8 mm to 9 mm. In some embodiments, the base 12 has a thickness T1 of 9 mm to 10 mm.

In some embodiments, the base 12 has a thickness T1 of 1 mm. In some embodiments, the base 12 has a thickness T1 of 2 mm. In some embodiments, the base 12 has a thickness T1 of 3 mm. In some embodiments, the base 12 has a thickness T1 of 4 mm. In some embodiments, the base 12 has a thickness T1 of 5 mm. In some embodiments, the base 12 has a thickness T1 of 6 mm. In some embodiments, the base 12 has a thickness T1 of 7 mm. In some embodiments, the base 12 has a thickness T1 of 8 mm. In some embodiments, the base 12 has a thickness T1 of 9 mm. In some embodiments, the base 12 has a thickness T1 of 10 mm.

In some embodiments, the layer 24a has a thickness of 0.01 inch to 0.1 inch. In another embodiment, the layer 24a includes a thickness of 0.01 inch to 0.09 inch. In another embodiment, the layer 24a includes a thickness of 0.01 inch to 0.08 inch. In another embodiment, the layer 24a includes a thickness of 0.01 inch to 0.07 inch. In another embodiment, the layer 24a includes a thickness of 0.01 inch to 0.06 inch. In another embodiment, the layer 24a includes a thickness of 0.01 inch to 0.05 inch. In another embodiment, the layer 24a includes a thickness of 0.01 inch to 0.04 inch. In another embodiment, the layer 24a includes a thickness of 0.01 inch to 0.03 inch. In another embodiment, the layer 24a includes a thickness of 0.01 inch to 0.02 inch.

In an embodiment, the layer 24a includes a thickness of 0.02 inch to 0.1 inch. In another embodiment, the layer 24a includes a thickness of 0.02 inch to 0.09 inch. In another embodiment, the layer 24a includes a thickness of 0.02 inch to 0.08 inch. In another embodiment, the layer 24a includes a thickness of 0.02 inch to 0.07 inch. In another embodiment, the layer 24a includes a thickness of 0.02 inch to 0.06 inch. In another embodiment, the layer 24a includes a thickness of 0.02 inch to 0.05 inch. In another embodiment, the layer 24a includes a thickness of 0.02 inch to 0.04 inch. In another embodiment, the layer 24a includes a thickness of 0.02 inch to 0.03 inch.

In an embodiment, the layer 24a includes a thickness of 0.03 inch to 0.1 inch. In another embodiment, the layer 24a includes a thickness of 0.03 inch to 0.09 inch. In another embodiment, the layer 24a includes a thickness of 0.03 inch to 0.08 inch. In another embodiment, the layer 24a includes a thickness of 0.03 inch to 0.07 inch. In another embodiment, the layer 24a includes a thickness of 0.03 inch to 0.06 inch. In another embodiment, the layer 24a includes a thickness of 0.03 inch to 0.05 inch. In another embodiment, the layer 24a includes a thickness of 0.03 inch to 0.04 inch.

In an embodiment, the layer 24a includes a thickness of 0.04 inch to 0.1 inch. In another embodiment, the layer 24a includes a thickness of 0.04 inch to 0.09 inch. In another embodiment, the layer 24a includes a thickness of 0.04 inch to 0.08 inch. In another embodiment, the layer 24a includes a thickness of 0.04 inch to 0.07 inch. In another embodiment, the layer 24a includes a thickness of 0.04 inch to 0.06 inch. In another embodiment, the layer 24a includes a thickness of 0.04 inch to 0.05 inch. In an embodiment, the layer 24a includes a thickness of 0.05 inch to 0.1 inch. In another embodiment, the layer 24a includes a thickness of 0.05 inch to 0.09 inch. In another embodiment, the layer 24a includes a thickness of 0.05 inch to 0.08 inch. In another embodiment, the layer 24a includes a thickness of 0.05 inch to 0.07 inch. In another embodiment, the layer 24a includes a thickness of 0.05 inch to 0.06 inch.

In an embodiment, the layer 24a includes a thickness of 0.06 inch to 0.1 inch. In another embodiment, the layer 24a includes a thickness of 0.06 inch to 0.09 inch. In another embodiment, the layer 24a includes a thickness of 0.06 inch to 0.08 inch. In another embodiment, the layer 24a includes a thickness of 0.06 inch to 0.07 inch. In an embodiment, the layer 24a includes a thickness of 0.07 inch to 0.1 inch. In another embodiment, the layer 24a includes a thickness of 0.07 inch to 0.09 inch. In another embodiment, the layer 24a includes a thickness of 0.07 inch to 0.08 inch. In an embodiment, the layer 24a includes a thickness of 0.08 inch to 0.1 inch. In another embodiment, the layer 24a includes a thickness of 0.08 inch to 0.09 inch. In an embodiment, the layer 24a includes a thickness of 0.09 inch to 0.1 inch.

In an embodiment, the layer 24a includes a thickness of 0.01 inch. In an embodiment, the layer 24a includes a thickness of 0.02 inch. In an embodiment, the layer 24a includes a thickness of 0.03 inch. In an embodiment, the layer 24a includes a thickness of 0.04 inch. In an embodiment, the layer 24a includes a thickness of 0.05 inch. In an embodiment, the layer 24a includes a thickness of 0.06 inch. In an embodiment, the layer 24a includes a thickness of $1/16$ inch. In an embodiment, the layer 24a includes a thickness of 0.07 inch. In an embodiment, the layer 24a includes a thickness of 0.08 inch. In an embodiment, the layer 24a includes a thickness of 0.09 inch. In an embodiment, the layer 24a includes a thickness of 0.1 inch.

In some embodiments, the layer 24b has a thickness of 0.01 inch to 0.1 inch. In some embodiments, the layer 24c has a thickness of 0.01 inch to 0.1 inch. In some embodiments, each of the layers 24b, 24c has a thickness in similar ranges as those of the layer 24a provided above.

Figure 3B:
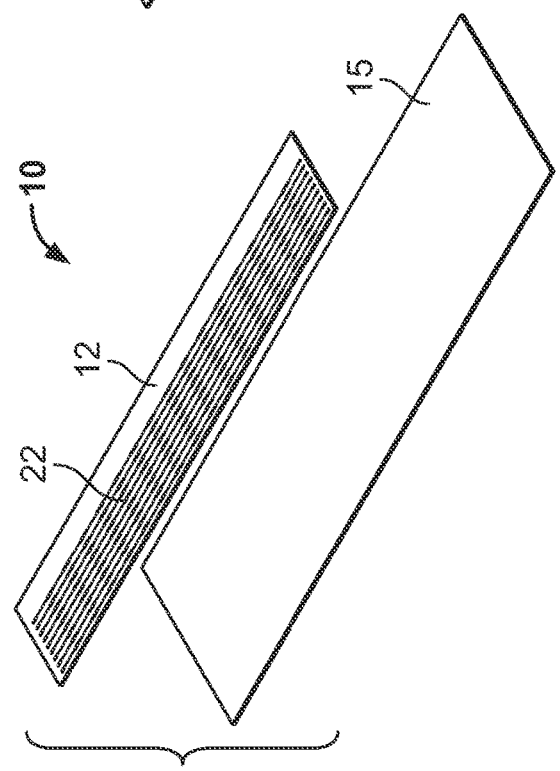
Figure 3C:
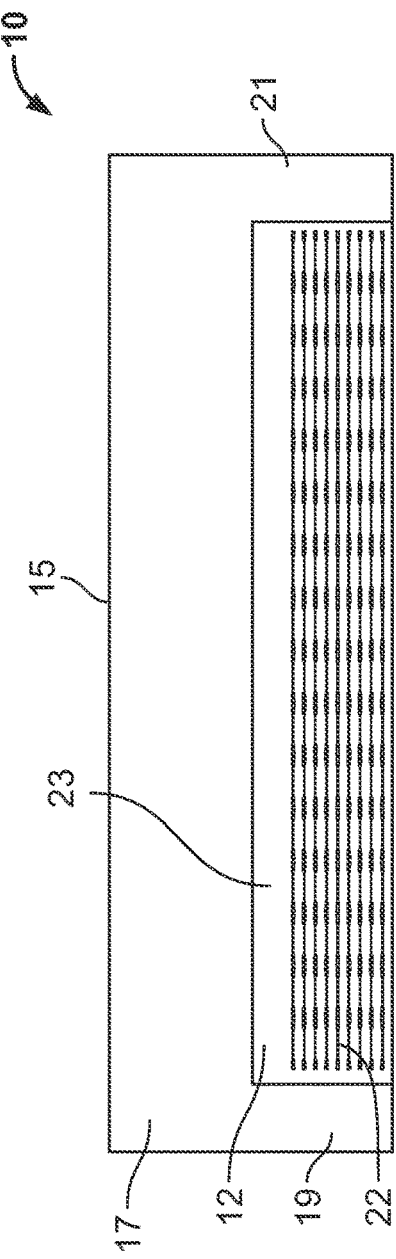

Referring to FIGS. 3A through 3C, in some embodiments, the roofing shingle 10 includes a layer 15. In some embodiments, the base 12 overlays a layer 15. In some embodiments, the layer 15 is not printed. In some embodiments, the layer 15 is not textured. In some embodiments, the layer 15 is composed of a polymeric material. In some embodiments, the layer 15 is composed of thermoplastic polyolefin (TPO). In some embodiments, the layer 15 is composed of carbon black TPO. In some embodiments, the layer 15 is composed of a single ply TPO roofing membrane. In some embodiments, the layer 15 is composed of polyethylene terephthalate ("PET"). In some embodiments, the layer 15 is composed of ethylene tetrafluoroethylene ("ETFE"). In some embodiments, the layer 15 is composed of an acrylic such as polymethyl methacrylate ("PMMA"). In some embodiments, the layer 15 is composed of polyvinyl chloride. In some embodiments, the layer 15 is composed of ethylene propylene diene monomer (EPDM) rubber. In some embodiments, the layer 15 is composed of polyvinyl chloride (PVC). In some embodiments, the layer 15 includes a flame retardant additive. In some embodiments, the flame retardant additive may be clays, nanoclays, silicas, carbon black, metal hydroxides such as aluminum hydroxide, metal foils, graphite, and combinations thereof. In some embodiments, the layer 15 is composed of metal. In some embodiments, the layer 15 is composed of aluminum. In some embodiments, the layer 15 is composed of galvanized aluminum. In some embodiments, the layer 15 is composed of an FR-4 glass-reinforced epoxy laminate material. In some embodiments, the layer 15 has a thickness of 0.01 inch to 0.1 inch. In some embodiments, the layer 15 has a thickness in similar ranges as those of the layer 24a provided above.

In some embodiments, the roofing shingle 10 includes a head lap 17, a first side lap 19 at one end of the roofing shingle 10, and a second side lap 21 at an opposite end of the roofing shingle 10. In some embodiments, a reveal portion 23 of one of the roofing shingles 10 overlays the head lap 17 of another one of the roofing shingles 10 when installed on a roof deck. In some embodiments, the first side lap 19 of one of the roofing shingle 10 overlays the first side lap 19 of another one of the roofing shingles 10 when installed on the roof deck. In some embodiments, the second side lap 21 of one of the roofing shingle 10 overlays the second side lap 21 of another one of the roofing shingles 10 when installed on the roof deck. In some embodiments, the first side lap 19 of one of the roofing shingle 10 overlays the second side lap 21 of another one of the roofing shingles 10 when installed on the roof deck. In some embodiments, the second side lap 21 of one of the roofing shingle 10 overlays the first side lap 19 of another one of the roofing shingles 10 when installed on the roof deck.

Figure 5:
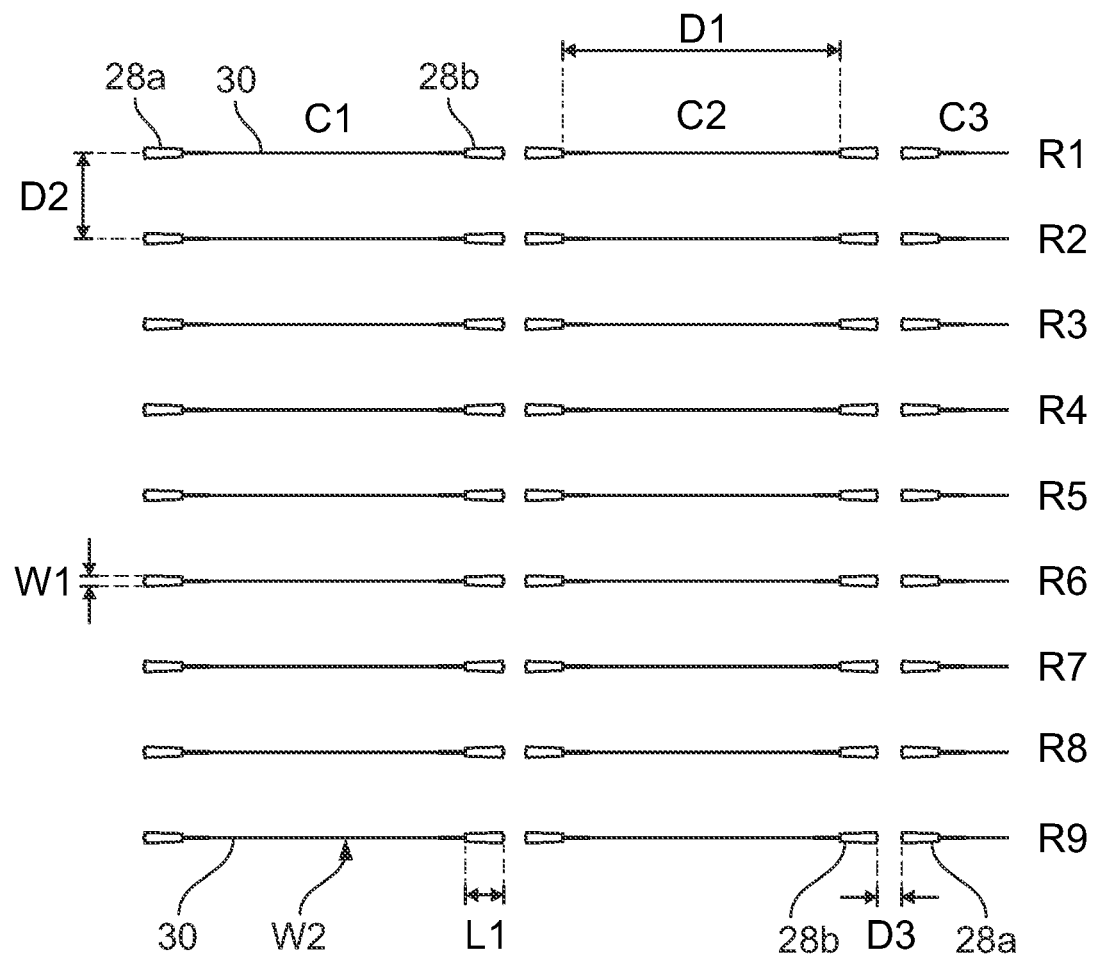

Referring to FIGS. 1, 4 and 5, in some embodiments, a pattern 26 is printed on the first surface 22 of the layer 24a. In some embodiments, the pattern 26 is printed on the first surface 22 of the layer 24a by ink jet printing. In some embodiments, the pattern 26 is printed on the first surface 22 of the layer 24a by laser printing. In some embodiments, the pattern 26 is printed on the first surface 22 of the layer 24a by screen printing. In some embodiments, the pattern 26 is printed on the first surface 22 of the layer 24a by lithography. In some embodiments, the pattern 26 is printed on the first surface 22 of the layer 24a by flexography. In some embodiments, the first layer 24a is painted. In some embodiments, the layer 24a is a colored layer. In some embodiments, the layer 24a includes a black color. In some embodiments, the color of the layer 24a includes a mixture of colors. In some embodiments, the layer 24a includes an infrared reflective pigment. In some embodiments, the infrared reflective pigment includes graphene. In some embodiments, the roofing shingle 10 meets standards of California Building Energy Efficiency Standards of Residential and Nonresidential Buildings, Title 24, Part 6.

In some embodiments, the pattern 26 is printed after lamination of the layers 24a, 24b, 24c. In some embodiments, the pattern 26 is printed during lamination of the layers 24a, 24b, 24c.

In some embodiments, the pattern 26 includes a pattern or depiction of a plurality of solar cells. In some embodiments, the pattern 26 of the solar cells includes a plurality of pads 28. In some embodiments, as used herein, the term "pads" means the depiction of electrical bussing of a the depiction of the plurality of solar cells. In some embodiments, each of the plurality of pads 28 is elongated. In some embodiments, each of the plurality of pads 28 includes an elongated trapezoidal/long trapezoid shape. In some embodiments, each of the plurality of pads 28 includes a rectangular shape. In some embodiments, each of the plurality of pads 28 includes a square shape. In some embodiments, each of the plurality of pads 28 includes a triangular shape. In some embodiments, each of the plurality of pads 28 includes a circular shape. In some embodiments, each of the plurality of pads 28 includes an elliptical shape. In some embodiments, each of the plurality of pads 28 includes an oval shape. In some embodiments, each of the plurality of pads 28 includes a rhombus shape. In some embodiments, each of the plurality of pads 28 includes a hexagonal shape. In some embodiments, each of the plurality of pads 28 includes a pentagonal shape. In some embodiments, each of the plurality of pads 28 includes a polygonal shape. In some embodiments, each of the plurality of pads 28 includes a non-polygonal shape. In some embodiments, each of the plurality of pads 28 includes a geometric shape. In some embodiments, each of the plurality of pads 28 includes a non-geometric shape.

In some embodiments, each of the pads 28 has a length L1. In some embodiments, the length L1 is 5 mm to 30 mm. In some embodiments, the length L1 is 5 mm to 25 mm. In some embodiments, the length L1 is 5 mm to 20 mm. In some embodiments, the length L1 is 5 mm to 15 mm. In some embodiments, the length L1 is 5 mm to 10 mm. In some embodiments, the length L1 is 10 mm to 30 mm. In some embodiments, the length L1 is 10 mm to 25 mm. In some embodiments, the length L1 is 10 mm to 20 mm. In some embodiments, the length L1 is 10 mm to 15 mm. In some embodiments, the length L1 is 15 mm to 30 mm. In some embodiments, the length L1 is 15 mm to 25 mm. In some embodiments, the length L1 is 15 mm to 20 mm. In some embodiments, the length L1 is 20 mm to 30 mm. In some embodiments, the length L1 is 20 mm to 25 mm. In some embodiments, the length L1 is 25 mm to 30 mm. In some embodiments, the length L1 is 5 mm. In some embodiments, the length L1 is 10 mm. In some embodiments, the length L1 is 15 mm. In some embodiments, the length L1 is 20 mm. In some embodiments, the length L1 is 25 mm. In some embodiments, the length L1 is 30 mm.

In some embodiments, each of the pads 28 has a width W1. In some embodiments, the width W1 is 1 mm to 10 mm. In some embodiments, the width W1 is 1 mm to 9 mm. In some embodiments, the width W1 is 1 mm to 8 mm. In some embodiments, the width W1 is 1 mm to 7 mm. In some embodiments, the width W1 is 1 mm to 6 mm. In some embodiments, the width W1 is 1 mm to 5 mm. In some embodiments, the width W1 is 1 mm to 4 mm. In some embodiments, the width W1 is 1 mm to 3 mm. In some embodiments, the width W1 is 1 mm to 2 mm. In some embodiments, the width W1 is 2 mm to 10 mm. In some embodiments, the width W1 is 2 mm to 9 mm. In some embodiments, the width W1 is 2 mm to 8 mm. In some embodiments, the width W1 is 2 mm to 7 mm. In some embodiments, the width W1 is 2 mm to 6 mm. In some embodiments, the width W1 is 2 mm to 5 mm. In some embodiments, the width W1 is 2 mm to 4 mm. In some embodiments, the width W1 is 2 mm to 3 mm. In some embodiments, the width W1 is 3 mm to 10 mm. In some embodiments, the width W1 is 3 mm to 9 mm. In some embodiments, the width W1 is 3 mm to 8 mm. In some embodiments, the width W1 is 3 mm to 7 mm. In some embodiments, the width W1 is 3 mm to 6 mm. In some embodiments, the width W1 is 3 mm to 5 mm. In some embodiments, the width W1 is 3 mm to 4 mm. In some embodiments, the width W1 is 4 mm to 10 mm. In some embodiments, the width W1 is 4 mm to 9 mm. In some embodiments, the width W1 is 4 mm to 8 mm. In some embodiments, the width W1 is 4 mm to 7 mm. In some embodiments, the width W1 is 4 mm to 6 mm. In some embodiments, the width W1 is 4 mm to 5 mm.

In some embodiments, the width W1 is 5 mm to 10 mm. In some embodiments, the width W1 is 5 mm to 9 mm. In some embodiments, the width W1 is 5 mm to 8 mm. In some embodiments, the width W1 is 5 mm to 7 mm. In some embodiments, the width W1 is 5 mm to 6 mm. In some embodiments, the width W1 is 6 mm to 10 mm. In some embodiments, the width W1 is 6 mm to 9 mm. In some embodiments, the width W1 is 6 mm to 8 mm. In some embodiments, the width W1 is 6 mm to 7 mm. In some embodiments, the width W1 is 7 mm to 10 mm. In some embodiments, the width W1 is 7 mm to 9 mm. In some embodiments, the width W1 is 7 mm to 8 mm. In some embodiments, the width W1 is 8 mm to 10 mm. In some embodiments, the width W1 is 8 mm to 9 mm. In some embodiments, the width W1 is 9 mm to 10 mm.

In some embodiments, the width W1 is 1 mm. In some embodiments, the width W1 is 2 mm. In some embodiments, the width W1 is 3 mm. In some embodiments, the width W1 is 4 mm. In some embodiments, the width W1 is 5 mm. In some embodiments, the width W1 is 6 mm. In some embodiments, the width W1 is 7 mm. In some embodiments, the width W1 is 8 mm. In some embodiments, the width W1 is 9 mm. In some embodiments, the width W1 is 10 mm.

In some embodiments, the pads 28 are arranged in a plurality of sets, each of which includes a first pad 28a and a second pad 28b. In some embodiments, the sets of the first and second pads 28a, 28b are arranged in a matrix including a plurality of rows R and a plurality of columns C. In some embodiments, the first pad 28a and the second pad 28b in each set of each column C are spaced apart from one another. In some embodiments, the first pad 28a and the second pad 28b in each set of each column C are spaced apart from one another by a distance D1.

In some embodiments, the distance D1 is 20 mm to 150 mm. In some embodiments, the distance D1 is 20 mm to 140 mm. In some embodiments, the distance D1 is 20 mm to 130 mm. In some embodiments, the distance D1 is 20 mm to 120 mm. In some embodiments, the distance D1 is 20 mm to 110 mm. In some embodiments, the distance D1 is 20 mm to 100 mm. In some embodiments, the distance D1 is 20 mm to 90 mm. In some embodiments, the distance D1 is 20 mm to 80 mm. In some embodiments, the distance D1 is 20 mm to 70 mm. In some embodiments, the distance D1 is 20 mm to 60 mm. In some embodiments, the distance D1 is 20 mm to 50 mm. In some embodiments, the distance D1 is 20 mm to 40 mm. In some embodiments, the distance D1 is 20 mm to 30 mm. In some embodiments, the distance D1 is 30 mm to 150 mm. In some embodiments, the distance D1 is 30 mm to 140 mm. In some embodiments, the distance D1 is 30 mm to 130 mm. In some embodiments, the distance D1 is 30 mm to 120 mm. In some embodiments, the distance D1 is 30 mm to 110 mm. In some embodiments, the distance D1 is 30 mm to 100 mm. In some embodiments, the distance D1 is 30 mm to 90 mm. In some embodiments, the distance D1 is 30 mm to 80 mm. In some embodiments, the distance D1 is 30 mm to 70 mm. In some embodiments, the distance D1 is 30 mm to 60 mm. In some embodiments, the distance D1 is 30 mm to 50 mm. In some embodiments, the distance D1 is 30 mm to 40 mm.

In some embodiments, the distance D1 is 40 mm to 150 mm. In some embodiments, the distance D1 is 40 mm to 140 mm. In some embodiments, the distance D1 is 40 mm to 130 mm. In some embodiments, the distance D1 is 40 mm to 120 mm. In some embodiments, the distance D1 is 40 mm to 110 mm. In some embodiments, the distance D1 is 40 mm to 100 mm. In some embodiments, the distance D1 is 40 mm to 90 mm. In some embodiments, the distance D1 is 40 mm to 80 mm. In some embodiments, the distance D1 is 40 mm to 70 mm. In some embodiments, the distance D1 is 40 mm to 60 mm. In some embodiments, the distance D1 is 40 mm to 50 mm. In some embodiments, the distance D1 is 50 mm to 150 mm. In some embodiments, the distance D1 is 50 mm to 140 mm. In some embodiments, the distance D1 is 50 mm to 130 mm. In some embodiments, the distance D1 is 50 mm to 120 mm. In some embodiments, the distance D1 is 50 mm to 110 mm. In some embodiments, the distance D1 is 50 mm to 100 mm. In some embodiments, the distance D1 is 50 mm to 90 mm. In some embodiments, the distance D1 is 50 mm to 80 mm. In some embodiments, the distance D1 is 50 mm to 70 mm. In some embodiments, the distance D1 is 50 mm to 60 mm.

In some embodiments, the distance D1 is 60 mm to 150 mm. In some embodiments, the distance D1 is 60 mm to 140 mm. In some embodiments, the distance D1 is 60 mm to 130 mm. In some embodiments, the distance D1 is 60 mm to 120 mm. In some embodiments, the distance D1 is 60 mm to 110 mm. In some embodiments, the distance D1 is 60 mm to 100 mm. In some embodiments, the distance D1 is 60 mm to 90 mm. In some embodiments, the distance D1 is 60 mm to 80 mm. In some embodiments, the distance D1 is 60 mm to 70 mm. In some embodiments, the distance D1 is 70 mm to 150 mm. In some embodiments, the distance D1 is 70 mm to 140 mm. In some embodiments, the distance D1 is 70 mm to 130 mm. In some embodiments, the distance D1 is 70 mm to 120 mm. In some embodiments, the distance D1 is 70 mm to 110 mm. In some embodiments, the distance D1 is 70 mm to 100 mm. In some embodiments, the distance D1 is 70 mm to 90 mm. In some embodiments, the distance D1 is 70 mm to 80 mm. In some embodiments, the distance D1 is 80 mm to 150 mm. In some embodiments, the distance D1 is 80 mm to 140 mm. In some embodiments, the distance D1 is 80 mm to 130 mm. In some embodiments, the distance D1 is 80 mm to 120 mm. In some embodiments, the distance D1 is 80 mm to 110 mm. In some embodiments, the distance D1 is 80 mm to 100 mm. In some embodiments, the distance D1 is 80 mm to 90 mm.

In some embodiments, the distance D1 is 90 mm to 150 mm. In some embodiments, the distance D1 is 90 mm to 140 mm. In some embodiments, the distance D1 is 90 mm to 130 mm. In some embodiments, the distance D1 is 90 mm to 120 mm. In some embodiments, the distance D1 is 90 mm to 110 mm. In some embodiments, the distance D1 is 90 mm to 100 mm. In some embodiments, the distance D1 is 100 mm to 150 mm. In some embodiments, the distance D1 is 100 mm to 140 mm. In some embodiments, the distance D1 is 100 mm to 130 mm. In some embodiments, the distance D1 is 100 mm to 120 mm. In some embodiments, the distance D1 is 100 mm to 110 mm. In some embodiments, the distance D1 is 110 mm to 150 mm. In some embodiments, the distance D1 is 110 mm to 140 mm. In some embodiments, the distance D1 is 110 mm to 130 mm. In some embodiments, the distance D1 is 110 mm to 120 mm. In some embodiments, the distance D1 is 120 mm to 150 mm. In some embodiments, the distance D1 is 120 mm to 140 mm. In some embodiments, the distance D1 is 120 mm to 130 mm. In some embodiments, the distance D1 is 130 mm to 150 mm. In some embodiments, the distance D1 is 130 mm to 140 mm. In some embodiments, the distance D1 is 140 mm to 150 mm.

In some embodiments, the distance D1 is 20 mm. In some embodiments, the distance D1 is 30 mm. In some embodiments, the distance D1 is 40 mm. In some embodiments, the distance D1 is 50 mm. In some embodiments, the distance D1 is 60 mm. In some embodiments, the distance D1 is 70 mm. In some embodiments, the distance D1 is 80 mm. In some embodiments, the distance D1 is 90 mm. In some embodiments, the distance D1 is 100 mm. In some embodiments, the distance D1 is 110 mm. In some embodiments, the distance D1 is 120 mm. In some embodiments, the distance D1 is 130 mm. In some embodiments, the distance D1 is 140 mm. In some embodiments, the distance D1 is 150 mm.

In some embodiments, each of the sets of pads 28 of one row R (for example, row R1) in each column C (for example, column C1) is spaced apart from another of the sets of pads 28 of another adjacent one of the rows R (for example, row R2) by a distance D2. In some embodiments, the distance D2 is 10 mm to 50 mm. In some embodiments, the distance D2 is 10 mm to 40 mm. In some embodiments, the distance D2 is 10 mm to 30 mm. In some embodiments, the distance D2 is 10 mm to 20 mm. In some embodiments, the distance D2 is 20 mm to 50 mm. In some embodiments, the distance D2 is 20 mm to 40 mm. In some embodiments, the distance D2 is 20 mm to 30 mm. In some embodiments, the distance D2 is 30 mm to 50 mm. In some embodiments, the distance D2 is 30 mm to 40 mm. In some embodiments, the distance D2 is 40 mm to 50 mm. In some embodiments, the distance D2 is 10 mm. In some embodiments, the distance D2 is 20 mm. In some embodiments, the distance D2 is 30 mm. In some embodiments, the distance D2 is 40 mm. In some embodiments, the distance D2 is 50 mm.

Referring to FIG. 5, in some embodiments, the pad 28b of each of the sets of pads 28 of one row R (for example, row R9) in a column C (for example, column C2) is spaced apart from the pad 28a of another of the sets of pads 28 of the same row R9 of another adjacent one of the columns C (for example, column C3) by a distance D3. In some embodiments, the distance D3 is 1 mm to 20 mm. In some embodiments, the distance D3 is 1 mm to 15 mm. In some embodiments, the distance D3 is 1 mm to 10 mm. In some embodiments, the distance D3 is 1 mm to 5 mm. In some embodiments, the distance D3 is 5 mm to 20 mm. In some embodiments, the distance D3 is 5 mm to 15 mm. In some embodiments, the distance D3 is 5 mm to 10 mm. In some embodiments, the distance D3 is 10 mm to 20 mm. In some embodiments, the distance D3 is 10 mm to 15 mm. In some embodiments, the distance D3 is 15 mm to 20 mm. In some embodiments, the distance D3 is 1 mm. In some embodiments, the distance D3 is 2 mm. In some embodiments, the distance D3 is 3 mm. In some embodiments, the distance D3 is 4 mm. In some embodiments, the distance D3 is 5 mm. In some embodiments, the distance D3 is 6 mm. In some embodiments, the distance D3 is 7 mm. In some embodiments, the distance D3 is 8 mm. In some embodiments, the distance D3 is 9 mm. In some embodiments, the distance D3 is 10 mm. In some embodiments, the distance D3 is 11 mm. In some embodiments, the distance D3 is 12 mm. In some embodiments, the distance D3 is 13 mm. In some embodiments, the distance D3 is 14 mm. In some embodiments, the distance D3 is 15 mm. In some embodiments, the distance D3 is 16 mm. In some embodiments, the distance D3 is 17 mm. In some embodiments, the distance D3 is 18 mm. In some embodiments, the distance D3 is 19 mm. In some embodiments, the distance D3 is 20 mm.

In some embodiments, the pads 28b of each of the sets of pads 28 of the rows R in each column C and the pads 28a of the another of the sets of pads 28 of the same row R of the another adjacent one of the columns C depict a plurality of electrical busbars. In some embodiments, the pads 28a in each of the rows R of the first column C proximate to the first end 14 depict a first end busbar, while the pads 28 in each of the rows R of the last column C proximate to the second end 16 depict a second end busbar.

Still referring to FIG. 5, in some embodiments, the first and second pads 28a, 28b of each of the sets of pads 28 are connected to another by a line 30. In some embodiments, the line 30 depicts a cell finger of a solar cell. In some embodiments, the line 30 is printed. In some embodiments, the line 30 has a width W2, In some embodiment, the width W2 is 0.5 mm to 5 mm. In some embodiments, the width W2 is 0.5 mm to 4 mm. In some embodiments, the width W2 is 0.5 mm to 3 mm. In some embodiments, the width W2 is 0.5 mm to 2 mm. In some embodiments, the width W2 is 0.5 mm to 1 mm. In some embodiment, the width W2 is 1 mm to 5 mm. In some embodiment, the width W2 is 1 mm to 4 mm. In some embodiment, the width W2 is 1 mm to 3 mm. In some embodiment, the width W2 is 1 mm to 2 mm. In some embodiment, the width W2 is 2 mm to 5 mm. In some embodiments, the width W2 is 2 mm to 4 mm. In some embodiments, the width W2 is 2 mm to 3 mm. In some embodiment, the width W2 is 3 mm to 5 mm. In some embodiments, the width W2 is 3 mm to 4 mm. In some embodiment, the width W2 is 4 mm to 5 mm. In some embodiment, the width W2 is 0.5 mm. In some embodiment, the width W2 is 1 mm. In some embodiment, the width W2 is 2 mm. In some embodiment, the width W2 is 3 mm. In some embodiment, the width W2 is 4 mm. In some embodiment, the width W2 is 5 mm.

In some embodiments, the lines 30 in each of the rows R in each of the columns C depict a plurality of fingers of a solar cell. In some embodiments, the pads 28 and the lines 30 depict a plurality of solar cells on the surface 22 of the roofing shingle 10.

Figure 6:
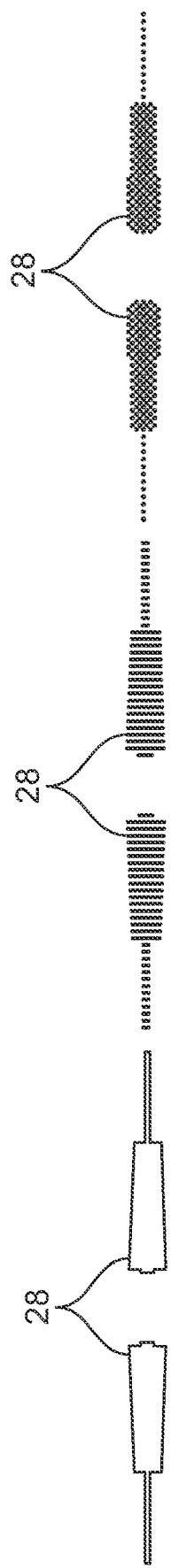
FIGS. 6A through 6C illustrate some embodiments of pads of the mimicked solar cell patterns shown in FIGS. 4 and 5.

Referring to FIG. 6A, in some embodiments, each of the pads 28 is printed in a solid form. Referring to FIG. 6B, in some embodiments, each of the pads 28 is composed of a plurality of printed lines. Referring to FIG. 6C, in some embodiments, each of the pads 28 is composed of a plurality of printed dots.

Referring back to FIG. 1, in some embodiments, the pattern 26 is printed using a CMYK color model. As used herein, the term "CMYK color model" is the four color process model (cyan, magenta, yellow, and key (i.e., black) used for printing color images. In some embodiments, the pattern 26 includes shading that is composed of a color in a CMYK color bracket of [0, 0, 0, x]. In some embodiments, x is 60 to 100. In some embodiments, x is 60 to 95. In some embodiments, x is 60 to 90. In some embodiments, x is 60 to 85. In some embodiments, x is 60 to 80. In some embodiments, x is 60 to 75. In some embodiments, x is 60 to 70. In some embodiments, x is 60 to 65. In some embodiments, x is 65 to 100. In some embodiments, x is 65 to 95. In some embodiments, x is 65 to 90. In some embodiments, x is 65 to 85. In some embodiments, x is 65 to 80. In some embodiments, x is 65 to 75. In some embodiments, x is 65 to 70. In some embodiments, x is 70 to 100. In some embodiments, x is 70 to 95. In some embodiments, x is 70 to 90. In some embodiments, x is 70 to 85. In some embodiments, x is 70 to 80. In some embodiments, x is 70 to 75. In some embodiments, x is 75 to 100. In some embodiments, x is 75 to 95. In some embodiments, x is 75 to 90. In some embodiments, x is 75 to 85. In some embodiments, x is 75 to 80. In some embodiments, x is 80 to 100. In some embodiments, x is 80 to 95. In some embodiments, x is 80 to 90. In some embodiments, x is 80 to 85. In some embodiments, x is 85 to 100. In some embodiments, x is 85 to 95. In some embodiments, x is 85 to 90. In some embodiments, x is 90 to 100. In some embodiments, x is 90 to 95. In some embodiments, x is 95 to 100. In some embodiments, x is 60. In some embodiments, x is 65. In some embodiments, x is 70. In some embodiments, x is 75. In some embodiments, x is 80. In some embodiments, x is 85. In some embodiments, x is 90. In some embodiments, x is 95. In some embodiments, x is 100.

In some embodiments, the shading of the pattern 26 in its entirety is constant. In some embodiments, the shading of the pattern 26 is substantially constant. In some embodiments, the shading of the pattern 26 is random. In some embodiments, the shading of the pattern 26 includes a first shade S1. In some embodiments, the shading of the pattern 26 includes a second shade S2. In some embodiments, the shading of the pattern 26 includes a third shade S3. In some embodiments, the shading of the pattern 26 includes a fourth shade S4.

In some embodiments, the shading of the pattern 26 of the roofing shingle 10 increases from the first end 14 to the second end 16. In some embodiments, the shading of the pattern 26 of the roofing shingle 10 gradationally increases from the first end 14 to the second end 16. In some embodiments, the shading of the pattern 26 of the roofing shingle 10 increases from the first end 14 to the second end 16 by a step change in shading or color at one or more selected locations on the roofing shingle 10. In some embodiments, the shade S2 is greater than the shade S1. In some embodiments, the shade S3 is greater than the shade S2. In some embodiments, the shade S4 is greater than the shade S3.

In some embodiments, the shade S1 includes a CMYK color bracket of [0, 0, 0, 60]. In some embodiments, the shade S1 includes a CMYK color bracket of [0, 0, 0, 65]. In some embodiments, the shade S1 includes a CMYK color bracket of [0, 0, 0, 70]. In some embodiments, the shade S1 includes a CMYK color bracket of [0, 0, 0, 75]. In some embodiments, the shade S1 includes a CMYK color bracket of [0, 0, 0, 80]. In some embodiments, the shade S1 includes a CMYK color bracket of [0, 0, 0, 85].

In some embodiments, the shade S2 includes a CMYK color bracket of [0, 0, 0, 65]. In some embodiments, the shade S2 includes a CMYK color bracket of [0, 0, 0, 70]. In some embodiments, the shade S2 includes a CMYK color bracket of [0, 0, 0, 75]. In some embodiments, the shade S2 includes a CMYK color bracket of [0, 0, 0, 80]. In some embodiments, the shade S2 includes a CMYK color bracket of [0, 0, 0, 85]. In some embodiments, the shade S2 includes a CMYK color bracket of [0, 0, 0, 90].

In some embodiments, the shade S3 has a CMYK color bracket of [0, 0, 0, 70]. In some embodiments, the shade S3 has CMYK color bracket of [0, 0, 0, 75]. In some embodiments, the shade S3 has a CMYK color bracket of [0, 0, 0, 80]. In some embodiments, the shade S3 has a CMYK color bracket of [0, 0, 0, 85]. In some embodiments, the shade S3 has a CMYK color bracket of [0, 0, 0, 90]. In some embodiments, the shade S3 has a CMYK color bracket of [0, 0, 0, 95].

In some embodiments, the shade S4 has a CMYK color bracket of [0, 0, 0, 75]. In some embodiments, the shade S4 has CMYK color bracket of [0, 0, 0, 80]. In some embodiments, the shade S4 has a CMYK color bracket of [0, 0, 0, 85]. In some embodiments, the shade S3 has a CMYK color bracket of [0, 0, 0, 90]. In some embodiments, the shade S4 has a CMYK color bracket of [0, 0, 0, 95]. In some embodiments, the shade S4 has a CMYK color bracket of [0, 0, 0, 100].

In some embodiments, the shading of the pattern 26 of the roofing shingle 10 decreases from the first end 14 to the second end 16. In some embodiments, the shading of the pattern 26 of the roofing shingle 10 gradationally decreases from the first end 14 to the second end 16. In some embodiments, the shading of the pattern 26 of the roofing shingle 10 decreases from the first end 14 to the second end 16 by a step change in shading or color at one or more selected locations on the roofing shingle 10. In some embodiments, the shade S2 is greater than the shade S1. In some embodiments, the shade S3 is greater than the shade S2. In some embodiments, the shade S4 is greater than the shade S3.

In some embodiments, the shade S1 includes a CMYK color bracket of [0, 0, 0, 75]. In some embodiments, the shade S1 includes a CMYK color bracket of [0, 0, 0, 80]. In some embodiments, the shade S1 includes a CMYK color bracket of [0, 0, 0, 85]. In some embodiments, the shade S1 includes a CMYK color bracket of [0, 0, 0, 90]. In some embodiments, the shade S1 includes a CMYK color bracket of [0, 0, 0, 95]. In some embodiments, the shade S1 includes a CMYK color bracket of [0, 0, 0, 100].

In some embodiments, the shade S2 includes a CMYK color bracket of [0, 0, 0, 70]. In some embodiments, the shade S2 includes a CMYK color bracket of [0, 0, 0, 75]. In some embodiments, the shade S2 includes a CMYK color bracket of [0, 0, 0, 80]. In some embodiments, the shade S2 includes a CMYK color bracket of [0, 0, 0, 85]. In some embodiments, the shade S2 includes a CMYK color bracket of [0, 0, 0, 90]. In some embodiments, the shade S2 includes a CMYK color bracket of [0, 0, 0, 95].

In some embodiments, the shade S3 has a CMYK color bracket of [0, 0, 0, 65]. In some embodiments, the shade S3 has CMYK color bracket of [0, 0, 0, 70]. In some embodiments, the shade S3 has a CMYK color bracket of [0, 0, 0, 75]. In some embodiments, the shade S3 has a CMYK color bracket of [0, 0, 0, 80]. In some embodiments, the shade S3 has a CMYK color bracket of [0, 0, 0, 85]. In some embodiments, the shade S3 has a CMYK color bracket of [0, 0, 0, 90].

In some embodiments, the shade S4 has a CMYK color bracket of [0, 0, 0, 60]. In some embodiments, the shade S4 has CMYK color bracket of [0, 0, 0, 65]. In some embodiments, the shade S4 has a CMYK color bracket of [0, 0, 0, 70]. In some embodiments, the shade S3 has a CMYK color bracket of [0, 0, 0, 75]. In some embodiments, the shade S4 has a CMYK color bracket of [0, 0, 0, 80]. In some embodiments, the shade S4 has a CMYK color bracket of [0, 0, 0, 85].

Figure 7:
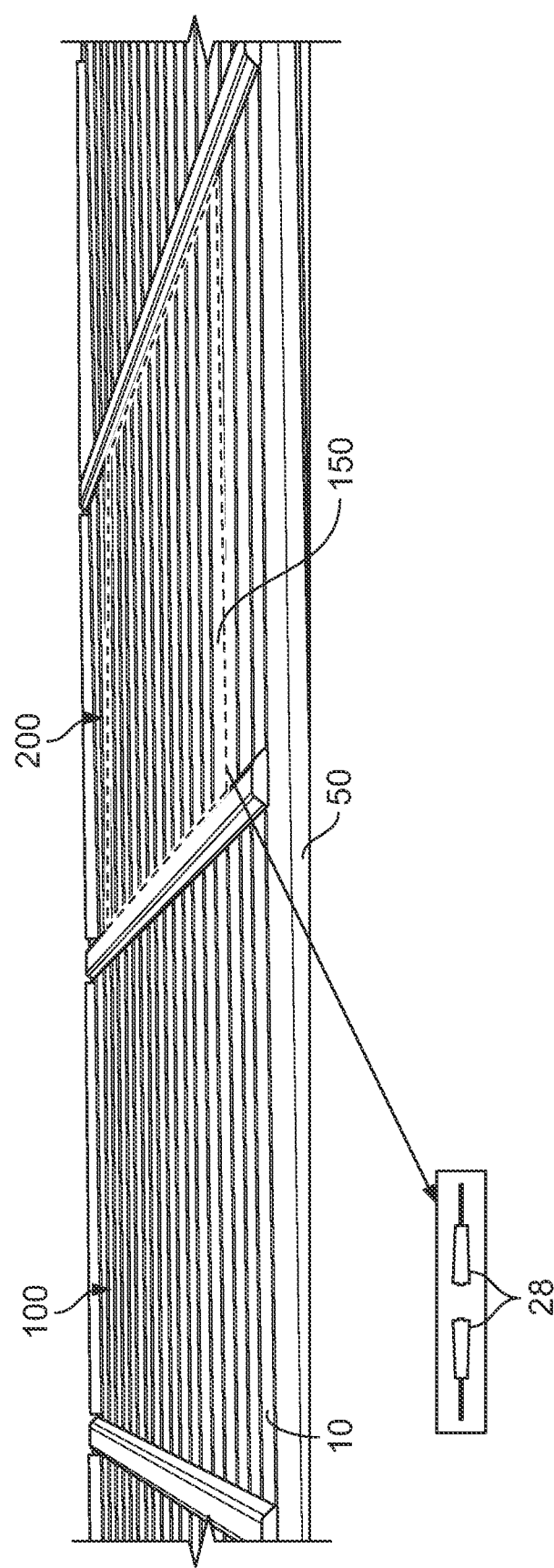
FIGS. 7 and 8 are photographs of some embodiments of a plurality of the roofing shingles shown in FIG. 1 installed on a roof deck together with a plurality of photovoltaic modules.

FIG. 7 illustrates an embodiment of an aesthetic comparison of a plurality of the roofing shingles 10 installed on a roof deck 50 and arranged in a first column 100 and a plurality of photovoltaic modules 150 installed on the roof deck 50 and arranged in a second, adjacent column 200. In some embodiments, each of the roofing shingles 10 includes a CMYK color bracket of [0, 0, 0, 85]. In some embodiments, the pads 28a, 28b of the pattern 26 are printed in a solid form as shown in the FIG. 6A. In some embodiments, the roofing shingles 10 are visually similar, or visually substantially similar, in aesthetic appearance to that of the photovoltaic modules 150. In some embodiments, the shading of the pattern 26 of all of the roofing shingles 10 is identical. In some embodiments, the shading of the pattern 26 of all of the roofing shingles 10 is substantially the same as one another. In some embodiments, the shading of the patterns 26 of the roofing shingles 10 is randomized.

In some embodiments, the roof deck 50 is a steep slope roof deck. As defined herein, a "steep slope roof deck" is any roof deck that is disposed on a roof having a pitch of Y/X, where Y and X are in a ratio of 4:12 to 12:12, where Y corresponds to the "rise" of the roof, and where X corresponds to the "run" of the roof. In some embodiments, the pattern 26 of the roofing shingles 10 depict the appearance of solar cells thereon when viewed from a distance. In some embodiments, the distance is 10 feet or greater.

Figure 8:
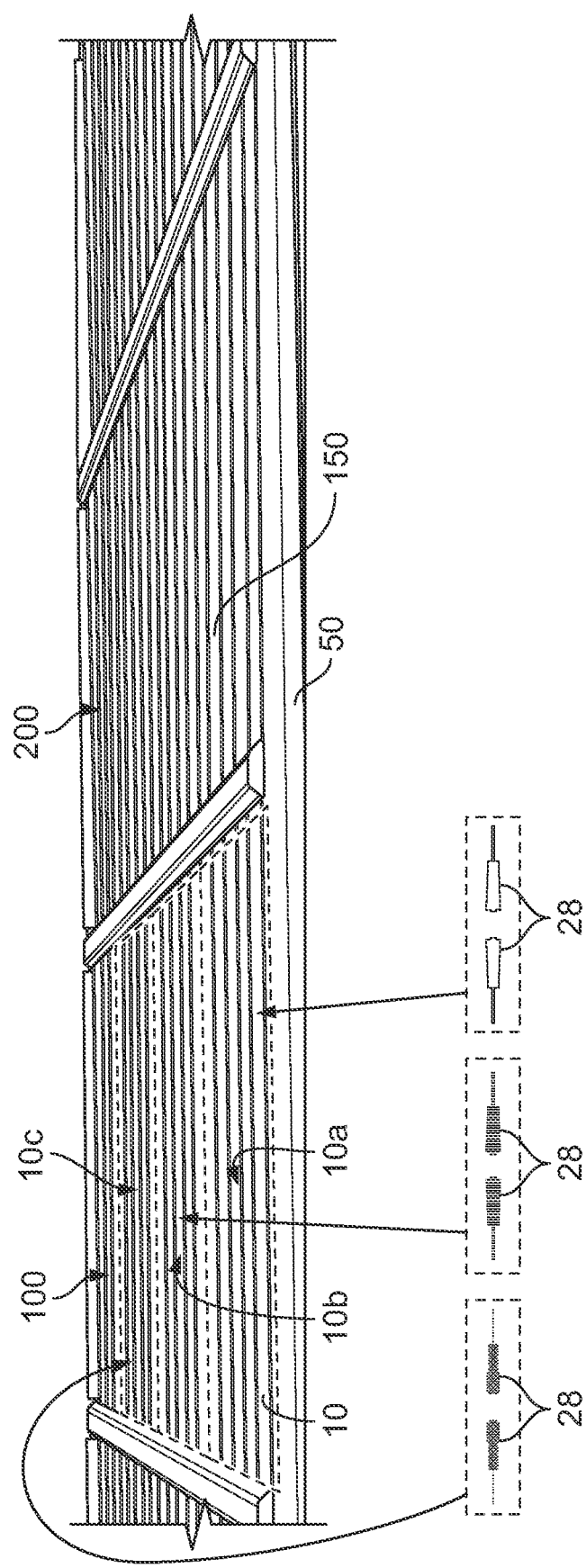

FIG. 8 illustrates embodiments of an aesthetic comparison of a plurality of the roofing shingles 10 installed on the roof deck 50 and arranged in the first column 100 and a plurality of the photovoltaic modules 150 installed on the roof deck 50 and arranged in the second column 200. In some embodiments, each of the roofing shingles 10 includes a CMYK color bracket of [0, 0, 0, 85]. In some embodiments, the pads 28a, 28b of the pattern 26 of a first plurality of rows 10a of the roofing shingles 10 are printed in a solid form as shown in the FIG. 6A. In some embodiments, the pads 28a, 28b of the pattern 26 of a second plurality of rows 10b of the roofing shingles 10 are formed of printed lines as shown in the FIG. 6B. In some embodiments, the pads 28a, 28b of the pattern 26 of a third plurality of rows 10c of the roofing shingles 10 are formed of printed lines as shown in the FIG. 6C. In some embodiments, the roofing shingles 10 are visually similar in appearance to that of the photovoltaic modules 150. In some embodiments, the shading of the pattern 26 of all of the roofing shingles 10 is identical. In some embodiments, the shading of the pattern 26 of all of the roofing shingles 10 is substantially the same as one another. In some embodiments, the shading of the patterns 26 of the roofing shingles 10 is randomized.

In some embodiments, a kit comprises a plurality of the photovoltaic modules 150 configured to be installed on the roof deck 50 and a plurality of the roofing shingles 10 configured to be installed on the roof deck 50. In some embodiments, the roofing shingles 10 are configured to be installed proximate to the photovoltaic modules 150. In some embodiments, the roofing shingles 10 are configured to be installed adjacent to the photovoltaic modules 150.

Figure 9:
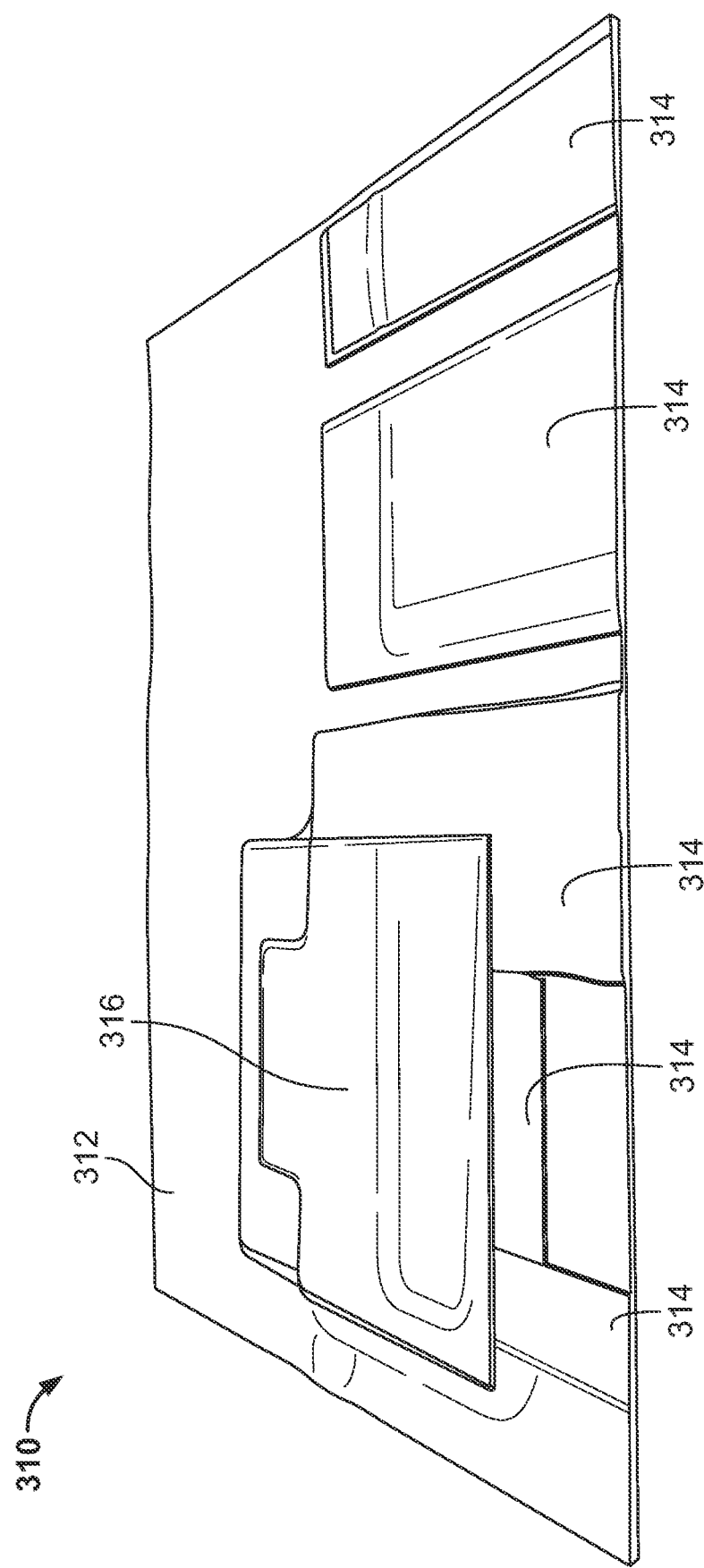
FIG. 9 is a photograph of some embodiments of a roofing shingle.

Referring to FIG. 9, in some embodiments, a roofing shingle 310 includes a base layer 312 and a first plurality of layers 314 overlaying the base layer 312. In some embodiments, the first plurality of layers 314 is arranged in a pattern on the base layer 312. In some embodiments, the first plurality of layers 314 is arranged randomly on the base layer 312. In some embodiments, each of the first plurality of layers 314 are rectangular in shape. In some embodiments, each of the each of the first plurality of layers 314 includes a square shape. In some embodiments, each of the each of the first plurality of layers 314 includes a triangular shape. In some embodiments, each of the first plurality of layers 314 includes a circular shape. In some embodiments, each of the plurality of first layers 314 includes an elliptical shape. In some embodiments, each of the plurality of first layers 314 includes an oval shape. In some embodiments, each of the first plurality of layers 314 includes a rhombus shape. In some embodiments, each of the first plurality of layers 314 includes a hexagonal shape. In some embodiments, each of the first plurality of layers 314 includes a pentagonal shape. In some embodiments, each of the first plurality of layers 314 includes a polygonal shape. In some embodiments, each of the first plurality of layers 314 includes a non-polygonal shape. In some embodiments, each of the first plurality of layers 314 includes a geometric shape. In some embodiments, each of the first plurality of layers 314 includes a non-geometric shape.

In some embodiments, the roofing shingle 310 includes at least one second layer 316. In some embodiments, the at least one second layer 316 overlays at least one of the first plurality of layers 314. In some embodiments, the at least one second layer 316 overlays more than one of the first plurality of layers 314. In some embodiments, the at least one second layer 316 overlays the base layer 312. In some embodiments, the at least one second layer 316 overlays the base layer 312 and at least one of the first plurality of layers 314. In some embodiments, the at least one second layer 316 overlays the base layer 312 and more than one of the first plurality of layers 314. In some embodiments, the at least one second layer 316 includes a plurality of second layers 316.

In some embodiments, each of the layers 312, 314, 316 is composed of a polymeric material. In some embodiments, each of the layers 312, 314, 316 is composed of thermoplastic polyolefin (TPO). In some embodiments, each of the layers 312, 314, 316 is composed of a single ply TPO roofing membrane. In some embodiments, each of the layers 312, 314, 316 is composed of polyethylene terephthalate ("PET"). In some embodiments, each of the layers 312, 314, 316 is composed of ethylene tetrafluoroethylene ("ETFE"). In some embodiments, each of the layers 312, 314, 316 is composed of an acrylic such as polymethyl methacrylate ("PMMA"). In some embodiments, each of the layers 312, 314, 316 is composed of polyvinyl chloride. In some embodiments, each of the layers 312, 314, 316 is composed of ethylene propylene diene monomer (EPDM) rubber. In some embodiments, each of the layers 312, 314, 316 is composed of polyvinyl chloride (PVC). In an embodiment, each of the layers 312, 314, 316 includes a flame retardant additive. In some embodiments, the flame retardant additive may be clays, nanoclays, silicas, carbon black, metal hydroxides such as aluminum hydroxide, metal foils, graphite, and combinations thereof.

In some embodiments, the layers 312, 314, 316 are laminated. In some embodiments, the layers 312, 314, 316 are ultrasonically welded to one another. In some embodiments, the layers 312, 314, 316 are heat welded to one another. In some embodiments, the layers 312, 314, 316 are thermally bonded to one another. In some embodiments, the layers 312, 314, 316 are adhered to one another by an adhesive. In some embodiments, the layers 312, 314, 316 are arranged to form a pattern. In some embodiments, the pattern depicts outlines of a plurality of solar cells.

In some embodiments, each of the layers 312, 314, 316 has a thickness of 0.01 inch to 0.1 inch. In some embodiments, each of the layers 312, 314, 316 has a thickness in similar ranges as those of the layer 24a provided above. In some embodiments, each of the layers 312, 314, 316 is textured.

Referring to FIGS. 10 through 12, in some embodiments, a roofing shingle 410 includes a cap layer 412 (frontsheet) and a core layer 414. In some embodiments, the core layer 414 is underneath the cap layer 412. In some embodiments, the cap layer 412 overlays the core layer 414. In some embodiments, the cap layer 412 is juxtaposed with the core layer 414. In some embodiments, the cap layer 412 and the core layer 414 are thermally bonded to one another. In some embodiments, the cap layer 412 and the core layer 414 are heat welded to one another. In some embodiments, the cap layer 412 and the core layer 414 are ultrasonically welded to one another. In some embodiments, the cap layer 412 and the core layer 414 are laminated. In some embodiments, the cap layer 412 is attached to the core layer 414 by and adhesive. In some embodiments, the cap layer 412 and the core layer 414 are mechanically attached to one another. In some embodiments, the roofing shingle 410 does not include a solar cell, a photovoltaic cell, or any electrical device that converts the energy of light into electricity. In some embodiments, the roofing shingle 410 does not include any electrically active components.

In some embodiments, the cap layer 412 is composed of a polymeric material. In some embodiments, the cap layer 412 is a polymeric material composed of thermoplastic polyolefin (TPO). In some embodiments, the cap layer 412 is composed of a single ply TPO roofing membrane. In other embodiments, non-limiting examples of TPO membranes are disclosed in U.S. Pat. No. 9,359,014 to Yang et al., which is incorporated by reference herein in its entirety. In some embodiments, the cap layer 412 is a polymeric material composed of polyethylene ("PE"). In some embodiments, the cap layer 412 is a polymeric material composed of polypropylene ("PP"). In some embodiments, the cap layer 412 is a polymeric material composed of polyester (polyethylene terephthalate). In some embodiments, the cap layer 412 is a polymeric material composed of polyethylene terephthalate ("PET"). In some embodiments, the cap layer 412 is a polymeric material composed of ethylene tetrafluoroethylene ("ETFE"). In some embodiments, the cap layer 412 is a polymeric material composed of an acrylic such as polymethyl methacrylate ("PMMA"). In some embodiments, the cap layer 412 is a polymeric material composed of polyvinyl chloride (PVC). In some embodiments, the cap layer 412 is a polymeric material composed of ethylene propylene diene monomer (EPDM) rubber. In some embodiments, the cap layer 412 is a polymeric material composed of recycled rubber. In some embodiments, the cap layer 412 is a polymeric material composed of modified bitumen. In some embodiments, the cap layer 412 is a polymeric material composed of asphalt. In some embodiments, the cap layer 412 is an asphaltic layer. In some embodiments, the cap layer 412 is an asphaltic membrane. In some embodiments, the cap layer 412 is a polymeric material composed of a non-asphalt (NAS) roofing material. In some embodiments, the cap layer 412 includes a flame retardant additive. In some embodiments, the flame retardant additive may be clays, nanoclays, silicas, carbon black, metal hydroxides such as aluminum hydroxide and aluminum trihydroxide (ATH), metal foils, graphite, and combinations thereof. In some embodiments, the cap layer 412 includes a UV resistant material. In some embodiments, the cap layer 412 includes a UV resistant coating. In some embodiments, the cap layer 412 includes a thermal stabilizer. In some embodiments, the cap layer 412 is composed of a water-resistant material.

In some embodiments, the roofing shingle 410 is textured. In some embodiments, the roofing shingle 410 is textured to impart an appearance of a traditional asphalt roofing shingle. In some embodiments, the cap layer 412 includes a first surface 416. In some embodiments, the first surface 416 of the cap layer 412 is textured. In some embodiments, the first surface 416 of the cap layer 412 is textured by embossing. In some embodiments, the first surface 416 of the cap layer 412 is textured by molding. In some embodiments, the first surface 416 of the cap layer 412 is textured by etching. In some embodiments, the first surface 416 of the cap layer 412 is textured by laser surface texturing. In some embodiments, the first surface 416 includes a plurality of indentations. In some embodiments, the plurality of indentations includes a plurality of channels. In some embodiments, the plurality of channels is formed in a pattern. In some embodiments, each of the plurality of channels is random in size, shape and location. In some embodiments, the first surface 416 includes a matte surface texture. In some embodiments, the first surface 416 includes a glossy surface.

In an embodiment, the cap layer 412 includes a matte surface texture. In some embodiments, the cap layer 412 includes a matte film. In some embodiments, the matte film includes matte ETFE. In another embodiment, the matte film includes a coated film. In some embodiments, the cap layer 412 includes a smooth surface. In some embodiments, the cap layer 412 includes a glossy material, such as a shiny film, gloss patterned glass, or a gloss non-patterned glass. In some embodiments, the roofing shingle 410 having a textured cap layer 412 is an element of the system including a plurality of the roofing shingles 410, in which adjacent roofing shingles 410 have textured surfaces that are patterned differently from one another, thereby imparting a random-seeming appearance to the system.

In some embodiments, the cap layer 412 has a thickness of 10 mil to 50 mil. In some embodiments, the cap layer 412 has a thickness of 10 mil to 45 mil. In some embodiments, the cap layer 412 has a thickness of 10 mil to 40 mil. In some embodiments, the cap layer 412 has a thickness of 10 mil to 35 mil. In some embodiments, the cap layer 412 has a thickness of 10 mil to 30 mil. In some embodiments, the cap layer 412 has a thickness of 10 mil to 25 mil. In some embodiments, the cap layer 412 has a thickness of 10 mil to 20 mil. In some embodiments, the cap layer 412 has a thickness of 10 mil to 15 mil. In some embodiments, the cap layer 412 has a thickness of 15 mil to 50 mil. In some embodiments, the cap layer 412 has a thickness of 15 mil to 45 mil. In some embodiments, the cap layer 412 has a thickness of 15 mil to 40 mil. In some embodiments, the cap layer 412 has a thickness of 15 mil to 35 mil. In some embodiments, the cap layer 412 has a thickness of 15 mil to 30 mil. In some embodiments, the cap layer 412 has a thickness of 15 mil to 25 mil. In some embodiments, the cap layer 412 has a thickness of 15 mil to 20 mil. In some embodiments, the cap layer 412 has a thickness of 20 mil to 50 mil. In some embodiments, the cap layer 412 has a thickness of 20 mil to 45 mil. In some embodiments, the cap layer 412 has a thickness of 20 mil to 40 mil. In some embodiments, the cap layer 412 has a thickness of 20 mil to 35 mil. In some embodiments, the cap layer 412 has a thickness of 20 mil to 30 mil. In some embodiments, the cap layer 412 has a thickness of 20 mil to 25 mil. In some embodiments, the cap layer 412 has a thickness of 25 mil to 50 mil. In some embodiments, the cap layer 412 has a thickness of 25 mil to 45 mil. In some embodiments, the cap layer 412 has a thickness of 25 mil to 40 mil. In some embodiments, the cap layer 412 has a thickness of 25 mil to 35 mil. In some embodiments, the cap layer 412 has a thickness of 25 mil to 30 mil. In some embodiments, the cap layer 412 has a thickness of 30 mil to 50 mil. In some embodiments, the cap layer 412 has a thickness of 30 mil to 45 mil. In some embodiments, the cap layer 412 has a thickness of 30 mil to 40 mil. In some embodiments, the cap layer 412 has a thickness of 30 mil to 35 mil. In some embodiments, the cap layer 412 has a thickness of 35 mil to 50 mil. In some embodiments, the cap layer 412 has a thickness of 35 mil to 45 mil. In some embodiments, the cap layer 412 has a thickness of 35 mil to 40 mil. In some embodiments, the cap layer 412 has a thickness of 40 mil to 50 mil. In some embodiments, the cap layer 412 has a thickness of 40 mil to 45 mil. In some embodiments, the cap layer 412 has a thickness of 45 mil to 50 mil. In some embodiments, the cap layer 412 has a thickness of 10 mil. In some embodiments, the cap layer 412 has a thickness of 15 mil. In some embodiments, the cap layer 412 has a thickness of 20 mil. In some embodiments, the cap layer 412 has a thickness of 25 mil. In some embodiments, the cap layer 412 has a thickness of 30 mil. In some embodiments, the cap layer 412 has a thickness of 35 mil. In some embodiments, the cap layer 412 has a thickness of 40 mil. In some embodiments, the cap layer 412 has a thickness of 45 mil. In some embodiments, the cap layer 412 has a thickness of 50 mil.

Still referring to FIGS. 10 through 12, in some embodiments, the core layer 414 includes a first layer 418, a second layer 420, and a third layer 422. In some embodiments, the third layer 422 is between the first layer 418 and the second layer 420.

In some embodiments, the first layer 418 is composed of a continuous fiber thermoplastic composite tape (CFT). In some embodiments, the first layer 418 is composed of a polypropylene (PP) continuous fiber, unidirectional reinforced thermoplastic composite tape (CFT). In some embodiments, the first layer 418 is composed of a polyethylene terephthalate (PET) continuous fiber, unidirectional reinforced thermoplastic composite tape (CFT). In some embodiments, the first layer 418 is composed of a polyamide (PA) continuous fiber, unidirectional reinforced thermoplastic composite tape (CFT). In some embodiments, the "continuous fiber thermoplastic composite tape (CFT)" may be produced by one or more of the illustrated processes (the following are mere examples and are not meant to be limiting): i) fabrics woven by continuous reinforcement fibers are periodically stacked with thermoplastic films one by one and the stacked layers are pressed while heated in order to produce composite plates; ii) spreading continuous reinforcement fibers in a thermoplastic film or tape has been also investigated; and/or iii) continuous reinforcement fibers (CRF) can be commingled (e.g. air jetting) together with thermoplastic filaments.

In some embodiments, the composite tape (CFT) is composed of 40% to 80% glass fiber by weight. In some embodiments, the composite tape (CFT) is composed of 40% to 70% glass fiber by weight. In some embodiments, the composite tape (CFT) is composed of 40% to 60% glass fiber by weight. In some embodiments, the composite tape (CFT) is composed of 40% to 50% glass fiber by weight. In some embodiments, the composite tape (CFT) is composed of 50% to 80% glass fiber by weight. In some embodiments, the composite tape (CFT) is composed of 50% to 70% glass fiber by weight. In some embodiments, the composite tape (CFT) is composed of 50% to 60% glass fiber by weight. In some embodiments, the composite tape (CFT) is composed of 60% to 80% glass fiber by weight. In some embodiments, the composite tape (CFT) is composed of 60% to 70% glass fiber by weight. In some embodiments, the composite tape (CFT) is composed of 70% to 80% glass fiber by weight. In some embodiments, the composite tape (CFT) is composed of 40% glass fiber by weight. In some embodiments, the composite tape (CFT) is composed of 50% glass fiber by weight. In some embodiments, the composite tape (CFT) is composed of 60% glass fiber by weight. In some embodiments, the composite tape (CFT) is composed of 70% glass fiber by weight. In some embodiments, the composite tape (CFT) is composed of 80% glass fiber by weight.

In some embodiments, the composite tape (CFT) is composed of glass. In some embodiments, the composite tape (CFT) is composed of carbon fibers. In some embodiments, the composite tape (CFT) is composed of natural fibers. In some embodiments, the composite tape (CFT) is composed of structural fibers. In some embodiments, the first layer 418 is composed of a glass filled stiffening material. In some embodiments, the first layer 418 is composed of a glass filled polymer.

In some embodiments, the first layer 418 has a thickness of 4 mil to 15 mil. In some embodiments, the first layer 418 has a thickness of 4 mil to 14 mil. In some embodiments, the first layer 418 has a thickness of 4 mil to 13 mil. In some embodiments, the first layer 418 has a thickness of 4 mil to 412 mil. In some embodiments, the first layer 418 has a thickness of 4 mil to 11 mil. In some embodiments, the first layer 418 has a thickness of 4 mil to 10 mil. In some embodiments, the first layer 418 has a thickness of 4 mil to 9 mil. In some embodiments, the first layer 418 has a thickness of 4 mil to 8 mil. In some embodiments, the first layer 418 has a thickness of 4 mil to 7 mil. In some embodiments, the first layer 418 has a thickness of 4 mil to 6 mil. In some embodiments, the first layer 418 has a thickness of 4 mil to 5 mil. In some embodiments, the first layer 418 has a thickness of 5 mil to 15 mil. In some embodiments, the first layer 418 has a thickness of 5 mil to 14 mil. In some embodiments, the first layer 418 has a thickness of 5 mil to 13 mil. In some embodiments, the first layer 418 has a thickness of 5 mil to 412 mil. In some embodiments, the first layer 418 has a thickness of 5 mil to 11 mil. In some embodiments, the first layer 418 has a thickness of 5 mil to 10 mil. In some embodiments, the first layer 418 has a thickness of 5 mil to 9 mil. In some embodiments, the first layer 418 has a thickness of 5 mil to 8 mil. In some embodiments, the first layer 418 has a thickness of 5 mil to 7 mil. In some embodiments, the first layer 418 has a thickness of 5 mil to 6 mil.

In some embodiments, the first layer 418 has a thickness of 6 mil to 15 mil. In some embodiments, the first layer 418 has a thickness of 6 mil to 14 mil. In some embodiments, the first layer 418 has a thickness of 6 mil to 13 mil. In some embodiments, the first layer 418 has a thickness of 6 mil to 412 mil. In some embodiments, the first layer 418 has a thickness of 6 mil to 11 mil. In some embodiments, the first layer 418 has a thickness of 6 mil to 10 mil. In some embodiments, the first layer 418 has a thickness of 6 mil to 9 mil. In some embodiments, the first layer 418 has a thickness of 6 mil to 8 mil. In some embodiments, the first layer 418 has a thickness of 6 mil to 7 mil. In some embodiments, the first layer 418 has a thickness of 7 mil to 15 mil. In some embodiments, the first layer 418 has a thickness of 7 mil to 14 mil. In some embodiments, the first layer 418 has a thickness of 7 mil to 13 mil. In some embodiments, the first layer 418 has a thickness of 7 mil to 412 mil. In some embodiments, the first layer 418 has a thickness of 7 mil to 11 mil. In some embodiments, the first layer 418 has a thickness of 7 mil to 10 mil. In some embodiments, the first layer 418 has a thickness of 7 mil to 9 mil. In some embodiments, the first layer 418 has a thickness of 7 mil to 8 mil.

In some embodiments, the first layer 418 has a thickness of 8 mil to 15 mil. In some embodiments, the first layer 418 has a thickness of 8 mil to 14 mil. In some embodiments, the first layer 418 has a thickness of 8 mil to 13 mil. In some embodiments, the first layer 418 has a thickness of 8 mil to 412 mil. In some embodiments, the first layer 418 has a thickness of 8 mil to 11 mil. In some embodiments, the first layer 418 has a thickness of 8 mil to 10 mil. In some embodiments, the first layer 418 has a thickness of 8 mil to 9 mil. In some embodiments, the first layer 418 has a thickness of 9 mil to 15 mil. In some embodiments, the first layer 418 has a thickness of 9 mil to 14 mil. In some embodiments, the first layer 418 has a thickness of 9 mil to 13 mil. In some embodiments, the first layer 418 has a thickness of 9 mil to 412 mil. In some embodiments, the first layer 418 has a thickness of 9 mil to 11 mil. In some embodiments, the first layer 418 has a thickness of 9 mil to 10 mil. In some embodiments, the first layer 418 has a thickness of 10 mil to 15 mil. In some embodiments, the first layer 418 has a thickness of 10 mil to 14 mil. In some embodiments, the first layer 418 has a thickness of 10 mil to 13 mil. In some embodiments, the first layer 418 has a thickness of 10 mil to 412 mil. In some embodiments, the first layer 418 has a thickness of 10 mil to 11 mil.

In some embodiments, the first layer 418 has a thickness of 11 mil to 15 mil. In some embodiments, the first layer 418 has a thickness of 11 mil to 14 mil. In some embodiments, the first layer 418 has a thickness of 11 mil to 13 mil. In some embodiments, the first layer 418 has a thickness of 11 mil to 412 mil. In some embodiments, the first layer 418 has a thickness of 412 mil to 15 mil. In some embodiments, the first layer 418 has a thickness of 412 mil to 14 mil. In some embodiments, the first layer 418 has a thickness of 412 mil to 13 mil. In some embodiments, the first layer 418 has a thickness of 13 mil to 15 mil. In some embodiments, the first layer 418 has a thickness of 13 mil to 14 mil. In some embodiments, the first layer 418 has a thickness of 14 mil to 15 mil. In some embodiments, the first layer 418 has a thickness of 8 mil. In some embodiments, the first layer 418 has a thickness of 9 mil. In some embodiments, the first layer 418 has a thickness of 10 mil. In some embodiments, the first layer 418 has a thickness of 11 mil. In some embodiments, the first layer 418 has a thickness of 412 mil. In some embodiments, the first layer 418 has a thickness of 13 mil. In some embodiments, the first layer 418 has a thickness of 14 mil. In some embodiments, the first layer 418 has a thickness of 15 mil.

In some embodiments, the second layer 420 has a structure, size and composition similar to those of the first layer 418 as described above. In some embodiments, a thickness of the second layer 420 is equal to the thickness of the first layer 418. In some embodiments, a thickness of the second layer 420 is substantially similar to the thickness of the first layer 418. In some embodiments, a thickness of the second layer 420 is different than the thickness of the first layer 418.

In some embodiments, the third layer 422 is composed of a polymeric material. In some embodiments, the third layer 422 is a polymeric material composed of thermoplastic polyolefin (TPO). In some embodiments, the third layer 422 is a polymeric material composed of a single ply TPO roofing membrane. In other embodiments, non-limiting examples of TPO membranes are disclosed in U.S. Pat. No. 9,359,014 to Yang et al., which is incorporated by reference herein in its entirety. In some embodiments, the third layer 422 is a polymeric material composed of polyethylene ("PE"). In some embodiments, the third layer 422 is a polymeric material composed of polypropylene ("PP"). In some embodiments, the third layer 422 is a polymeric material composed of polyester (polyethylene terephthalate). In some embodiments, the third layer 422 is a polymeric material composed of polyethylene terephthalate ("PET"). In some embodiments, the third layer 422 is a polymeric material composed of ethylene tetrafluoroethylene ("ETFE"). In some embodiments, the third layer 422 is a polymeric material composed of an acrylic such as polymethyl methacrylate ("PMMA"). In some embodiments, the third layer 422 is a polymeric material composed of polyvinyl chloride (PVC). In some embodiments, the third layer 422 is a polymeric material composed of ethylene propylene diene monomer (EPDM) rubber. In some embodiments, the third layer 422 is a polymeric material composed of recycled rubber. In some embodiments, the third layer 422 is a polymeric material composed of modified bitumen. In some embodiments, the third layer 422 is a polymeric material composed of asphalt. In some embodiments, the third layer 422 is a polymeric material composed of a non-asphalt (NAS) roofing material. In some embodiments, the third layer 422 includes a flame retardant additive. In some embodiments, the flame retardant additive may be clays, nanoclays, silicas, carbon black, metal hydroxides such as aluminum hydroxide and aluminum trihydroxide (ATH), metal foils, graphite, and combinations thereof.

In some embodiments, the cap layer 412 includes a flame retardant additive and the core layer 414 includes a flame retardant additive. In some embodiments, the third layer 422 includes a flame retardant additive. In some embodiments, the cap layer 412 includes more flame retardant additive that that of the core layer 414. In some embodiments, the cap layer 412 is inherently flame retardant. In some embodiments, the core layer 414 is inherently flame retardant.

In some embodiments, the core layer 414 includes a thermal stabilizer. In some embodiments, the third layer 422 includes a thermal stabilizer. In some embodiments, the cap layer 412 includes an amount of a thermal stabilizer that is more than that of the core layer 414.

In some embodiments, the third layer 422 is composed of a water-resistant material. In some embodiments, the roofing shingle 410 is a watershedding layer when installed on a roof deck.

In some embodiments, the third layer 422 has a thickness of 20 mil to 100 mil. In some embodiments, the third layer 422 has a thickness of 20 mil to 90 mil. In some embodiments, the third layer 422 has a thickness of 20 mil to 80 mil. In some embodiments, the third layer 422 has a thickness of 20 mil to 70 mil. In some embodiments, the third layer 422 has a thickness of 20 mil to 60 mil. In some embodiments, the third layer 422 has a thickness of 20 mil to 50 mil. In some embodiments, the third layer 422 has a thickness of 20 mil to 40 mil. In some embodiments, the third layer 422 has a thickness of 20 mil to 30 mil. In some embodiments, the third layer 422 has a thickness of 30 mil to 100 mil. In some embodiments, the third layer 422 has a thickness of 30 mil to 90 mil. In some embodiments, the third layer 422 has a thickness of 30 mil to 80 mil. In some embodiments, the third layer 422 has a thickness of 30 mil to 70 mil. In some embodiments, the third layer 422 has a thickness of 30 mil to 60 mil. In some embodiments, the third layer 422 has a thickness of 30 mil to 50 mil. In some embodiments, the third layer 422 has a thickness of 30 mil to 40 mil. In some embodiments, the third layer 422 has a thickness of 40 mil to 100 mil. In some embodiments, the third layer 422 has a thickness of 40 mil to 90 mil. In some embodiments, the third layer 422 has a thickness of 40 mil to 80 mil. In some embodiments, the third layer 422 has a thickness of 40 mil to 70 mil. In some embodiments, the third layer 422 has a thickness of 40 mil to 60 mil. In some embodiments, the third layer 422 has a thickness of 40 mil to 50 mil. In some embodiments, the third layer 422 has a thickness of 50 mil to 100 mil. In some embodiments, the third layer 422 has a thickness of 50 mil to 90 mil. In some embodiments, the third layer 422 has a thickness of 50 mil to 80 mil. In some embodiments, the third layer 422 has a thickness of 50 mil to 70 mil. In some embodiments, the third layer 422 has a thickness of 50 mil to 60 mil. In some embodiments, the third layer 422 has a thickness of 60 mil to 100 mil. In some embodiments, the third layer 422 has a thickness of 60 mil to 90 mil. In some embodiments, the third layer 422 has a thickness of 60 mil to 80 mil. In some embodiments, the third layer 422 has a thickness of 60 mil to 70 mil. In some embodiments, the third layer 422 has a thickness of 70 mil to 100 mil. In some embodiments, the third layer 422 has a thickness of 70 mil to 90 mil. In some embodiments, the third layer 422 has a thickness of 70 mil to 80 mil. In some embodiments, the third layer 422 has a thickness of 80 mil to 100 mil. In some embodiments, the third layer 422 has a thickness of 80 mil to 90 mil. In some embodiments, the third layer 422 has a thickness of 90 mil to 100 mil.

In some embodiments, the third layer 422 has a thickness of 20 mil. In some embodiments, the third layer 422 has a thickness of 30 mil. In some embodiments, the third layer 422 has a thickness of 40 mil. In some embodiments, the third layer 422 has a thickness of 50 mil. In some embodiments, the third layer 422 has a thickness of 60 mil. In some embodiments, the third layer 422 has a thickness of 70 mil. In some embodiments, the third layer 422 has a thickness of 80 mil. In some embodiments, the third layer 422 has a thickness of 90 mil. In some embodiments, the third layer 422 has a thickness of 100 mil.

In some embodiments, the thickness of the third layer 422 is greater than a combined thickness of the first layer 418, the second layer 420, and the cap layer 412. In some embodiments, the roofing shingle 410 has a thickness of 35 mil to 200 mil. In some embodiments, the roofing shingle 410 has a thickness of 35 mil to 175 mil. In some embodiments, the roofing shingle 410 has a thickness of 35 mil to 150 mil. In some embodiments, the roofing shingle 410 has a thickness of 35 mil to 125 mil. In some embodiments, the roofing shingle 410 has a thickness of 35 mil to 100 mil. In some embodiments, the roofing shingle 410 has a thickness of 35 mil to 75 mil. In some embodiments, the roofing shingle 410 has a thickness of 35 mil to 50 mil. In some embodiments, the roofing shingle 410 has a thickness of 50 mil to 200 mil. In some embodiments, the roofing shingle 410 has a thickness of 50 mil to 175 mil. In some embodiments, the roofing shingle 410 has a thickness of 50 mil to 150 mil. In some embodiments, the roofing shingle 410 has a thickness of 50 mil to 125 mil. In some embodiments, the roofing shingle 410 has a thickness of 50 mil to 100 mil. In some embodiments, the roofing shingle 410 has a thickness of 50 mil to 75 mil. In some embodiments, the roofing shingle 410 has a thickness of 75 mil to 200 mil. In some embodiments, the roofing shingle 410 has a thickness of 75 mil to 175 mil. In some embodiments, the roofing shingle 410 has a thickness of 75 mil to 150 mil. In some embodiments, the roofing shingle 410 has a thickness of 75 mil to 125 mil. In some embodiments, the roofing shingle 410 has a thickness of 75 mil to 100 mil. In some embodiments, the roofing shingle 410 has a thickness of 100 mil to 200 mil. In some embodiments, the roofing shingle 410 has a thickness of 100 mil to 175 mil. In some embodiments, the roofing shingle 410 has a thickness of 100 mil to 150 mil. In some embodiments, the roofing shingle 410 has a thickness of 100 mil to 125 mil. In some embodiments, the roofing shingle 410 has a thickness of 125 mil to 200 mil. In some embodiments, the roofing shingle 410 has a thickness of 125 mil to 175 mil. In some embodiments, the roofing shingle 410 has a thickness of 125 mil to 150 mil. In some embodiments, the roofing shingle 410 has a thickness of 150 mil to 200 mil. In some embodiments, the roofing shingle 410 has a thickness of 150 mil to 175 mil. In some embodiments, the roofing shingle 410 has a thickness of 175 mil to 200 mil. In some embodiments, the roofing shingle 410 has a thickness of 35 mil. In some embodiments, the roofing shingle 410 has a thickness of 50 mil. In some embodiments, the roofing shingle 410 has a thickness of 75 mil. In some embodiments, the roofing shingle 410 has a thickness of 100 mil. In some embodiments, the roofing shingle 410 has a thickness of 125 mil. In some embodiments, the roofing shingle 410 has a thickness of 150 mil. In some embodiments, the roofing shingle 410 has a thickness of 175 mil. In some embodiments, the roofing shingle 410 has a thickness of 200 mil.

In some embodiments, the fibers F of the composite tape (CFT) of the first layer 418 extend in a first direction. In some embodiments, the fibers F of the composite tape (CFT) of the second layer 420 extend in the first direction. In some embodiments, the first direction extends along a longitudinal axis A-A of the roofing shingle in a "0 direction," (i.e., along the length L), as shown in FIG. 12. In some embodiments, the configuration of the fibers of the composite tape (CFT) of the first layer 418 and the fibers of the composite tape (CFT) of the second layer 420 reduce buckling of the roofing shingle 410 in the 0 direction stiffens the roofing shingle 410 and reduces bending thereof from manual handling by a user.

In some embodiments, the roofing shingle 410 includes a flexural modulus that is higher than a flexural modulus of a roofing shingle in which the core layer 414 includes only the third layer 422 and does not include the first layer 418 and the second layer 420. In some embodiments, the roofing shingle 410 includes a coefficient of thermal expansion (CTE) that is lower than a coefficient of thermal expansion (CTE) of a roofing shingle in which the core layer 414 includes only the third layer 422 and does not include the first layer 418 and the second layer 420. In some embodiments, the composite tape (CFT) of the first layer 418 and the composite tape (CFT) of the second layer 420 is configured to adjust the flexural rigidity of the roofing shingle 410 is specific directions, tensile stiffness in specific directions, the coefficient of thermal expansion (CTE) in specific directions, and the time/stress/temperature properties of creep and shrinkage.

In some embodiments, the configuration of the fibers of the composite tape (CFT) of the first layer 418 extending in the first direction (0 direction) and the fibers of the composite tape (CFT) of the second layer 420 extending in the first direction (0 direction) reduce buckling of the roofing shingle 410. As used herein, the term "buckling" means to bend or a change in shape (deformation) under a load or force, and, with respect to the roofing shingle 410, a change in shape or mechanical stability under a load or force, including under thermal expansion loads.

In some embodiments, buckling of the roofing shingle 410 is reduced by reduction of the coefficient of thermal expansion (CTE) difference to reduce the thermal expansion load, resulting in the roofing shingle 410 less likely to reach a critical stress to buckling (ac) as calculated in the below formula:

$$\sigma_{cr} = \frac{P_{cr}}{A} = S_y - \left(\frac{S_y}{2\pi}\frac{KL}{r}\right)^2 \left(\frac{1}{E}\right)$$

In some embodiments, buckling of the roofing shingle 410 is reduced by decreasing the thickness of the third layer 422, but maintaining the radius of gyration ("r", which is proportional to the flexural stiffness) will increase ac, and reduce buckling. In some embodiments, buckling of the roofing shingle 410 is reduced by increasing the radius of gyration (r).

In some embodiments, each of the first layer 418 and the second layer 420 has a coefficient of thermal expansion (CTE) of 5 micrometers per meter Kelvin ("μm/(m*K)") to 15 μm/(m*K) and a modulus of 5 GPa to 20 GPa. In some embodiments, the third layer 422 has a coefficient of thermal expansion (CTE) of 300 μm/(m*K) to 400 μm/(m*K). In some embodiments, the effective coefficient of thermal expansion (CTE) of the roofing shingle 410 is 15 μm/(m*K) to 30 μm/(m*K).

In some embodiments, the effective radius of gyration (r) is increased by using a composite material in the core layer 414. In some embodiments, the radius of gyration for the roofing shingle 410 is calculated as:

$$r = \sqrt{\frac{I}{A}}$$

where the area moment of inertia, I, is expressed as an equivalent based upon the composite materials. In some embodiments, $E_{composite}$ is the flexural modulus of the composite, and $I_{composite}$ can be calculated by assuming the rigidity of the two laminates is equivalent:

$$I_{composite} = \frac{E_{polymer}}{E_{composite}} I_{polymer}$$

In some embodiments, increasing the modulus of the composite by adding the CFT tape increases the radius of gyration (r), which reduces buckling.

Referring to FIGS. 10 and 11, as a non-limiting example of some embodiments, the roofing shingle 410 is brought to a temperature of 0° C. and heating up the roofing shingle 410 to above 60° C., a result of which no significant buckling occurs.

In some embodiments, the CFT tape of the first layer 418 and the second layer 420 reduces wind uplift. In some embodiments, the roofing shingle 410 has a wind resistance that conforms to standards under ASTM D3462 test standards. In some embodiments, the roofing shingle 410 includes a Class A rating when tested in accordance with ASTM D3462.

In some embodiments, the fibers F of the composite tape (CFT) of a first layer 418 extend in a second direction. In some embodiments, the fibers F of the composite tape (CFT) of the second layer 420 extend in the second direction. In some embodiments, the second direction extends transverse of the longitudinal axis A-A of the roofing shingle in a "90 direction," (i.e., along the length W). In some embodiments, the configuration of the fibers of the composite tape (CFT) of the first layer 418 extending in the second direction and the fibers of the composite tape (CFT) of the second layer 420 extending in the second direction stiffens the roofing shingle 410 and reduces bending thereof from step loads.

In another embodiment, the core layer 414 is a colored layer. In another embodiment, the core layer 414 includes a black color. In some embodiments, the color of the core layer 414 includes a mixture of colors. In some embodiments, the core layer 414 includes an infrared reflective pigment. In some embodiments, the cap layer 412 includes a colorant or pigment and the core layer 414 includes a colorant or pigment. In some embodiments, the cap layer 412 includes more colorant or pigment that that of the core layer 414. In some embodiments, the core layer 414 does not include any colorant or pigment.

In some embodiments, the roofing shingle 410 is configured to be a component of a photovoltaic system that includes a fire resistance that conforms to standards under UL 790/ASTM E 108 test standards. In some embodiments, the roofing shingle 410 includes a Class A rating when tested in accordance with UL 790/ASTM E 108.

In some embodiments, the roofing shingle 410 is cuttable. In some embodiments, the roofing shingle 410 is cuttable to a desired size and shape. As used herein, the term "cuttable" means capable of being cut or penetrated with or as if with by an edged instrument, and with respect to certain embodiments of the roofing shingle 410, the roofing shingle 410 is capable of being cut or penetrated by an edged instrument such as a cutting knife, scissors, razor, or other suitable roofing shingle cutting instruments and tools. In some embodiments, the roofing shingle 410 is configured to be installed on the roof deck. In some embodiments, the roofing shingle 410 is configured to be installed on non-solar roof planes of the roof deck. In some embodiments, the roof deck is steep slope roof deck. As defined herein, a "steep slope roof deck" is any roof deck that is disposed on a roof having a pitch of Y/X, where Y and X are in a ratio of 4:12 to 12:12, where Y corresponds to the "rise" of the roof, and where X corresponds to the "run" of the roof. In some embodiments, the roofing shingle 410 is configured to be installed either partially or fully around an array of photovoltaic modules. In some embodiments, the roofing shingle 410 is cuttable to a size and shape for positioning around obstacles, such as vents, chimneys, antennas, and other roofing structures. In some embodiments, the roofing shingle 410 cuttable to a size and shape to extend to roofing eaves and ridges.

In some embodiments, the cap layer 412 and the core layer 414 are laminated. In some embodiments, the cap layer 412 and the first layer 418, the second layer 420, and the third layer 422 of the core layer 414 are laminated simultaneously. In some embodiments, the first layer 418, the second layer 420, and the third layer 422 of the core layer 414 are first laminated with one another, and subsequently the core layer 414, including the laminated ones of the first layer 418, the second layer 420, and the third layer 422, is laminated with the cap layer 412.

In some embodiments, the cap layer 412 is extruded. In some embodiments, the first layer 418 is extruded. In some embodiments, the second layer 420 is extruded. In some embodiments, the third layer 422 is extruded. In some embodiments, the cap layer 412 is extruded separately from the first layer 418. In some embodiments, the cap layer 412 is extruded separately from the second layer 420. In some embodiments, the cap layer 412 is extruded separately from the third layer 422. In some embodiments, the third layer 422 is extruded separately from the first layer 418. In some embodiments, the third layer 422 is extruded separately from the second layer 420. In some embodiment, any combination of the layers are extruded together.

In some embodiments, the cap layer 412 does not include a scrim. In some embodiments, the core layer 414 does not include a scrim.

In some embodiments, the roofing shingle 410 includes a headlap portion 424. In some embodiments, the headlap portion 424 extends from a first end 426 of the roofing shingle 410 to a second end 428 opposite the first end 426. In some embodiments, at least a portion of a reveal portion 430 of one of the roofing shingles 410 overlays at least a portion of the headlap portion 424 of another of the roofing shingles 410. In some embodiments, the roofing shingle 410 includes at least one side lap 432. In some embodiments, the at least one side lap 432 is located at the first end 426. In some embodiments, the at least one side lap 432 is located at the second end 428. In some embodiments, the at least one side lap 432 includes a first side lap 432 located at the first end 426 and a second side lap 432 located at the second end 428. In some embodiments, the at least one side lap 432 of one of the roofing shingles 410 overlays the at least one side lap 432 of another of the roofing shingles 410. In some embodiments, the roofing shingle 410 is a watershedding layer when installed on a roof deck.

In some embodiments, the roofing shingle 410 includes a backsheet 434. In some embodiments, the backsheet 434 is juxtaposed with the core layer 414. In some embodiments, the backsheet 434 is juxtaposed with the second layer 420. In some embodiments, the backsheet 434 is juxtaposed with the lower most layer of the core layer 414. In some embodiments, the cap layer 412 and the core layer 414 are laminated with the backsheet 434 simultaneously. In some embodiments, the cap layer 412 and the core layer 414 are laminated to one another, and then are laminated to the backsheet 434. In some embodiments, the headlap portion 424 and the at least one side lap 432 are formed by the backsheet 434. In some embodiments, the roofing shingle 410 does not include headlap portion 424 and the at least one side lap 432. In some embodiments, the roofing shingle 410 does not include the at least one side lap 432. In some embodiments, the roofing shingle 410 does not include the headlap portion 424.

In some embodiments, the backsheet 434 includes a structure and composition similar to those of the third layer 422, as described above. In some embodiments, the backsheet 434 is composed of a polymeric material. In some embodiments, the backsheet 434 is a polymeric material composed of thermoplastic polyolefin (TPO). In some embodiments, the backsheet 434 is composed of a single ply TPO roofing membrane. In other embodiments, non-limiting examples of TPO membranes are disclosed in U.S. Pat. No. 9,359,014 to Yang et al., which is incorporated by reference herein in its entirety. In some embodiments, the backsheet 434 is a polymeric material composed of polyethylene ("PE"). In some embodiments, the backsheet 434 is a polymeric material composed of polypropylene ("PP"). In some embodiments, the backsheet 434 is a polymeric material composed of polyester (polyethylene terephthalate). In some embodiments, the backsheet 434 is a polymeric material composed of polyethylene terephthalate ("PET"). In some embodiments, the backsheet 434 is a polymeric material composed of ethylene tetrafluoroethylene ("ETFE"). In some embodiments, the backsheet 434 is a polymeric material composed of an acrylic such as polymethyl methacrylate ("PMMA"). In some embodiments, the backsheet 434 is a polymeric material composed of polyvinyl chloride (PVC). In some embodiments, the backsheet 434 is a polymeric material composed of ethylene propylene diene monomer (EPDM) rubber. In some embodiments, the backsheet 434 is a polymeric material composed of recycled rubber. In some embodiments, the backsheet 434 is a polymeric material composed of modified bitumen. In some embodiments, the backsheet 434 is a polymeric material composed of asphalt. In some embodiments, the backsheet 434 is an asphaltic layer. In some embodiments, the backsheet 434 is an asphaltic membrane. In some embodiments, the backsheet 434 is a polymeric material composed of a non-asphalt (NAS) roofing material. In some embodiments, the backsheet 434 includes a flame retardant additive. In some embodiments, the flame retardant additive may be clays, nanoclays, silicas, carbon black, metal hydroxides such as aluminum hydroxide and aluminum trihydroxide (ATH), metal foils, graphite, and combinations thereof. In some embodiments, the backsheet 434 includes a UV resistant material. In some embodiments, the backsheet 434 includes a UV resistant coating. In some embodiments, the backsheet 434 includes a thermal stabilizer. In some embodiments, the backsheet 434 is composed of a water-resistant material.

In some embodiments, the roofing shingle 410 does not include the backsheet 434. In some embodiments, the headlap portion 424 and the at least one side lap 432 are formed by the third layer 422. In some embodiments, a length of the third layer 422 is greater than a length of the first layer 418. In some embodiments, a length of the third layer 422 is greater than a length of the second layer 420. In some embodiments, a length of the third layer 422 is greater than a length of the cap layer 412. In some embodiments, a width of the third layer 422 is greater than a width of the first layer 418. In some embodiments, a width of the third layer 422 is greater than a width of the second layer 420. In some embodiments, a width of the third layer 422 is greater than a width of the cap layer 412.

In some embodiments, the roofing shingle 410 is nailable. In some embodiments, the roofing shingle 410 is nailable to a roof deck. In some embodiments, the roofing shingle 410 is configured to receive at least one fastener within a nailing zone 435 for installing the roofing shingle 410 to a roof deck. In some embodiments, the roofing shingle 410 is configured to receive the at least one fastener 437 through the first surface 416 of the first layer 418 and through the cap layer 412 within the nailing zone 435. In some embodiments, the at least one fastener 437 includes a plurality of fasteners. In some embodiments, the fasteners 437 are roofing nails, rivets, staples, or screws. In other embodiments, the roofing shingle 410 is attached to a roof deck by an adhesive.

In some embodiments, a pattern 450 is printed on a first surface 416 of the cap layer 412. In some embodiments, the pattern 450 includes a pattern or depiction of solar cells 452 printed on the first surface 416 of the cap layer 412. In some embodiments, the pattern 450 including the depiction of solar cells 452 includes a depiction of a plurality of solar cell fingers. In some embodiments, the pattern 450 is printed on the first surface 416 of the cap layer 412 by ink jet printing. In some embodiments, the pattern 450 is printed on the first surface 416 of the cap layer 412 by laser printing. In some embodiments, the pattern 450 is printed on the first surface 416 of the cap layer 412 by lithography. In some embodiments, the pattern 450 is printed on the first surface 416 of the cap layer 412 by offset printing. In some embodiments, the pattern 450 is printed on the first surface 416 of the cap layer 412 by screen printing. In some embodiments, the pattern 450 is printed on the first surface 416 of the cap layer 412 by digital printing. In another embodiment, the cap layer 412 is painted. In another embodiment, the cap layer 412 is a colored layer. In another embodiment, the cap layer 412 includes a black color. In some embodiments, the color of the cap layer 412 includes a mixture of colors. In some embodiments, the cap layer 412 includes an infrared reflective pigment. In some embodiments, the infrared reflective pigment includes graphene. In some embodiments, the roofing shingle 410 meets standards of California Building Energy Efficiency Standards of Residential and Nonresidential Buildings, Title 24, Part 6.

Figure 13:
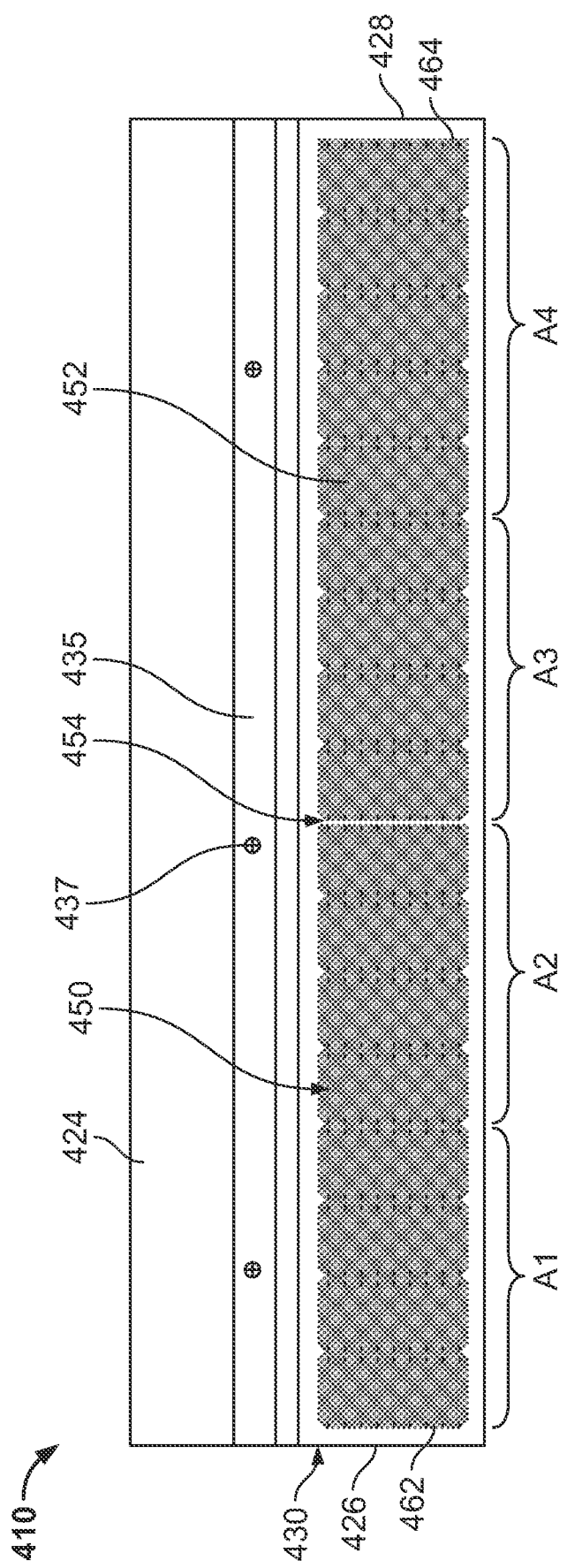
FIG. 13 is a top plan view of some embodiments of an upper layer of the roofing shingle shown in FIG. 11, with the roofing shingle including a pattern.
Figure 14:
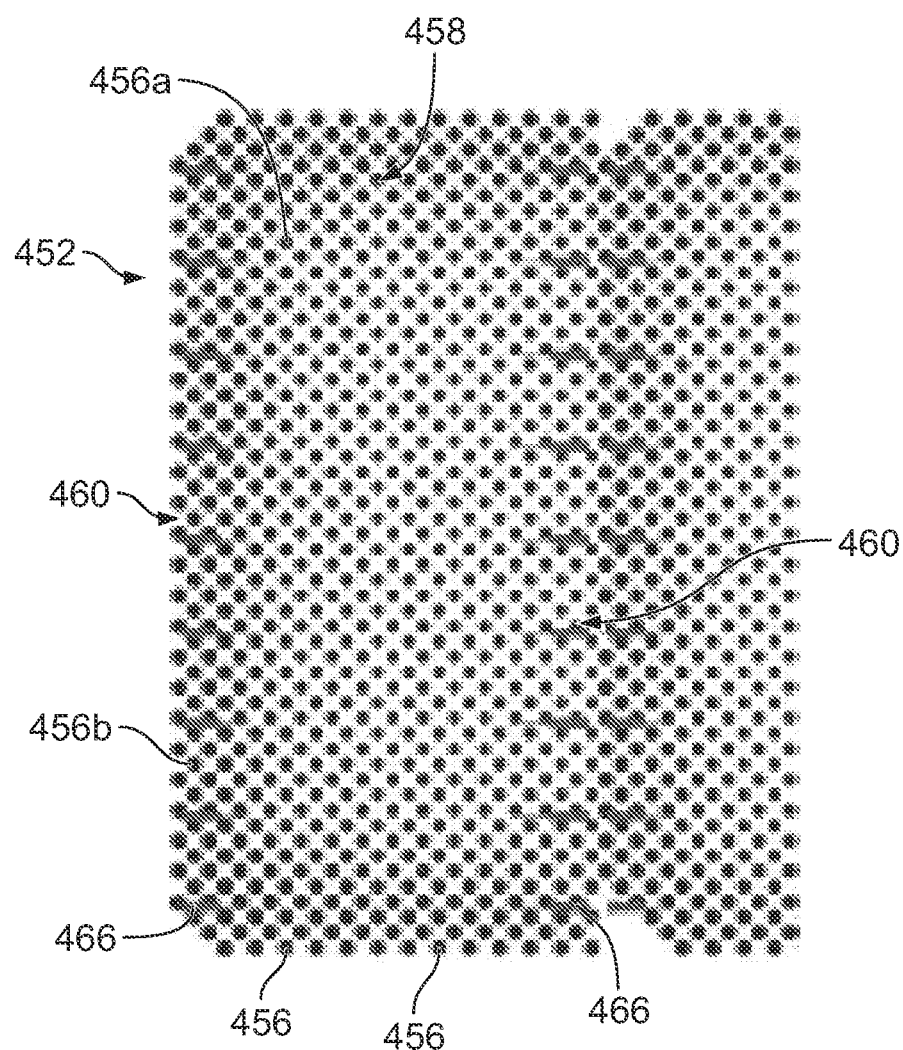
FIG. 14 illustrates a portion of the pattern shown in FIG. 13.

Referring to FIGS. 13 and 14, in some embodiments, the pattern 450 including the depiction of solar cells 452 includes a depiction of at least one solar cell. In some embodiments, the pattern or depiction of solar cells 452 includes a depiction of at least two solar cells. In some embodiments, the pattern or depiction of solar cells 452 includes a depiction of at least three solar cells. In some embodiments, the pattern or depiction of solar cells 452 includes a depiction of at least four solar cells. In some embodiments, the pattern or depiction of solar cells 452 includes a depiction of at least five solar cells. In some embodiments, the pattern or depiction of solar cells 452 includes a depiction of at least six solar cells. In some embodiments, the pattern or depiction of solar cells 452 includes a depiction of at least seven solar cells. In some embodiments, the pattern or depiction of solar cells 452 includes a depiction of at least eight solar cells. In some embodiments, the pattern or depiction of solar cells 452 includes a depiction of at least nine solar cells. In some embodiments, the pattern or depiction of solar cells 452 includes a depiction of at least ten solar cells. In some embodiments, the pattern or depiction of solar cells 452 includes a depiction of at least eleven solar cells. In some embodiments, the pattern or depiction of solar cells 452 includes a depiction of at least twelve solar cells. In some embodiments, the pattern or depiction of solar cells 452 includes a depiction of at least thirteen solar cells. In some embodiments, the pattern or depiction of solar cells 452 includes a depiction of at least fourteen solar cells. In some embodiments, the pattern or depiction of solar cells 452 includes a depiction of at least fifteen solar cells. In some embodiments, the pattern or depiction of solar cells 452 includes a depiction of at least sixteen solar cells. In some embodiments, the pattern or depiction of solar cells 452 includes a depiction of at least seventeen solar cells. In some embodiments, the pattern or depiction of solar cells 452 includes a depiction of at least eighteen solar cells. In some embodiments, the pattern or depiction of solar cells 452 includes a depiction of at least nineteen solar cells. In some embodiments, the pattern or depiction of solar cells 452 includes a depiction of at least twenty solar cells. In some embodiments, the pattern or depiction of solar cells 452 includes a depiction of more than twenty solar cells.

In some embodiments, each of the cells of the depiction of solar cells 452 is square in shape. In some embodiments, each of the cells of the depiction of solar cells 452 is rectangular in shape. In some embodiments, each of the cells of the depiction of solar cells 452 has a rounded rectangle shape. In some embodiments, each of the cells of the depiction of solar cells 452 is oval in shape. In some embodiments, each of the cells of the depiction of solar cells 452 is elliptical in shape. In some embodiments, each of the cells of the depiction of solar cells 452 is oblong in shape. In some embodiments, each of the cells of the depiction of solar cells 452 is depicted as one half of a width of a corresponding wholly depicted solar cell. In some embodiments, each of the cells of the depiction of solar cells 452 is depicted as substantially one half of a width of a corresponding wholly depicted solar cell. In some embodiments, each of the cells of the depiction of solar cells 452 is depicted as one quarter of a width of a corresponding wholly depicted solar cell. In some embodiments, each of the cells of the depiction of solar cells 452 is depicted as three-quarters of a width of a corresponding wholly depicted solar cell.

In some embodiments, the pattern or depiction of solar cells 452 includes at least two groups or sections of depictions of solar cells. In some embodiments, the at least two groups of depictions of solar cells are separated by at least one space 454 between a corresponding one of the at least two groups. In some embodiments, each group includes a depiction of at least one solar cell. In some embodiments, each group includes a depiction of at least two solar cells. In some embodiments, each group includes a depiction of at least three solar cells. In some embodiments, each group includes a depiction of at least four solar cells. In some embodiments, each group includes a depiction of at least five solar cells. In some embodiments, each group includes a depiction of at least six solar cells. In some embodiments, each group includes a depiction of at least seven solar cells. In some embodiments, each group includes a depiction of at least eight solar cells. In some embodiments, each group includes a depiction of at least nine solar cells. In some embodiments, each group includes a depiction of at least ten solar cells.

In some embodiments, the pattern 450 is a dither pattern. In some embodiments, the pattern 450 is a halftone pattern. In some embodiments, the term "halftone" as used herein means an image or reproduction of an image in which various tones of gray or color are produced by variously sized dots of ink or colorant. In some embodiments, each depiction of solar cell 452 includes a plurality of dots 456. In some embodiments, each depiction of solar cell 452 includes a first, center portion 458. In some embodiments, the center portion 458 includes a first plurality 456a of the dots 456. In some embodiments, each depiction of solar cell 452 includes at least one edge portion 460. In some embodiments, the at least one edge portion 460 includes a second plurality 456b of the dots 456. In some embodiments, the at least one edge portion 460 is a lateral edge. In some embodiments, the at least one edge portion 460 includes a plurality of edge portions 460. In some embodiments, the plurality of edge portions 460 includes two of the edge portions 460. In some embodiments, the two edge portions 460 are opposed to one another on opposite sides of the depiction of solar cell 452. In some embodiments, the plurality of edge portions 460 includes three of the edge portions 460. In some embodiments, the plurality of edge portions 460 includes four of the edge portions 460.

Still referring to FIGS. 13 and 14, in some embodiments, each of the first plurality 456a of the dots 456 has a diameter of 2.5 mm. In some embodiments, each of a majority of the first plurality 456a of the dots 456 has a diameter of 2.5 mm. In some embodiments, each of a substantial amount of the first plurality 456a of the dots 456 has a diameter of 2.5 mm. In some embodiments, each of the second plurality 456b of the dots 456 has a diameter of 3 mm. In some embodiments, each of a majority of the second plurality 456b of the dots 456 has a diameter of 3 mm. In some embodiments, each of a substantial amount of the second plurality 456b of the dots 456 has a diameter of 3 mm.

Referring to FIG. 15A, in some embodiments, each of the first plurality 456a of the dots 456 has a diameter of 3 mm. In some embodiments, each of a majority of the first plurality 456a of the dots 456 has a diameter of 3 mm. In some embodiments, each of a substantial amount of the first plurality 456a of the dots 456 has a diameter of 3 mm. In some embodiments, each of the second plurality 456b of the dots 456 has a diameter of 3 mm. In some embodiments, each of a majority of the second plurality 456b of the dots 456 has a diameter of 3 mm. In some embodiments, each of a substantial amount of the second plurality 456b of the dots 456 has a diameter of 3 mm.

Referring to FIG. 15B, in some embodiments, each of the first plurality 456a of the dots 456 has a diameter of 2 mm. In some embodiments, each of a majority of the first plurality 456a of the dots 456 has a diameter of 2 mm. In some embodiments, each of a substantial amount of the first plurality 456a of the dots 456 has a diameter of 2 mm. In some embodiments, each of the second plurality 456b of the dots 456 has a diameter of 3 mm. In some embodiments, each of a majority of the second plurality 456b of the dots 456 has a diameter of 3 mm. In some embodiments, each of a substantial amount of the second plurality 456b of the dots 456 has a diameter of 3 mm.

Referring to FIG. 15C, in some embodiments, each of the first plurality 456a of the dots 456 has a diameter of 2.5 mm. In some embodiments, each of a majority of the first plurality 456a of the dots 456 has a diameter of 2.5 mm. In some embodiments, each of a substantial amount of the first plurality 456a of the dots 456 has a diameter of 2.5 mm. In some embodiments, each of the second plurality 456b of the dots 456 has a diameter of 4 mm. In some embodiments, each of a majority of the second plurality 456b of the dots 456 has a diameter of 4 mm. In some embodiments, each of a substantial amount of the second plurality 456b of the dots 456 has a diameter of 4 mm.

Referring to FIG. 15D, in some embodiments, each of the first plurality 456a of the dots 456 has a diameter of 3 mm. In some embodiments, each of a majority of the first plurality 456a of the dots 456 has a diameter of 3 mm. In some embodiments, each of a substantial amount of the first plurality 456a of the dots 456 has a diameter of 3 mm. In some embodiments, each of the second plurality 456b of the dots 456 has a diameter of 4 mm. In some embodiments, each of a majority of the second plurality 456b of the dots 456 has a diameter of 4 mm. In some embodiments, each of a substantial amount of the second plurality 456b of the dots 456 has a diameter of 4 mm.

Referring to FIG. 15E, in some embodiments, each of the first plurality 456a of the dots 456 has a diameter of 3.5 mm. In some embodiments, each of the first plurality 456a of a majority of the dots 456 has a diameter of 3.5 mm. In some embodiments, each of a substantial amount of the first plurality 456a of the dots 456 has a diameter of 3.5 mm. In some embodiments, each of the second plurality 456b of the dots 456 has a diameter of 4 mm. In some embodiments, each of a majority of the second plurality 456b of the dots 456 has a diameter of 4 mm. In some embodiments, each of a substantial amount of the second plurality 456b of the dots 456 has a diameter of 4 mm.

In some embodiments, each of the first plurality 456a of the dots 456 has a diameter of 1 mm to 5 mm. In some embodiments, each of the first plurality 456a of the dots 456 has a diameter of 1 mm to 4.5 mm. In some embodiments, each of the first plurality 456a of the dots 456 has a diameter of 1 mm to 4 mm. In some embodiments, each of the first plurality 456a of the dots 456 has a diameter of 1 mm to 3.5 mm. In some embodiments, each of the first plurality 456a of the dots 456 has a diameter of 1 mm to 3 mm. In some embodiments, each of the first plurality 456a of the dots 456 has a diameter of 1 mm to 2.5 mm. In some embodiments, each of the first plurality 456a of the dots 456 has a diameter of 1 mm to 2 mm. In some embodiments, each of the first plurality 456a of the dots 456 has a diameter of 1 mm to 1.5 mm. In some embodiments, each of the first plurality 456a of the dots 456 has a diameter of 1.5 mm to 5 mm. In some embodiments, each of the first plurality 456a of the dots 456 has a diameter of 1.5 mm to 4.5 mm. In some embodiments, each of the first plurality 456a of the dots 456 has a diameter of 1.5 mm to 4 mm. In some embodiments, each of the first plurality 456a of the dots 456 has a diameter of 1.5 mm to 3.5 mm. In some embodiments, each of the first plurality 456a of the dots 456 has a diameter of 1.5 mm to 3 mm. In some embodiments, each of the first plurality 456a of the dots 456 has a diameter of 1.5 mm to 2.5 mm. In some embodiments, each of the first plurality 456a of the dots 456 has a diameter of 1.5 mm to 2 mm. In some embodiments, each of the first plurality 456a of the dots 456 has a diameter of 2 mm to 5 mm. In some embodiments, each of the first plurality 456a of the dots 456 has a diameter of 2 mm to 4.5 mm. In some embodiments, each of the first plurality 456a of the dots 456 has a diameter of 2 mm to 4 mm. In some embodiments, each of the first plurality 456a of the dots 456 has a diameter of 2 mm to 3.5 mm. In some embodiments, each of the first plurality 456a of the dots 456 has a diameter of 2 mm to 3 mm. In some embodiments, each of the first plurality 456a of the dots 456 has a diameter of 2 mm to 2.5 mm. In some embodiments, each of the first plurality 456a of the dots 456 has a diameter of 2.5 mm to 5 mm. In some embodiments, each of the first plurality 456a of the dots 456 has a diameter of 2.5 mm to 4.5 mm. In some embodiments, each of the first plurality 456a of the dots 456 has a diameter of 2.5 mm to 4 mm. In some embodiments, each of the first plurality 456a of the dots 456 has a diameter of 2.5 mm to 3.5 mm. In some embodiments, each of the first plurality 456a of the dots 456 has a diameter of 2.5 mm to 3 mm. In some embodiments, each of the first plurality 456a of the dots 456 has a diameter of 3 mm to 5 mm. In some embodiments, each of the first plurality 456a of the dots 456 has a diameter of 3 mm to 4.5 mm. In some embodiments, each of the first plurality 456a of the dots 456 has a diameter of 3 mm to 4 mm. In some embodiments, each of the first plurality 456a of the dots 456 has a diameter of 3 mm to 3.5 mm. In some embodiments, each of the first plurality 456a of the dots 456 has a diameter of 3.5 mm to 5 mm. In some embodiments, each of the first plurality 456a of the dots 456 has a diameter of 3.5 mm to 4.5 mm. In some embodiments, each of the first plurality 456a of the dots 456 has a diameter of 3.5 mm to 4 mm. In some embodiments, each of the first plurality 456a of the dots 456 has a diameter of 4 mm to 5 mm. In some embodiments, each of the first plurality 456a of the dots 456 has a diameter of 4 mm to 4.5 mm. In some embodiments, each of the first plurality 456a of the dots 456 has a diameter of 4.5 mm to 5 mm.

In some embodiments, each of the first plurality 456a of the dots 456 has a diameter of 1 mm. In some embodiments, each of the first plurality 456a of the dots 456 has a diameter of 1.5 mm. In some embodiments, each of the first plurality 456a of the dots 456 has a diameter of 2 mm. In some embodiments, each of the first plurality 456a of the dots 456 has a diameter of 2.5 mm. In some embodiments, each of the first plurality 456a of the dots 456 has a diameter of 3 mm. In some embodiments, each of the first plurality 456a of the dots 456 has a diameter of 3.5 mm. In some embodiments, each of the first plurality 456a of the dots 456 has a diameter of 4 mm. In some embodiments, each of the first plurality 456a of the dots 456 has a diameter of 4.5 mm. In some embodiments, each of the first plurality 456a of the dots 456 has a diameter of 5 mm. In some embodiments, each of a majority of the first plurality 456a of the dots 456 has a diameter in the ranges as described above. In some embodiments, each of a substantial amount of the first plurality 456a of the dots 456 has a diameter in the ranges as described above.

In some embodiments, each of the second plurality 456b of the dots 456 has a diameter of 1 mm to 5 mm. In some embodiments, each of the second plurality 456b of the dots 456 has a diameter in the ranges as described above for the first plurality 456a of the dots 456. In some embodiments, each of a majority of the second plurality 456b of the dots 456 has a diameter in the ranges as described above for the first plurality 456a of the dots 456. In some embodiments, each of a substantial amount of the second plurality 456b of the dots 456 has a diameter in the ranges as described above for the first plurality 456a of the dots 456.

In some embodiments, the density of the dots 456 of each of the depiction of solar cells 452 is 40 of the dots 456 per square inch to 60 of the dots 456 per square inch. In some embodiments, the density of the dots 456 of each of the depiction of solar cells 452 is 40 of the dots 456 per square inch to 55 of the dots 456 per square inch. In some embodiments, the density of the dots 456 of each of the depiction of solar cells 452 is 40 of the dots 456 per square inch to 50 of the dots 456 per square inch. In some embodiments, the density of the dots 456 of each of the depiction of solar cells 452 is 40 of the dots 456 per square inch to 45 of the dots 456 per square inch. In some embodiments, the density of the dots 456 of each of the depiction of solar cells 452 is 45 of the dots 456 per square inch to 60 of the dots 456 per square inch. In some embodiments, the density of the dots 456 of each of the depiction of solar cells 452 is 45 of the dots 456 per square inch to 55 of the dots 456 per square inch. In some embodiments, the density of the dots 456 of each of the depiction of solar cells 452 is 45 of the dots 456 per square inch to 50 of the dots 456 per square inch. In some embodiments, the density of the dots 456 of each of the depiction of solar cells 452 is 50 of the dots 456 per square inch to 60 of the dots 456 per square inch. In some embodiments, the density of the dots 456 of each of the depiction of solar cells 452 is 50 of the dots 456 per square inch to 55 of the dots 456 per square inch. In some embodiments, the density of the dots 456 of each of the depiction of solar cells 452 is 55 of the dots 456 per square inch to 60 of the dots 456 per square inch. In some embodiments, the density of the dots 456 of each of the depiction of solar cells 452 is 40 of the dots 456 per square inch. In some embodiments, the density of the dots 456 of each of the depiction of solar cells 452 is 45 of the dots 456 per square inch. In some embodiments, the density of the dots 456 of each of the depiction of solar cells 452 is 50 of the dots 456 per square inch. In some embodiments, the density of the dots 456 of each of the depiction of solar cells 452 is 55 of the dots 456 per square inch. In some embodiments, the density of the dots 456 of each of the depiction of solar cells 452 is 60 of the dots 456 per square inch.

In some embodiments, the pattern 450 of the depiction of solar cells 452 is partitioned into a plurality of sections or areas A1, A2, A3, A4. In some embodiments, the plurality of sections includes two of the sections. In some embodiments, the plurality of sections includes three of the sections. In some embodiments, the plurality of sections includes four of the sections A1, A2, A3, A4. In some embodiments, each of the sections A1 through A4 includes a depiction of one solar cell 452. In some embodiments, each of the sections A1 through A4 includes a depiction of two solar cells 452. In some embodiments, each of the sections A1 through A4 includes a depiction of three solar cells 452. In some embodiments, each of the sections A1 through A4 includes a depiction of four solar cells 452. In some embodiments, each of the sections A1 through A4 includes a depiction of five solar cells 452.

In some embodiments, the pattern 450 includes a brightness. In some embodiments, the term "brightness" as used herein means an attribute of light-source colors by which emitted light is ordered continuously from light to dark in correlation with its intensity.

In some embodiments, the brightness of the pattern 450 is 0% to 75%. In some embodiments, the brightness of the pattern 450 is 0% to 50%. In some embodiments, the brightness of the pattern 450 is 0% to 25%. In some embodiments, the brightness of the pattern 450 is 25% to 75%. In some embodiments, the brightness of the pattern 450 is 25% to 50%. In some embodiments, the brightness of the pattern 450 is 50% to 75%. In some embodiments, the brightness of the pattern 450 is 0%. In some embodiments, the brightness of the pattern 450 is 25%. In some embodiments, the brightness of the pattern 450 is 50%. In some embodiments, the brightness of the pattern 450 is 75%.

In some embodiments, the brightness of the pattern 450 increases from a first end 462 of the pattern 450 to a second end 464 of the pattern 450. In some embodiments, the brightness of the pattern 450 gradationally increases from a first end 462 of the pattern 450 to a second end 464 of the pattern 450. In some embodiments, the brightness of the pattern 450 increases from a first end 462 of the pattern 450 to a second end 464 of the pattern 450 by a step change in brightness at one or more selected locations on the roofing shingle 10.

In some embodiments, the brightness of the pattern 450 decreases from a first end 462 of the pattern 450 to a second end 464 of the pattern 450. In some embodiments, the brightness of the pattern 450 gradationally decreases from a first end 462 of the pattern 450 to a second end 464 of the pattern 450. In some embodiments, the brightness of the pattern 450 decreases from a first end 462 of the pattern 450 to a second end 464 of the pattern 450 by a step change in brightness at one or more selected locations on the roofing shingle 10.

In some embodiments, the brightness of the pattern 450 increases from the section A1 to the section A4. In some embodiments, the brightness of the pattern 450 gradationally increases from the section A1 to the section A4. In some embodiments, the brightness of the pattern 450 increases from the section A1 to the section A4 by a step change in brightness at one or more selected locations on the roofing shingle 10. In some embodiments, the brightness of the pattern 450 increases from the section A1 to the section A4 by a step change in brightness at one or more of the sections A1, A2, A3 and A4 on the roofing shingle 10.

In some embodiments, the brightness of the pattern 450 decreases from the section A1 to the section A4. In some embodiments, the brightness of the pattern 450 gradationally decreases from the section A1 to the section A4. In some embodiments, the brightness of the pattern 450 decreases from the section A1 to the section A4 by a step change in brightness at one or more selected locations on the roofing shingle 10. In some embodiments, the brightness of the pattern 450 decreases from the section A1 to the section A4 by a step change in brightness at one or more of the sections A1, A2, A3 and A4 on the roofing shingle 10.

In some embodiments, the brightness of the section A1 is Pantone black. In some embodiments, the brightness of the section A2 is 0.1% to 15%. In some embodiments, the brightness of the section A3 is 15% to 30%. In some embodiments, the brightness of the section A4 is 30% to 75%.

In some embodiments, the brightness of the section A1 is 30% to 75%. In some embodiments, the brightness of the section A2 is 15% to 30%. In some embodiments, the brightness of the section A3 is 0.1% to 15%. In some embodiments, the brightness of the section A4 is Pantone black.

In some embodiments, the pattern 450 includes a chroma. In some embodiments, the term "chroma" as used herein means the quality or purity of a color when combining hue and saturation. In some embodiments, the chroma of the pattern 450 is 0% to 50%. In some embodiments, the chroma of the pattern 450 is 0% to 40%. In some embodiments, the chroma of the pattern 450 is 0% to 30%. In some embodiments, the chroma of the pattern 450 is 0% to 20%. In some embodiments, the chroma of the pattern 450 is 0% to 10%. In some embodiments, the chroma of the pattern 450 is 10% to 50%. In some embodiments, the chroma of the pattern 450 is 10% to 40%. In some embodiments, the chroma of the pattern 450 is 10% to 30%. In some embodiments, the chroma of the pattern 450 is 10% to 20%. In some embodiments, the chroma of the pattern 450 is 20% to 50%. In some embodiments, the chroma of the pattern 450 is 20% to 40%. In some embodiments, the chroma of the pattern 450 is 20% to 30%. In some embodiments, the chroma of the pattern 450 is 30% to 50%. In some embodiments, the chroma of the pattern 450 is 30% to 40%. In some embodiments, the chroma of the pattern 450 is 40% to 50%. In some embodiments, the chroma of the pattern 450 is 0%. In some embodiments, the chroma of the pattern 450 is 10%. In some embodiments, the chroma of the pattern 450 is 20%. In some embodiments, the chroma of the pattern 450 is 30%. In some embodiments, the chroma of the pattern 450 is 40%. In some embodiments, the chroma of the pattern 450 is 50%.

In some embodiments, the chroma of the pattern 450 increases from a first end 462 of the pattern 450 to a second end 464 of the pattern 450. In some embodiments, the chroma of the pattern 450 gradationally increases from a first end 462 of the pattern 450 to a second end 464 of the pattern 450. In some embodiments, the chroma of the pattern 450 increases from a first end 462 of the pattern 450 to a second end 464 of the pattern 450 by a step change in chroma at one or more selected locations on the roofing shingle 10.

In some embodiments, the chroma of the pattern 450 decreases from a first end 462 of the pattern 450 to a second end 464 of the pattern 450. In some embodiments, the chroma of the pattern 450 gradationally decreases from a first end 462 of the pattern 450 to a second end 464 of the pattern 450. In some embodiments, the chroma of the pattern 450 decreases from a first end 462 of the pattern 450 to a second end 464 of the pattern 450 by a step change in chroma at one or more selected locations on the roofing shingle 10.

In some embodiments, the chroma of the pattern 450 increases from the section A1 to the section A4. In some embodiments, the chroma of the pattern 450 gradationally increases from the section A1 to the section A4. In some embodiments, the chroma of the pattern 450 gradationally increases from the section A1 to the section A4 by a step change in chroma at one or more selected locations on the roofing shingle 10. In some embodiments, the chroma of the pattern 450 gradationally increases from the section A1 to the section A4 by a step change in chroma at one or more of the sections A1, A2, A3 and A4 on the roofing shingle 10. In some embodiments, the chroma of the section A1 is Pantone black 6C. In some embodiments, the chroma of the section A2 is 0.1% to 7.5%. In some embodiments, the chroma of the section A3 is 7.5% to 15%. In some embodiments, the chroma of the section A4 is 15% to 30%.

In some embodiments, the chroma of the pattern 450 decreases from the section A1 to the section A4. In some embodiments, the chroma of the pattern 450 gradationally decreases from the section A1 to the section A4. In some embodiments, the chroma of the pattern 450 gradationally decreases from the section A1 to the section A4 by a step change in chroma at one or more selected locations on the roofing shingle 10. In some embodiments, the chroma of the pattern 450 gradationally decreases from the section A1 to the section A4 by a step change in chroma at one or more of the sections A1, A2, A3 and A4 on the roofing shingle 10. In some embodiments, the chroma of the section A1 is 15% to 30%. In some embodiments, the chroma of the section A2 is 7.5% to 15%. In some embodiments, the chroma of the section A3 is 0.1% to 7.5%. In some embodiments, the chroma of the section A4 is Pantone black.

In some embodiments, the pattern 450 includes a black color. In some embodiments, each of the plurality of dots 456 includes a black color. In some embodiments, substantially all of the plurality of dots 456 includes a black color. In some embodiments, a majority of the plurality of dots 456 includes a black color. In some embodiments, some of the plurality of dots 456 includes a black color.

In some embodiments, the pattern 450 includes a blue color. In some embodiments, each of the plurality of dots 456 includes a blue color. In some embodiments, substantially all of the plurality of dots 456 includes a blue color. In some embodiments, a majority of the plurality of dots 456 includes a blue color. In some embodiments, some of the plurality of dots 456 includes a blue color.

In some embodiments, the pattern 450 comprises a metallic ink. In some embodiments, the pattern 450 comprises a metallic paint. In some embodiments, the pattern 450 comprises a holographic film. In some embodiments, the pattern 450 comprises a holographic foil.

In some embodiments, the pattern of dots 456 of at least one of the depiction of solar cells 452 has a CMYK color bracket of [91.68, 78.28, 33.03, 90.15]. In some embodiments, the pattern of dots 456 of at least one of the depiction of solar cells 452 has a CMYK color bracket of [88.94, 76.29, 36.69, 24.37]. In some embodiments, the pattern of dots 456 of at least one of the depiction of solar cells 452 has a CMYK color bracket of [86.70, 74.62, 39.66, 28.39]. In some embodiments, the pattern of dots 456 of at least one of the depiction of solar cells 452 has a CMYK color bracket of [82.20, 72.34, 43.32, 33.48]. In some embodiments, the pattern of dots 456 of at least one of the depiction of solar cells 452 has a CMYK color bracket of [79.41, 69.79, 46.94, 38.07]. In some embodiments, the pattern of dots 456 of at least one of the depiction of solar cells 452 has a CMYK color bracket of [79.57, 69.52, 48.72, 41.63]. In some embodiments, the pattern of dots 456 of at least one of the depiction of solar cells 452 has a CMYK color bracket of [80.09, 70.20, 49.05, 43.16].

In some embodiments, the pattern of dots 456 of at least one of the depiction of solar cells 452 has a CMYK color bracket of [83.40, 72.47, 15.27, 2.37]. In some embodiments, the pattern of dots 456 of at least one of the depiction of solar cells 452 has a CMYK color bracket of [94.04, 85.17, 10.86, 1.50]. In some embodiments, the pattern of dots 456 of at least one of the depiction of solar cells 452 has a CMYK color bracket of [93.70, 83.33, 21.96, 7.83]. In some embodiments, the pattern of dots 456 of at least one of the depiction of solar cells 452 has a CMYK color bracket of [91.68, 78.28, 33.03, 19.64]. In some embodiments, the pattern of dots 456 of at least one of the depiction of solar cells 452 has a CMYK color bracket of [92.54, 78.01, 38.40, 28.33].

In some embodiments, the pattern of dots 456 of each of a plurality of the depiction of solar cells 452 has a CMYK color bracket with the values as described above. In some embodiments, the pattern of dots 456 of all of the plurality of the depiction of solar cells 452 has a CMYK color bracket with the values as described above. In some embodiments, the pattern of dots 456 of substantially all of the plurality of the depiction of solar cells 452 has a CMYK color bracket with the values as described above. In some embodiments, the pattern of dots 456 of a majority of the plurality of the depiction of solar cells 452 has a CMYK color bracket with the values as described above.

In some embodiments, each of the depiction of solar cells 452 includes a plurality of pads 466. In some embodiments, each of the pads 466 may have a structure, size, shape, color, brightness, chroma, shade and/or other feature as those for one or more of the embodiments of the pads 28 described above. In some embodiments, each of the pads 466 may have a color, brightness, chroma, shade and/or other feature as those for one or more of the embodiments of the dots 456 described above.

In some embodiments, the roofing shingle 410 may have a surface that is embossed mechanically. In some embodiments, the mechanically-embossed surface may be embossed by one roller. In some embodiments, the mechanically-embossed surface may be embossed by more than one roller. In some embodiments, the mechanically-embossed surface may be embossed by two rollers. In some embodiments, the mechanically-embossed surface may be embossed by more than two rollers. In some embodiments, the mechanically-embossed surface may be embossed by one or more rollers that are textured. In some embodiments, the mechanically-embossed surface may be embossed by one or more rollers that are textured, and one or more rollers that are untextured (e.g., smooth). In some embodiments, the mechanically-embossed surface may be embossed by one or more rollers that are heated. In some embodiments, the mechanically-embossed surface may be embossed by one or more rollers that are unheated. In some embodiments, the mechanically-embossed surface may be embossed by one or more rollers that are heated, and one or more rollers that are unheated.

In some embodiments, the roofing shingle 410 may have an embossed surface—that is a surface with one or more higher areas, and the surface having one or more lower areas. In some embodiments, the roofing shingle may have an embossed surface with a repeating pattern of higher areas separated from each other by channels. In some embodiments, the higher areas may be diamond shaped. In some embodiments, the higher areas may be square shaped. In some embodiments, the higher areas may be triangle shaped. In some embodiments, the higher areas may be rectangle shaped. In some embodiments, the higher areas may be circle shaped. In some embodiments, the higher areas may be oval shaped. In some embodiments, the higher areas may be another shape. In some embodiments, the lower areas (e.g., channels) may be more than one parallel line. In some embodiments, the lower areas (e.g., channels) may be two sets of parallel lines, which intersect one another.

In some embodiments, the roofing shingle 410 may have a same general visual appearance as a photovoltaic shingle. Accordingly, in some embodiments, one or more of the roofing shingle may be installed on a roof deck on which one or more of the photovoltaic shingles are installed and/or are to be installed.

In some embodiments, the roofing shingle 410 may be installed directly on a roof deck—that is, with no intervening layer between the shingle and the roof deck. In some embodiments, the roofing shingle may be installed with one or more layers intervening between the shingle and the roof deck-such as, for example, a roofing underlayment as an intervening layer.

In some embodiments, the roofing shingle 410 may include a first layer, and a second layer under the first layer. In some embodiments, the first layer may comprise the embossed surface. In some embodiments, the first layer may comprise a thermoplastic polyolefin (TPO). In some embodiments, the first layer may comprise polyvinylchloride (PVC). In some embodiments, the first layer may comprise ethylene propylene diene monomer (EPDM). In some embodiments, the first layer may be configured to be exposed to the environment when the roofing shingle is located on the roof deck.

In some embodiments, the first layer may have a thickness of 10 mil. In some embodiments, the first layer may have a thickness of 20 mil. In some embodiments, the first layer may have a thickness of 25 mil. In some embodiments, the first layer may have a thickness of 30 mil. In some embodiments, the first layer may have a thickness of 40 mil. In some embodiments, the first layer may have a thickness of 50 mil. In some embodiments, the first layer may have a thickness of 60 mil. In some embodiments, the first layer may have a thickness of 70 mil. In some embodiments, the first layer may have a thickness of 75 mil. In some embodiments, the first layer may have a thickness of 80 mil. In some embodiments, the first layer may have a thickness of 90 mil. In some embodiments, the first layer may have a thickness of 100 mil. In some embodiments, the first layer may have a thickness of 110 mil. In some embodiments, the first layer may have a thickness of 10 mil to 110 mil. In some embodiments, the first layer may have a thickness of 10 mil to 100 mil. In some embodiments, the first layer may have a thickness of 10 mil to 90 mil. In some embodiments, the first layer may have a thickness of 10 mil to 80 mil. In some embodiments, the first layer may have a thickness of 10 mil to 75 mil. In some embodiments, the first layer may have a thickness of 10 mil to 70 mil. In some embodiments, the first layer may have a thickness of 10 mil to 60 mil. In some embodiments, the first layer may have a thickness of 10 mil to 50 mil. In some embodiments, the first layer may have a thickness of 10 mil to 40 mil. In some embodiments, the first layer may have a thickness of 10 mil to 30 mil. In some embodiments, the first layer may have a thickness of 10 mil to 25 mil. In some embodiments, the first layer may have a thickness of 10 mil to 20 mil. In some embodiments, the first layer may have a thickness of 20 mil to 110 mil. In some embodiments, the first layer may have a thickness of 20 mil to 100 mil. In some embodiments, the first layer may have a thickness of 20 mil to 90 mil. In some embodiments, the first layer may have a thickness of 20 mil to 80 mil. In some embodiments, the first layer may have a thickness of 20 mil to 75 mil. In some embodiments, the first layer may have a thickness of 20 mil to 70 mil. In some embodiments, the first layer may have a thickness of 20 mil to 60 mil. In some embodiments, the first layer may have a thickness of 20 mil to 50 mil. In some embodiments, the first layer may have a thickness of 20 mil to 40 mil. In some embodiments, the first layer may have a thickness of 20 mil to 30 mil. In some embodiments, the first layer may have a thickness of 20 mil to 25 mil. In some embodiments, the first layer may have a thickness of 25 mil to 110 mil. In some embodiments, the first layer may have a thickness of 25 mil to 100 mil. In some embodiments, the first layer may have a thickness of 25 mil to 90 mil. In some embodiments, the first layer may have a thickness of 25 mil to 80 mil. In some embodiments, the first layer may have a thickness of 25 mil to 75 mil. In some embodiments, the first layer may have a thickness of 25 mil to 70 mil. In some embodiments, the first layer may have a thickness of 25 mil to 60 mil. In some embodiments, the first layer may have a thickness of 25 mil to 50 mil. In some embodiments, the first layer may have a thickness of 25 mil to 40 mil. In some embodiments, the first layer may have a thickness of 25 mil to 30 mil. In some embodiments, the first layer may have a thickness of 30 mil to 110 mil. In some embodiments, the first layer may have a thickness of 30 mil to 100 mil. In some embodiments, the first layer may have a thickness of 30 mil to 90 mil. In some embodiments, the first layer may have a thickness of 30 mil to 80 mil. In some embodiments, the first layer may have a thickness of 30 mil to 75 mil. In some embodiments, the first layer may have a thickness of 30 mil to 70 mil. In some embodiments, the first layer may have a thickness of 30 mil to 60 mil. In some embodiments, the first layer may have a thickness of 30 mil to 50 mil. In some embodiments, the first layer may have a thickness of 30 mil to 40 mil. In some embodiments, the first layer may have a thickness of 40 mil to 110 mil. In some embodiments, the first layer may have a thickness of 40 mil to 100 mil. In some embodiments, the first layer may have a thickness of 40 mil to 90 mil. In some embodiments, the first layer may have a thickness of 40 mil to 80 mil. In some embodiments, the first layer may have a thickness of 40 mil to 75 mil. In some embodiments, the first layer may have a thickness of 40 mil to 70 mil. In some embodiments, the first layer may have a thickness of 40 mil to 60 mil. In some embodiments, the first layer may have a thickness of 40 mil to 50 mil. In some embodiments, the first layer may have a thickness of 50 mil to 110 mil. In some embodiments, the first layer may have a thickness of 50 mil to 100 mil. In some embodiments, the first layer may have a thickness of 50 mil to 90 mil. In some embodiments, the first layer may have a thickness of 50 mil to 80 mil. In some embodiments, the first layer may have a thickness of 50 mil to 75 mil. In some embodiments, the first layer may have a thickness of 50 mil to 70 mil. In some embodiments, the first layer may have a thickness of 50 mil to 60 mil. In some embodiments, the first layer may have a thickness of 60 mil to 110 mil. In some embodiments, the first layer may have a thickness of 60 mil to 100 mil. In some embodiments, the first layer may have a thickness of 60 mil to 90 mil. In some embodiments, the first layer may have a thickness of 60 mil to 80 mil. In some embodiments, the first layer may have a thickness of 60 mil to 75 mil. In some embodiments, the first layer may have a thickness of 60 mil to 70 mil. In some embodiments, the first layer may have a thickness of 70 mil to 110 mil. In some embodiments, the first layer may have a thickness of 70 mil to 100 mil. In some embodiments, the first layer may have a thickness of 70 mil to 90 mil. In some embodiments, the first layer may have a thickness of 70 mil to 80 mil. In some embodiments, the first layer may have a thickness of 70 mil to 75 mil. In some embodiments, the first layer may have a thickness of 80 mil to 110 mil. In some embodiments, the first layer may have a thickness of 80 mil to 100 mil. In some embodiments, the first layer may have a thickness of 80 mil to 90 mil. In some embodiments, the first layer may have a thickness of 90 mil to 100 mil. In some embodiments, the first layer may have a thickness of 90 mil to 110 mil.

In some embodiments, the first layer may have a weight of 580 GSM. In some embodiments, the first layer may have a weight of 644 GSM. In some embodiments, the first layer may have a weight of 1442 GSM. In some embodiments, the first layer may have a weight of 1444 GSM. In some embodiments, the first layer may have a weight of 1968 GSM. In some embodiments, the first layer may have a weight of 2400 GSM. In some embodiments, the first layer may have a weight of 3200 GSM. In some embodiments, the first layer may have a weight of 580 GSM to 1968 GSM. In some embodiments, the first layer may have a weight of less than 580 GSM. In some embodiments, the first layer may have a weight of more than 1968 GSM.

In some embodiments, the second layer may comprise an adhesive. In some embodiments, the second layer may comprise a butyl adhesive. In some embodiments, the butyl adhesive may comprise $CaCO_3$. In some embodiments, the butyl adhesive may comprise MgOH. In some embodiments, the butyl adhesive may comprise MgO. In some embodiments, the butyl adhesive may comprise one, two, three, or none of $CaCO_3$, MgOH, and/or MgO. In some embodiments, the adhesive may be a thermoset. In some embodiments, the adhesive may be a thermoplastic. In some embodiments where there is a release liner under the adhesive, the adhesive may be a thermoplastic.

In some embodiments, the second layer may have a thickness of 15 mil. In some embodiments, the second layer may have a thickness of 16 mil. In some embodiments, the second layer may have a thickness of 17 mil. In some embodiments, the second layer may have a thickness of 18 mil. In some embodiments, the second layer may have a thickness of 19 mil. In some embodiments, the second layer may have a thickness of 20 mil. In some embodiments, the second layer may have a thickness of 21 mil. In some embodiments, the second layer may have a thickness of 22 mil. In some embodiments, the second layer may have a thickness of 23 mil. In some embodiments, the second layer may have a thickness of 24 mil. In some embodiments, the second layer may have a thickness of 25 mil. In some embodiments, the second layer may have a thickness of 26 mil. In some embodiments, the second layer may have a thickness of 27 mil. In some embodiments, the second layer may have a thickness of 28 mil. In some embodiments, the second layer may have a thickness of 29 mil. In some embodiments, the second layer may have a thickness of 30 mil. In some embodiments, the second layer may have a thickness of 15 mil to 30 mil. In some embodiments, the second layer may have a thickness of 15 mil to 29 mil. In some embodiments, the second layer may have a thickness of 15 mil to 28 mil. In some embodiments, the second layer may have a thickness of 15 mil to 27 mil. In some embodiments, the second layer may have a thickness of 15 mil to 26 mil. In some embodiments, the second layer may have a thickness of 15 mil to 25 mil. In some embodiments, the second layer may have a thickness of 15 mil to 24 mil. In some embodiments, the second layer may have a thickness of 15 mil to 23 mil. In some embodiments, the second layer may have a thickness of 15 mil to 22 mil. In some embodiments, the second layer may have a thickness of 15 mil to 21 mil. In some embodiments, the second layer may have a thickness of 15 mil to 20 mil. In some embodiments, the second layer may have a thickness of 15 mil to 19 mil. In some embodiments, the second layer may have a thickness of 15 mil to 18 mil. In some embodiments, the second layer may have a thickness of 15 mil to 17 mil. In some embodiments, the second layer may have a thickness of 15 mil to 16 mil. In some embodiments, the second layer may have a thickness of 16 mil to 30 mil. In some embodiments, the second layer may have a thickness of 16 mil to 29 mil. In some embodiments, the second layer may have a thickness of 16 mil to 28 mil. In some embodiments, the second layer may have a thickness of 16 mil to 27 mil. In some embodiments, the second layer may have a thickness of 16 mil to 26 mil. In some embodiments, the second layer may have a thickness of 16 mil to 25 mil. In some embodiments, the second layer may have a thickness of 16 mil to 24 mil. In some embodiments, the second layer may have a thickness of 16 mil to 23 mil. In some embodiments, the second layer may have a thickness of 16 mil to 22 mil. In some embodiments, the second layer may have a thickness of 16 mil to 21 mil. In some embodiments, the second layer may have a thickness of 16 mil to 20 mil. In some embodiments, the second layer may have a thickness of 16 mil to 19 mil. In some embodiments, the second layer may have a thickness of 16 mil to 18 mil. In some embodiments, the second layer may have a thickness of 16 mil to 17 mil. In some embodiments, the second layer may have a thickness of 17 mil to 30 mil. In some embodiments, the second layer may have a thickness of 17 mil to 29 mil. In some embodiments, the second layer may have a thickness of 17 mil to 28 mil. In some embodiments, the second layer may have a thickness of 17 mil to 27 mil. In some embodiments, the second layer may have a thickness of 17 mil to 26 mil. In some embodiments, the second layer may have a thickness of 17 mil to 25 mil. In some embodiments, the second layer may have a thickness of 17 mil to 24 mil. In some embodiments, the second layer may have a thickness of 17 mil to 23 mil. In some embodiments, the second layer may have a thickness of 17 mil to 22 mil. In some embodiments, the second layer may have a thickness of 17 mil to 21 mil. In some embodiments, the second layer may have a thickness of 17 mil to 20 mil. In some embodiments, the second layer may have a thickness of 17 mil to 19 mil. In some embodiments, the second layer may have a thickness of 17 mil to 18 mil. In some embodiments, the second layer may have a thickness of 18 mil to 30 mil. In some embodiments, the second layer may have a thickness of 18 mil to 29 mil. In some embodiments, the second layer may have a thickness of 18 mil to 28 mil. In some embodiments, the second layer may have a thickness of 18 mil to 27 mil. In some embodiments, the second layer may have a thickness of 18 mil to 26 mil. In some embodiments, the second layer may have a thickness of 18 mil to 25 mil. In some embodiments, the second layer may have a thickness of 18 mil to 24 mil. In some embodiments, the second layer may have a thickness of 18 mil to 23 mil. In some embodiments, the second layer may have a thickness of 18 mil to 22 mil. In some embodiments, the second layer may have a thickness of 18 mil to 21 mil. In some embodiments, the second layer may have a thickness of 18 mil to 20 mil. In some embodiments, the second layer may have a thickness of 18 mil to 19 mil. In some embodiments, the second layer may have a thickness of 19 mil to 30 mil. In some embodiments, the second layer may have a thickness of 19 mil to 29 mil. In some embodiments, the second layer may have a thickness of 19 mil to 28 mil. In some embodiments, the second layer may have a thickness of 19 mil to 27 mil. In some embodiments, the second layer may have a thickness of 19 mil to 26 mil. In some embodiments, the second layer may have a thickness of 19 mil to 25 mil. In some embodiments, the second layer may have a thickness of 19 mil to 24 mil. In some embodiments, the second layer may have a thickness of 19 mil to 23 mil. In some embodiments, the second layer may have a thickness of 19 mil to 22 mil. In some embodiments, the second layer may have a thickness of 19 mil to 21 mil. In some embodiments, the second layer may have a thickness of 19 mil to 20 mil. In some embodiments, the second layer may have a thickness of 20 mil to 30 mil. In some embodiments, the second layer may have a thickness of 20 mil to 29 mil. In some embodiments, the second layer may have a thickness of 20 mil to 28 mil. In some embodiments, the second layer may have a thickness of 20 mil to 27 mil. In some embodiments, the second layer may have a thickness of 20 mil to 26 mil. In some embodiments, the second layer may have a thickness of 20 mil to 25 mil. In some embodiments, the second layer may have a thickness of 20 mil to 24 mil. In some embodiments, the second layer may have a thickness of 20 mil to 23 mil. In some embodiments, the second layer may have a thickness of 20 mil to 22 mil. In some embodiments, the second layer may have a thickness of 20 mil to 21 mil. In some embodiments, the second layer may have a thickness of 21 mil to 30 mil. In some embodiments, the second layer may have a thickness of 21 mil to 29 mil. In some embodiments, the second layer may have a thickness of 21 mil to 28 mil. In some embodiments, the second layer may have a thickness of 21 mil to 27 mil. In some embodiments, the second layer may have a thickness of 21 mil to 26 mil. In some embodiments, the second layer may have a thickness of 21 mil to 25 mil. In some embodiments, the second layer may have a thickness of 21 mil to 24 mil. In some embodiments, the second layer may have a thickness of 21 mil to 23 mil. In some embodiments, the second layer may have a thickness of 21 mil to 22 mil. In some embodiments, the second layer may have a thickness of 22 mil to 30 mil. In some embodiments, the second layer may have a thickness of 22 mil to 29 mil. In some embodiments, the second layer may have a thickness of 22 mil to 28 mil. In some embodiments, the second layer may have a thickness of 22 mil to 27 mil. In some embodiments, the second layer may have a thickness of 22 mil to 26 mil. In some embodiments, the second layer may have a thickness of 22 mil to 25 mil. In some embodiments, the second layer may have a thickness of 22 mil to 24 mil. In some embodiments, the second layer may have a thickness of 22 mil to 23 mil. In some embodiments, the second layer may have a thickness of 23 mil to 30 mil. In some embodiments, the second layer may have a thickness of 23 mil to 29 mil. In some embodiments, the second layer may have a thickness of 23 mil to 28 mil. In some embodiments, the second layer may have a thickness of 23 mil to 27 mil. In some embodiments, the second layer may have a thickness of 23 mil to 26 mil. In some embodiments, the second layer may have a thickness of 23 mil to 25 mil. In some embodiments, the second layer may have a thickness of 23 mil to 24 mil. In some embodiments, the second layer may have a thickness of 24 mil to 30 mil. In some embodiments, the second layer may have a thickness of 24 mil to 29 mil. In some embodiments, the second layer may have a thickness of 24 mil to 28 mil. In some embodiments, the second layer may have a thickness of 24 mil to 27 mil. In some embodiments, the second layer may have a thickness of 24 mil to 26 mil. In some embodiments, the second layer may have a thickness of 24 mil to 25 mil. In some embodiments, the second layer may have a thickness of 25 mil to 30 mil. In some embodiments, the second layer may have a thickness of 25 mil to 29 mil. In some embodiments, the second layer may have a thickness of 25 mil to 28 mil. In some embodiments, the second layer may have a thickness of 25 mil to 27 mil. In some embodiments, the second layer may have a thickness of 25 mil to 26 mil. In some embodiments, the second layer may have a thickness of 26 mil to 30 mil. In some embodiments, the second layer may have a thickness of 26 mil to 29 mil. In some embodiments, the second layer may have a thickness of 26 mil to 28 mil. In some embodiments, the second layer may have a thickness of 26 mil to 27 mil. In some embodiments, the second layer may have a thickness of 27 mil to 30 mil. In some embodiments, the second layer may have a thickness of 27 mil to 29 mil. In some embodiments, the second layer may have a thickness of 27 mil to 28 mil. In some embodiments, the second layer may have a thickness of 28 mil to 30 mil. In some embodiments, the second layer may have a thickness of 28 mil to 29 mil. In some embodiments, the second layer may have a thickness of 29 mil to 30 mil.

In some embodiments, the second layer may have a weight of 200 GSM. In some embodiments, the second layer may have a weight of 725 GSM. In some embodiments, the second layer may have a weight of 1000 GSM. In some embodiments, the second layer may have a weight of 200 GSM to 1000 GSM. In some embodiments, the second layer may have a weight of less than 200 GSM. In some embodiments, the second layer may have a weight of more than 1000 GSM. In some embodiments, the second layer may be configured to adhere the roofing shingle to the roof deck.

In some embodiments, the roofing shingle may further comprise a removable release liner under the second layer.

In some embodiments, the removable release liner may be configured to be removed to expose the second layer. In some embodiments, the release liner may be a silicone release liner. In some embodiments, the exposed second layer may be used to adhere the roofing shingle to a roof deck.

In some embodiments, the silicone release liner may be single sided (that is, with silicone on one side). In some embodiments, the silicone release liner may be double sided (that is, with silicone on both sides). In some embodiments, the silicone release liner may be polypropylene (PP). In some embodiments, the silicone release liner may be polyethylene (PE). In some embodiments, the silicone release liner may be polyethylene terephthalate (PET). In some embodiments, the silicone release liner may be nylon. In some embodiments, the silicone release liner may be paper based. In some embodiments, the silicone release liner may have a weight of 25 GSM. In some embodiments, the silicone release liner may have a weight of 160 GSM. In some embodiments, the silicone release liner may have a weight of 25 GSM to 160 GSM. In some embodiments, the silicone release liner may have a weight of less than 25 GSM. In some embodiments, the silicone release liner may have a weight of more than 160 GSM.

In some embodiments, the roofing shingle may further comprise a third layer under the second layer.

In some embodiments, the third layer may comprise a scrim layer. In some embodiments, the scrim layer may comprise a fiberglass-reinforced scrim layer.

In some embodiments, one or both side of the scrim layer may be coated with a coating. In some embodiments, the second layer may contact a non-coated side of the scrim layer, such as a fiberglass-reinforced scrim layer. In some embodiments, the second layer may contact a coated side of the scrim layer, such as a fiberglass-reinforced scrim layer. In some embodiments, the coating may be one or more of acrylic, ethylene-vinyl acetate (EVA), polyurethane, and/or polyvinylchloride. In some embodiments, the coating may include a color pigment. In some embodiments, the coating may comprise an expandable graphite filler. In some embodiments, a percentage of expandable graphite may be 0% to 70%. In some embodiments, a weight of the coating may be 25 GSM to 220 GSM. In some embodiments, a thickness of the coating may be 1 mil to 30 mil.

In some embodiments, the scrim layer may be configured to be mechanically attached to the roof deck. In some embodiments, a second adhesive layer may be under the third layer. In some embodiments, the second adhesive may comprise a butyl adhesive. In some embodiments, a removable release liner may be under the second adhesive. In some embodiments, the removable release liner may be configured to be removed to expose the second adhesive. In some embodiments, the release liner may be a silicone release liner.

In some embodiments, mechanical attachment may be provided by one or more of at least one nail, screw, staple, and/or other penetrating fastener.

In some embodiments, the fiberglass-reinforced scrim layer may have a thickness of 15 mil. In some embodiments, the fiberglass-reinforced scrim layer may have a thickness of 16 mil. In some embodiments, the fiberglass-reinforced scrim layer may have a thickness of 17 mil. In some embodiments, the fiberglass-reinforced scrim layer may have a thickness of 18 mil. In some embodiments, the fiberglass-reinforced scrim layer may have a thickness of 19 mil. In some embodiments, the fiberglass-reinforced scrim layer may have a thickness of 20 mil. In some embodiments, the fiberglass-reinforced scrim layer may have a thickness of 21 mil. In some embodiments, the fiberglass-reinforced scrim layer may have a thickness of 22 mil. In some embodiments, the fiberglass-reinforced scrim layer may have a thickness of 23 mil. In some embodiments, the fiberglass-reinforced scrim layer may have a thickness of 24 mil. In some embodiments, the fiberglass-reinforced scrim layer may have a thickness of 25 mil. In some embodiments, the fiberglass-reinforced scrim layer may have a thickness of 15 mil to 25 mil. In some embodiments, the fiberglass-reinforced scrim layer may have a thickness of 15 mil to 24 mil. In some embodiments, the fiberglass-reinforced scrim layer may have a thickness of 15 mil to 23 mil. In some embodiments, the fiberglass-reinforced scrim layer may have a thickness of 15 mil to 22 mil. In some embodiments, the fiberglass-reinforced scrim layer may have a thickness of 15 mil to 21 mil. In some embodiments, the fiberglass-reinforced scrim layer may have a thickness of 15 mil to 20 mil. In some embodiments, the fiberglass-reinforced scrim layer may have a thickness of 15 mil to 19 mil. In some embodiments, the fiberglass-reinforced scrim layer may have a thickness of 15 mil to 18 mil. In some embodiments, the fiberglass-reinforced scrim layer may have a thickness of 15 mil to 17 mil. In some embodiments, the fiberglass-reinforced scrim layer may have a thickness of 15 mil to 16 mil. In some embodiments, the fiberglass-reinforced scrim layer may have a thickness of 16 mil to 25 mil. In some embodiments, the fiberglass-reinforced scrim layer may have a thickness of 16 mil to 24 mil. In some embodiments, the fiberglass-reinforced scrim layer may have a thickness of 16 mil to 23 mil. In some embodiments, the fiberglass-reinforced scrim layer may have a thickness of 16 mil to 22 mil. In some embodiments, the fiberglass-reinforced scrim layer may have a thickness of 16 mil to 21 mil. In some embodiments, the fiberglass-reinforced scrim layer may have a thickness of 16 mil to 20 mil. In some embodiments, the fiberglass-reinforced scrim layer may have a thickness of 16 mil to 19 mil. In some embodiments, the fiberglass-reinforced scrim layer may have a thickness of 16 mil to 18 mil. In some embodiments, the fiberglass-reinforced scrim layer may have a thickness of 16 mil to 17 mil. In some embodiments, the fiberglass-reinforced scrim layer may have a thickness of 17 mil to 25 mil. In some embodiments, the fiberglass-reinforced scrim layer may have a thickness of 17 mil to 24 mil. In some embodiments, the fiberglass-reinforced scrim layer may have a thickness of 17 mil to 23 mil. In some embodiments, the fiberglass-reinforced scrim layer may have a thickness of 17 mil to 22 mil. In some embodiments, the fiberglass-reinforced scrim layer may have a thickness of 17 mil to 21 mil. In some embodiments, the fiberglass-reinforced scrim layer may have a thickness of 17 mil to 20 mil. In some embodiments, the fiberglass-reinforced scrim layer may have a thickness of 17 mil to 19 mil. In some embodiments, the fiberglass-reinforced scrim layer may have a thickness of 17 mil to 18 mil. In some embodiments, the fiberglass-reinforced scrim layer may have a thickness of 18 mil to 25 mil. In some embodiments, the fiberglass-reinforced scrim layer may have a thickness of 18 mil to 24 mil. In some embodiments, the fiberglass-reinforced scrim layer may have a thickness of 18 mil to 23 mil. In some embodiments, the fiberglass-reinforced scrim layer may have a thickness of 18 mil to 22 mil. In some embodiments, the fiberglass-reinforced scrim layer may have a thickness of 18 mil to 21 mil. In some embodiments, the fiberglass-reinforced scrim layer may have a thickness of 18 mil to 20 mil. In some embodiments, the fiberglass-reinforced scrim layer may have a thickness of 18 mil to 19 mil. In some embodiments, the fiberglass-reinforced scrim layer may have a thickness of 19 mil to 25 mil. In some embodiments, the fiberglass-reinforced scrim layer may have a thickness of 19 mil to 24 mil. In some embodiments, the fiberglass-reinforced scrim layer may have a thickness of 19 mil to 23 mil. In some embodiments, the fiberglass-reinforced scrim layer may have a thickness of 19 mil to 22 mil. In some embodiments, the fiberglass-reinforced scrim layer may have a thickness of 19 mil to 21 mil. In some embodiments, the fiberglass-reinforced scrim layer may have a thickness of 19 mil to 20 mil. In some embodiments, the fiberglass-reinforced scrim layer may have a thickness of 20 mil to 25 mil. In some embodiments, the fiberglass-reinforced scrim layer may have a thickness of 20 mil to 24 mil. In some embodiments, the fiberglass-reinforced scrim layer may have a thickness of 20 mil to 23 mil. In some embodiments, the fiberglass-reinforced scrim layer may have a thickness of 20 mil to 22 mil. In some embodiments, the fiberglass-reinforced scrim layer may have a thickness of 20 mil to 21 mil. In some embodiments, the fiberglass-reinforced scrim layer may have a thickness of 21 mil to 25 mil. In some embodiments, the fiberglass-reinforced scrim layer may have a thickness of 21 mil to 24 mil. In some embodiments, the fiberglass-reinforced scrim layer may have a thickness of 21 mil to 23 mil. In some embodiments, the fiberglass-reinforced scrim layer may have a thickness of 21 mil to 22 mil. In some embodiments, the fiberglass-reinforced scrim layer may have a thickness of 22 mil to 25 mil. In some embodiments, the fiberglass-reinforced scrim layer may have a thickness of 22 mil to 24 mil. In some embodiments, the fiberglass-reinforced scrim layer may have a thickness of 22 mil to 23 mil. In some embodiments, the fiberglass-reinforced scrim layer may have a thickness of 23 mil to 25 mil. In some embodiments, the fiberglass-reinforced scrim layer may have a thickness of 23 mil to 24 mil. In some embodiments, the fiberglass-reinforced scrim layer may have a thickness of 24 mil to 25 mil.

In some embodiments, a fiberglass-reinforced scrim layer may have a weight of 220 GSM. In some embodiments, a fiberglass-reinforced scrim layer may have a weight of 310 GSM. In some embodiments, a fiberglass-reinforced scrim layer may have a weight of 410 GSM. In some embodiments, a fiberglass-reinforced scrim layer may have a weight of 520 GSM. In some embodiments, a fiberglass-reinforced scrim layer may have a weight of 630 GSM. In some embodiments, a fiberglass-reinforced scrim layer may have a weight of less than 220 GSM. In some embodiments, a fiberglass-reinforced scrim layer may have a weight of greater than 630 GSM. In some embodiments, a fiberglass-reinforced scrim layer may have a thickness of 10 mil and a weight of 220 GSM. In some embodiments, a fiberglass-reinforced scrim layer may have a thickness of 12 mil and a weight of 310 GSM. In some embodiments, a fiberglass-reinforced scrim layer may have a thickness of 16 mil and a weight of 410 GSM. In some embodiments, a fiberglass-reinforced scrim layer may have a thickness of 20 mil and a weight of 520 GSM. In some embodiments, a fiberglass-reinforced scrim layer may have a thickness of 24 mil and a weight of 630 GSM.

In some embodiments, the fiberglass-reinforced scrim layer may have a weight of 52 GSM. In some embodiments, the fiberglass-reinforced scrim layer may have a weight of at least 220 GSM. In some embodiments, the fiberglass-reinforced scrim layer may have a weight of 220 GSM. In some embodiments, the fiberglass-reinforced scrim layer may have a weight of greater than 220 GSM.

In some embodiments, with the roofing shingle with a first TPO layer, a second butyl adhesive layer under the first layer, and a third fiberglass-reinforced scrim layer under the second layer, may have a total thickness of 120 mils.

In some embodiments, the third layer may comprise a fire-retardant layer. In some embodiments, the fire-retardant layer may comprise a fiberglass-reinforced fire-retardant layer. In some embodiments, the fire-retardant layer may be configured to be mechanically attached to the roof deck. In some embodiments, a second adhesive layer may be under the third layer. In some embodiments, the second adhesive may comprise a butyl adhesive. In some embodiments, a removable release liner may be under the second adhesive. In some embodiments, the removable release liner may be configured to be removed to expose the second adhesive. In some embodiments, the release liner may be a silicone release liner.

In some embodiments, the fiberglass-reinforced fire-retardant layer may have a thickness of 25 mil. In some embodiments, the fiberglass-reinforced fire-retardant layer may have a thickness of 26 mil. In some embodiments, the fiberglass-reinforced fire-retardant layer may have a thickness of 27 mil. In some embodiments, the fiberglass-reinforced fire-retardant layer may have a thickness of 28 mil. In some embodiments, the fiberglass-reinforced fire-retardant layer may have a thickness of 29 mil. In some embodiments, the fiberglass-reinforced fire-retardant layer may have a thickness of 30 mil. In some embodiments, the fiberglass-reinforced fire-retardant layer may have a thickness of 31 mil. In some embodiments, the fiberglass-reinforced fire-retardant layer may have a thickness of 32 mil. In some embodiments, the fiberglass-reinforced fire-retardant layer may have a thickness of 33 mil. In some embodiments, the fiberglass-reinforced fire-retardant layer may have a thickness of 34 mil. In some embodiments, the fiberglass-reinforced fire-retardant layer may have a thickness of 35 mil. In some embodiments, the fiberglass-reinforced fire-retardant layer may have a thickness of 25 mil to 35 mil. In some embodiments, the fiberglass-reinforced fire-retardant layer may have a thickness of 25 mil to 34 mil. In some embodiments, the fiberglass-reinforced fire-retardant layer may have a thickness of 25 mil to 33 mil. In some embodiments, the fiberglass-reinforced fire-retardant layer may have a thickness of 25 mil to 32 mil. In some embodiments, the fiberglass-reinforced fire-retardant layer may have a thickness of 25 mil to 31 mil. In some embodiments, the fiberglass-reinforced fire-retardant layer may have a thickness of 25 mil to 30 mil. In some embodiments, the fiberglass-reinforced fire-retardant layer may have a thickness of 25 mil to 29 mil. In some embodiments, the fiberglass-reinforced fire-retardant layer may have a thickness of 25 mil to 28 mil. In some embodiments, the fiberglass-reinforced fire-retardant layer may have a thickness of 25 mil to 27 mil. In some embodiments, the fiberglass-reinforced fire-retardant layer may have a thickness of 25 mil to 26 mil. In some embodiments, the fiberglass-reinforced fire-retardant layer may have a thickness of 26 mil to 35 mil. In some embodiments, the fiberglass-reinforced fire-retardant layer may have a thickness of 26 mil to 34 mil. In some embodiments, the fiberglass-reinforced fire-retardant layer may have a thickness of 26 mil to 33 mil. In some embodiments, the fiberglass-reinforced fire-retardant layer may have a thickness of 26 mil to 32 mil. In some embodiments, the fiberglass-reinforced fire-retardant layer may have a thickness of 26 mil to 31 mil. In some embodiments, the fiberglass-reinforced fire-retardant layer may have a thickness of 26 mil to 30 mil. In some embodiments, the fiberglass-reinforced fire-retardant layer may have a thickness of 26 mil to 29 mil. In some embodiments, the fiberglass-reinforced fire-retardant layer may have a thickness of 26 mil to 28 mil. In some embodiments, the fiberglass-reinforced fire-retardant layer may have a thickness of 26 mil to 27 mil. In some embodiments, the fiberglass-reinforced fire-retardant layer may have a thickness of 27 mil to 35 mil. In some embodiments, the fiberglass-reinforced fire-retardant layer may have a thickness of 27 mil to 34 mil. In some embodiments, the fiberglass-reinforced fire-retardant layer may have a thickness of 27 mil to 33 mil. In some embodiments, the fiberglass-reinforced fire-retardant layer may have a thickness of 27 mil to 32 mil. In some embodiments, the fiberglass-reinforced fire-retardant layer may have a thickness of 27 mil to 31 mil. In some embodiments, the fiberglass-reinforced fire-retardant layer may have a thickness of 27 mil to 30 mil. In some embodiments, the fiberglass-reinforced fire-retardant layer may have a thickness of 27 mil to 29 mil. In some embodiments, the fiberglass-reinforced fire-retardant layer may have a thickness of 27 mil to 28 mil. In some embodiments, the fiberglass-reinforced fire-retardant layer may have a thickness of 28 mil to 35 mil. In some embodiments, the fiberglass-reinforced fire-retardant layer may have a thickness of 28 mil to 34 mil. In some embodiments, the fiberglass-reinforced fire-retardant layer may have a thickness of 28 mil to 33 mil. In some embodiments, the fiberglass-reinforced fire-retardant layer may have a thickness of 28 mil to 32 mil. In some embodiments, the fiberglass-reinforced fire-retardant layer may have a thickness of 28 mil to 31 mil. In some embodiments, the fiberglass-reinforced fire-retardant layer may have a thickness of 28 mil to 30 mil. In some embodiments, the fiberglass-reinforced fire-retardant layer may have a thickness of 28 mil to 29 mil. In some embodiments, the fiberglass-reinforced fire-retardant layer may have a thickness of 29 mil to 35 mil. In some embodiments, the fiberglass-reinforced fire-retardant layer may have a thickness of 29 mil to 34 mil. In some embodiments, the fiberglass-reinforced fire-retardant layer may have a thickness of 29 mil to 33 mil. In some embodiments, the fiberglass-reinforced fire-retardant layer may have a thickness of 29 mil to 32 mil. In some embodiments, the fiberglass-reinforced fire-retardant layer may have a thickness of 29 mil to 31 mil. In some embodiments, the fiberglass-reinforced fire-retardant layer may have a thickness of 29 mil to 30 mil. In some embodiments, the fiberglass-reinforced fire-retardant layer may have a thickness of 30 mil to 35 mil. In some embodiments, the fiberglass-reinforced fire-retardant layer may have a thickness of 30 mil to 34 mil. In some embodiments, the fiberglass-reinforced fire-retardant layer may have a thickness of 30 mil to 33 mil. In some embodiments, the fiberglass-reinforced fire-retardant layer may have a thickness of 30 mil to 32 mil. In some embodiments, the fiberglass-reinforced fire-retardant layer may have a thickness of 30 mil to 31 mil. In some embodiments, the fiberglass-reinforced fire-retardant layer may have a thickness of 31 mil to 35 mil. In some embodiments, the fiberglass-reinforced fire-retardant layer may have a thickness of 31 mil to 34 mil. In some embodiments, the fiberglass-reinforced fire-retardant layer may have a thickness of 31 mil to 33 mil. In some embodiments, the fiberglass-reinforced fire-retardant layer may have a thickness of 31 mil to 32 mil. In some embodiments, the fiberglass-reinforced fire-retardant layer may have a thickness of 32 mil to 35 mil. In some embodiments, the fiberglass-reinforced fire-retardant layer may have a thickness of 32 mil to 34 mil. In some embodiments, the fiberglass-reinforced fire-retardant layer may have a thickness of 32 mil to 33 mil. In some embodiments, the fiberglass-reinforced fire-retardant layer may have a thickness of 33 mil to 35 mil. In some embodiments, the fiberglass-reinforced fire-retardant layer may have a thickness of 33 mil to 34 mil. In some embodiments, the fiberglass-reinforced fire-retardant layer may have a thickness of 34 mil to 35 mil.

In some embodiments, the fiberglass-reinforced fire-retardant layer may have a weight of 87 GSM.

In some embodiments, with the roofing shingle with a first TPO layer, a second butyl adhesive layer under the first layer, and a third fiberglass-reinforced fire-retardant layer under the second layer, may have a total thickness of 130 mils.

In some embodiments, the third layer may comprise a shingle membrane layer. In some embodiments, the shingle membrane may be an asphalt shingle. In some embodiments, the shingle membrane may include granules on a top surface thereof. In some embodiments, shingle membrane layer may be configured to be mechanically attached to the roof deck.

In some embodiments, an adhesive may be used to adhere the shingle membrane to the roof deck. In some embodiments, the adhesive may be a butyl adhesive layer. In some embodiments, a release liner may cover the adhesive, such as the butyl adhesive layer.

In some embodiments, the roofing shingle or embossed membrane, including fiberglass, may have a total thickness of 37 mil. In some embodiments, the roofing shingle or embossed membrane, including fiberglass, may have a total thickness of 240 mil. In some embodiments, the roofing shingle or embossed membrane, including fiberglass, may have a total thickness of between 37 mil to 240 mil.

In some embodiments, the shingle membrane layer may have a thickness of 30 mil. In some embodiments, the shingle membrane layer may have a thickness of 40 mil. In some embodiments, the shingle membrane layer may have a thickness of 45 mil. In some embodiments, the shingle membrane layer may have a thickness of 50 mil. In some embodiments, the shingle membrane layer may have a thickness of 60 mil. In some embodiments, the shingle membrane layer may have a thickness of 63 mil. In some embodiments, the shingle membrane layer may have a thickness of 80 mil. In some embodiments, the shingle membrane layer may have a thickness of 103 mil. In some embodiments, the shingle membrane layer may have a thickness of 104 mil. In some embodiments, the shingle membrane layer may have a thickness of 110 mil. In some embodiments, the shingle membrane layer may have a thickness of 120 mil. In some embodiments, the shingle membrane layer may have a thickness of 130 mil. In some embodiments, the shingle membrane layer may have a thickness of 30 to 110 mil. In some embodiments, when the shingle membrane layer comprises asphalt, the shingle membrane may have a thickness of 40 mil, 50 mil, 63 mil, 80 mil, 103 mil, 104 mil, 120 mil, or 130 mil. In some embodiments, when the shingle membrane layer comprises EPDM, the shingle membrane may have a thickness of 45 mil, 60 mil, or 80 mil. In some embodiments, when the shingle membrane layer comprises PVC, the shingle membrane may have a thickness of 45 mil, 60 mil, or 80 mil.

In some embodiments, the shingle membrane layer may have a weight of 426 GSM.

In some embodiments, with the roofing shingle with a first TPO layer, a second butyl adhesive layer under the first layer, and a third shingle membrane layer under the second layer, may have a total thickness of 206 mils.

In some embodiments, the third layer may comprise a torchable membrane layer. In some embodiments, torchable membrane layer may be configured to be mechanically attached, by melting, to the roof deck.

In some embodiments, the torchable membrane layer may have a thickness of 114 mil.

In some embodiments, the shingle membrane layer may have a weight of 348 GSM.

In some embodiments, with the roofing shingle with a first TPO layer, a second butyl adhesive layer under the first layer, and a third shingle membrane layer under the second layer, may have a total thickness of 216 mils.

In some embodiments, the present invention may include a roofing system, comprising: a roof deck; and an roofing shingle located on the roof deck. In some embodiments, the roofing shingle may comprise any of the roofing shingles described herein.

In some embodiments, the present invention may provide a solar roofing system, comprising: a roof deck; at least one nailable photovoltaic shingle above the roof deck; and an roofing shingle above the roof deck. In some embodiments, the roofing shingle may comprise any of the roofing shingles described herein. In some embodiments, the roofing shingle may be located adjacent the nailable photovoltaic shingle on the roof deck In some embodiments, the present invention may provide an embossed membrane. As used herein, an embossed membrane may be a component that is larger than a shingle; an embossed membrane may or may not be cut to provide shingles; and/or an embossed membrane may be configured to be disposed under another components, such as a shingle, after installation on the roof deck.

In some embodiments, the embossed membrane may comprise: a first layer, and a second layer under the first layer, wherein the first layer comprises an embossed surface, wherein the first layer comprises a thermoplastic polyolefin, wherein the first layer is configured to be exposed to the environment when the roofing shingle is located on a roof deck, and wherein the second layer comprises a first adhesive.

In some embodiments, the first adhesive may comprise a butyl adhesive.

In some embodiments, the embossed membrane may further comprise a removable release liner under the second layer. In some embodiments, the removable release liner may be configured to be removed to expose the first adhesive.

In some embodiments, the embossed membrane may further comprise a scrim layer under the second layer. In some embodiments, the scrim layer may be configured to be mechanically attached to a roof deck. In some embodiments, the embossed membrane may further comprise a second adhesive layer under the scrim layer. In some embodiments, the embossed membrane may further comprise a removable release liner under the second adhesive layer, wherein the removable release liner is configured to be removed to expose the second adhesive layer.

In some embodiments, the embossed membrane may further comprise a fire-retardant layer under the second layer. In some embodiments, the fire-retardant layer may be configured to be mechanically attached to a roof deck. In some embodiments, the embossed membrane may further comprise a second adhesive layer under the fire-retardant layer. In some embodiments, the embossed membrane may further comprise a removable release liner under the second adhesive layer, wherein the removable release liner is configured to be removed to expose the second adhesive layer.

In some embodiments, the embossed membrane may further comprise a shingle membrane layer under the second layer. In some embodiments, the shingle membrane layer may be configured to be mechanically attached to a roof deck.

In some embodiments, the embossed membrane may further comprise a torchable membrane layer under the second layer. In some embodiments, the torchable membrane layer may be configured to be mechanically attached to a roof deck, by melting the torchable membrane layer.

In some embodiments of the invention, any of the disclosed roofing shingles or embossed membranes may be manufactured by various processes.

In some embodiments, a roll of material of the first layer, such as but not limited to a TPO roll, may be embossed at an embossing station. Thus, the following references to a TPO roll may refer to any or all of the disclosed first layers, which are disposed in or on a roll. At the embossing station, any process that provides an embossed or textured top surface may be used. At an adhesive application station, the adhesive, such as the butyl adhesive, may be applied to the embossed TPO. At the adhesive application station, the release liner may be adhered to the TPO roll by the adhesive, or the fiberglass-reinforced fire-retardant layer may be adhered to the embossed TPO roll by the adhesive.

The method may further include, at a second adhesive application station, application of the second adhesive to the fiberglass-reinforced fire-retardant layer. The method may also include application of the release liner, at the second adhesive application station.

In some embodiments, the first layer may be extruded directly on to the third layer—for example, onto the scrim layer, the fire-retardant layer, the shingle membrane layer, and/or the torchable membrane layer. Thus, in some embodiments, the embossed membrane or embossed shingle may omit an adhesive layer underneath the first layer.

In some embodiments, instead of embossing a TPO roll, a TPO extrusion line may form the TPO sheet, and the TPO sheet may be subsequently embossed at the embossing station.

Figure 16:
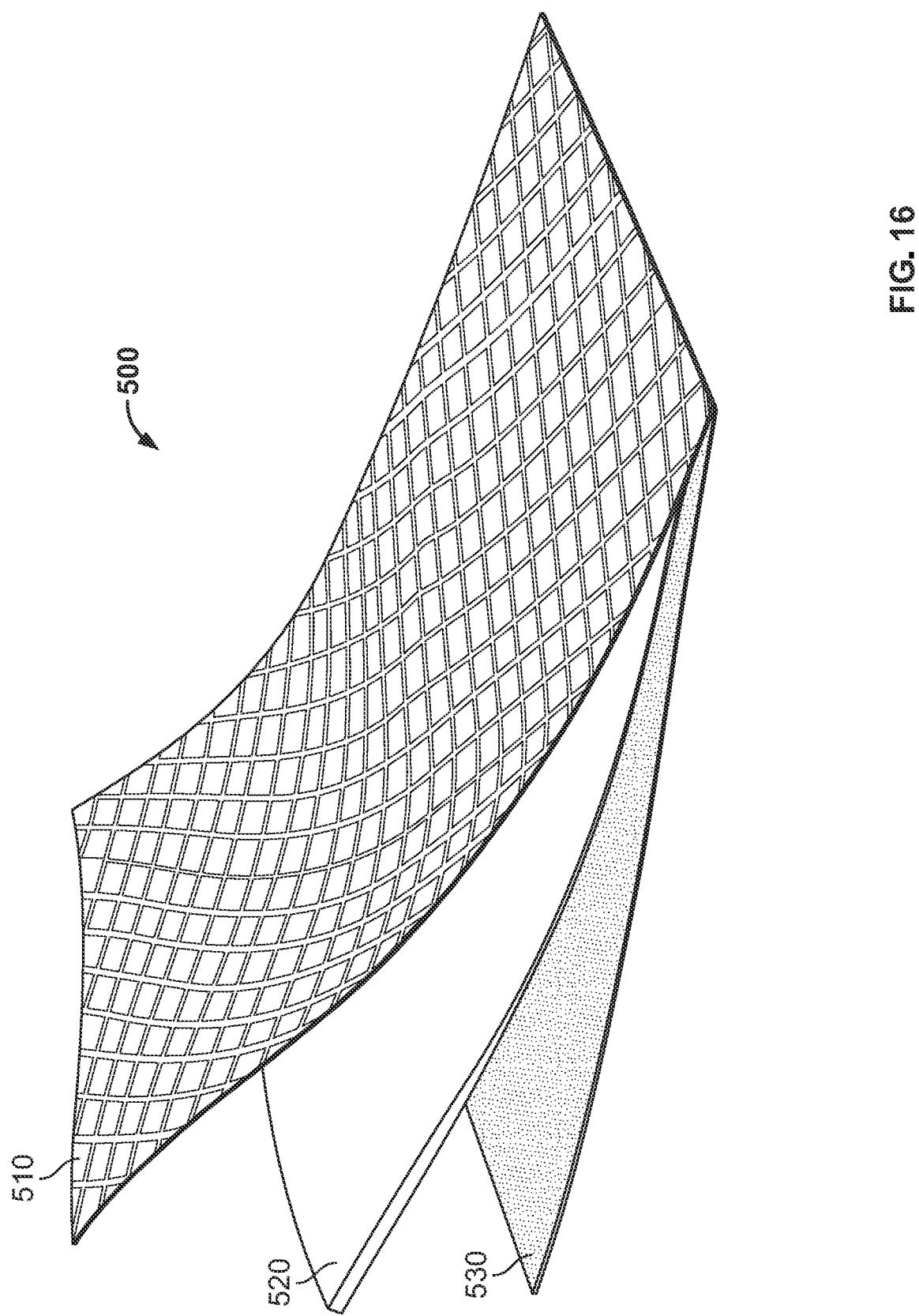
FIGS. 16 through 22 show isometric views of embodiments of roofing shingles, including layers thereof.

Turning to FIGS. 16 through 22, these figures show cross-sections of specific examples of some embodiments of the roofing shingles and embossed roofing membranes, as described herein. In the figures, the layers are shown unattached. FIG. 16 shows an roofing shingle 500, in accordance with the description herein. As shown, the roofing shingle 500 may include a first layer 510, a second layer 520, and a third layer 530. The first layer 510 may be an embossed TPO (thermoplastic polyolefin) sheet. In some embodiments, the first layer 510 includes one or more of the embodiments of the patterns as described herein, including the pattern 26 and the pattern 450. The second layer 520 may be an adhesive layer, such as a butyl adhesive. The third layer 530 may be a release liner, such as a removable silicone release liner, configured to be removed so that the roofing shingle 500 may be adhered to a roof deck, such as either directly to the roof deck, or to an underlayment on the roof deck. Each of the components of roofing shingle 500 may be as described herein.

Figure 17:
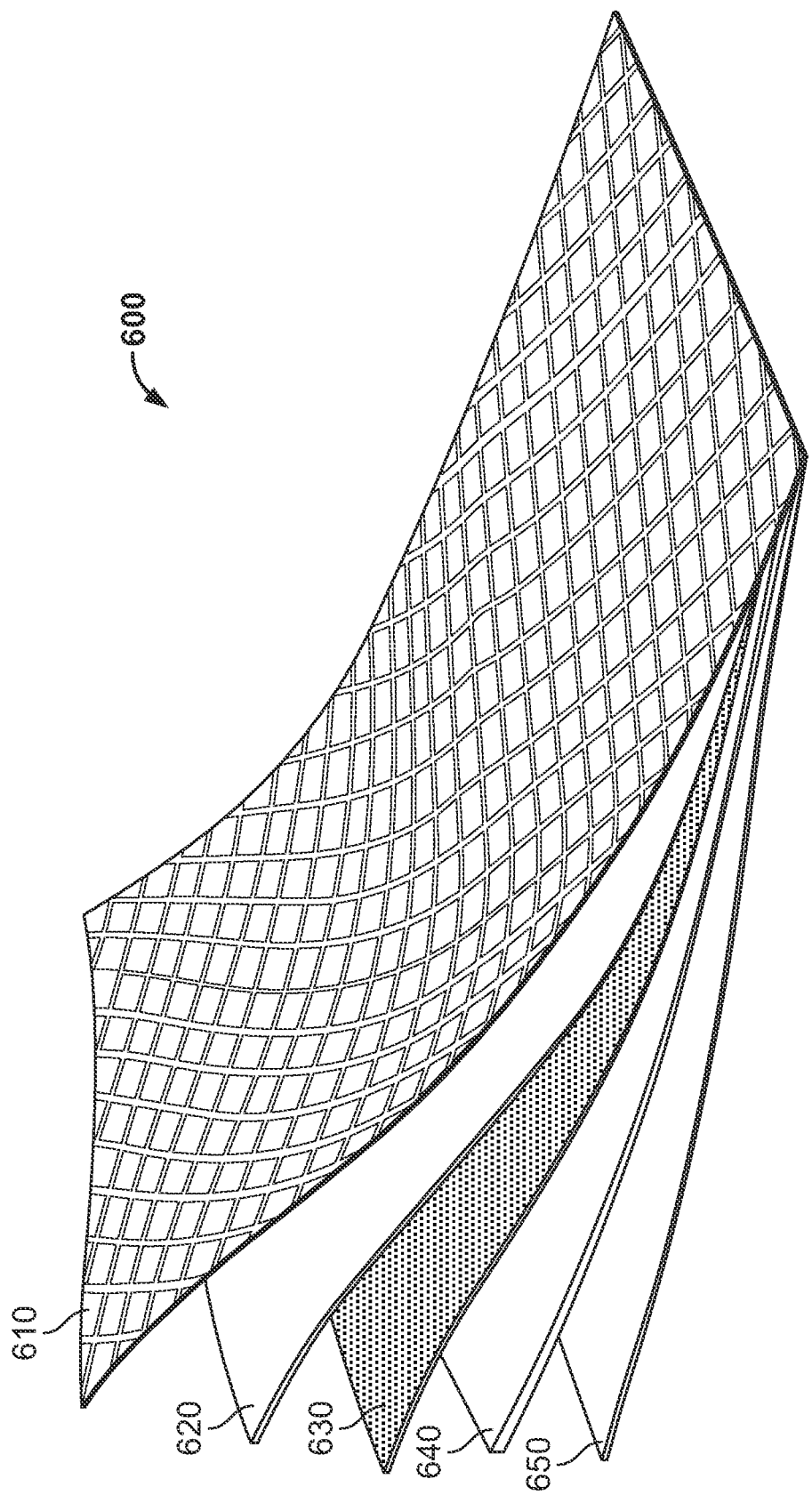

FIG. 17 shows an roofing shingle 600, in accordance with the description herein. As shown, the roofing shingle 600 may include a first layer 610, a second layer 620, a third layer 630, a fourth layer 640, and a fifth layer 650. The first layer 610 may be an embossed TPO (thermoplastic polyolefin) sheet. In some embodiments, the first layer 610 includes one or more of the embodiments of the patterns as described herein, including the pattern 26 and the pattern 450. The second layer 620 may be an adhesive layer, such as a butyl adhesive.

The third layer 630 may be a scrim layer. In some embodiments, the scrim layer may be a fiberglass-reinforced scrim layer. The fourth layer 640 may be a second adhesive layer. In some embodiments, the second adhesive may be a butyl adhesive. The fifth layer 650 may be a release liner, such as a removable silicone release liner, configured to be removed so that the roofing shingle 600 may be adhered to a roof deck, such as either directly to the roof deck, or to an underlayment on the roof deck. Each of the components of roofing shingle 600 may be as described herein.

Figure 18:
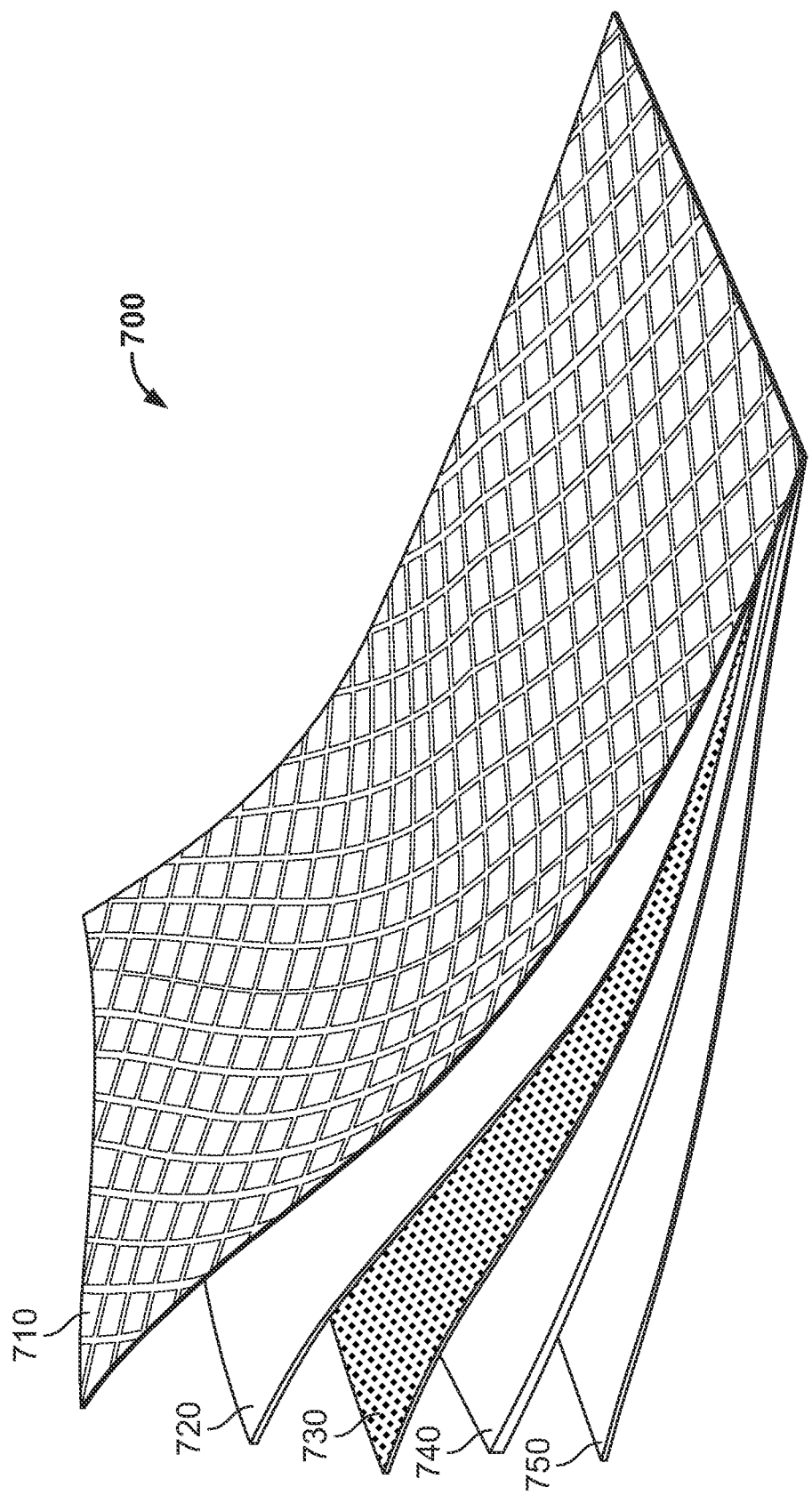

FIG. 18 shows an roofing shingle 700, in accordance with the description herein. As shown, the roofing shingle 700 may include a first layer 710, a second layer 720, a third layer 730, a fourth layer 740, and a fifth layer 750. The first layer 710 may be an embossed TPO (thermoplastic polyolefin) sheet. In some embodiments, the first layer 710 includes one or more of the embodiments of the patterns as described herein, including the pattern 26 and the pattern 450. The second layer 720 may be an adhesive layer, such as a butyl adhesive.

The third layer 730 may be a fire-retardant layer. In some embodiments, the fire-retardant layer may be a fiberglass-reinforced fire-retardant layer. The fourth layer 740 may be a second adhesive layer. In some embodiments, the second adhesive may be a butyl adhesive. The fifth layer 750 may be a release liner, such as a removable silicone release liner, configured to be removed so that the roofing shingle 700 may be adhered to a roof deck, such as either directly to the roof deck, or to an underlayment on the roof deck. Each of the components of roofing shingle 700 may be as described herein.

Figure 19:
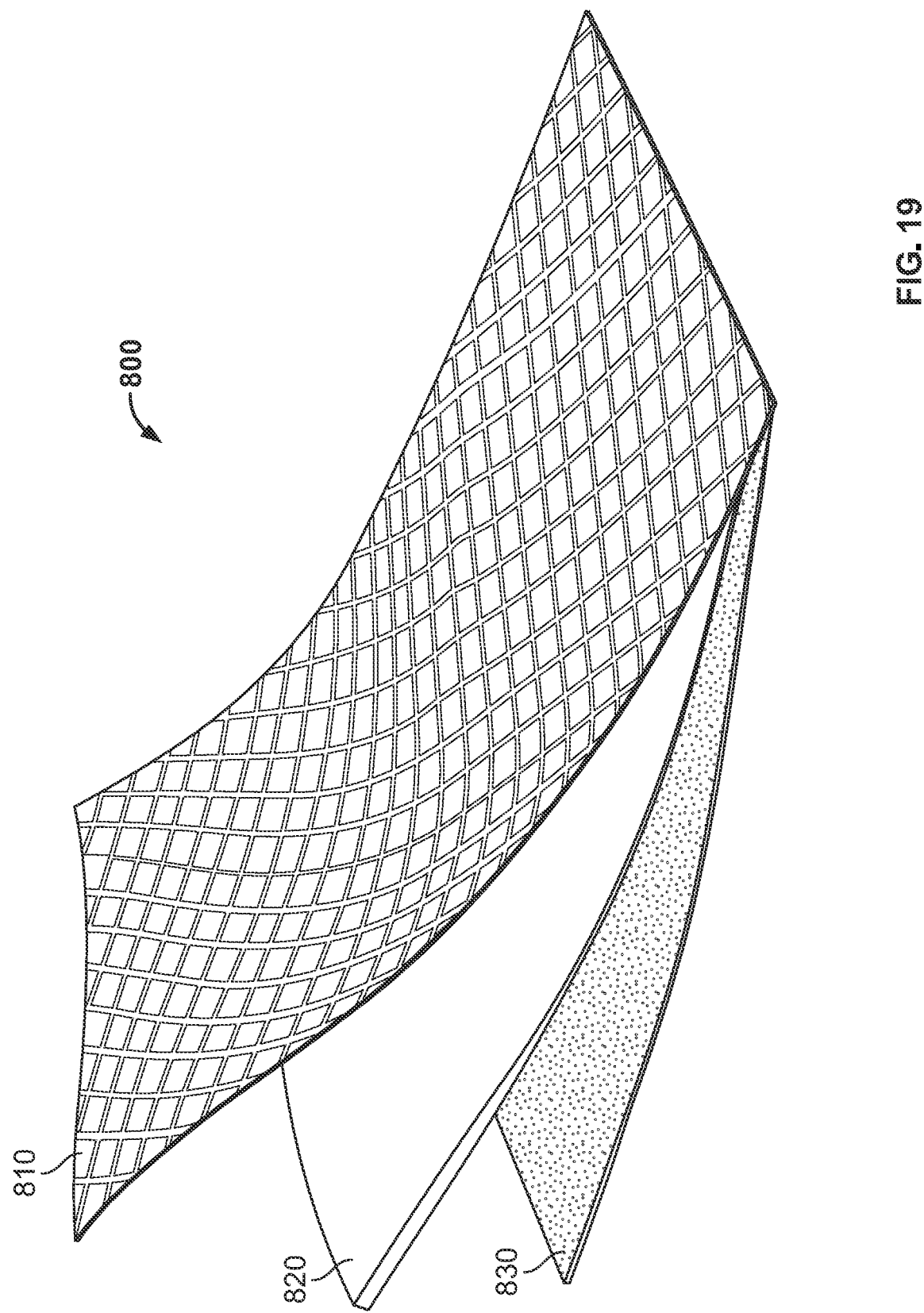

FIG. 19 shows an roofing shingle 800, in accordance with the description herein. As shown, the roofing shingle 800 may include a first layer 810, a second layer 820, and a third layer 830. The first layer 810 may be an embossed TPO (thermoplastic polyolefin) sheet. In some embodiments, the first layer 810 includes one or more of the embodiments of the patterns as described herein, including the pattern 26 and the pattern 450. The second layer 820 may be an adhesive layer, such as a butyl adhesive.

The third layer 830 may be a scrim layer. In some embodiments, the scrim layer may be a fiberglass-reinforced scrim layer. In some embodiments, the third layer 830 may be configured to be mechanically attached to a roof deck, such as either directly to the roof deck, or to an underlayment on the roof deck. Each of the components of roofing shingle 800 may be as described herein.

Figure 20:
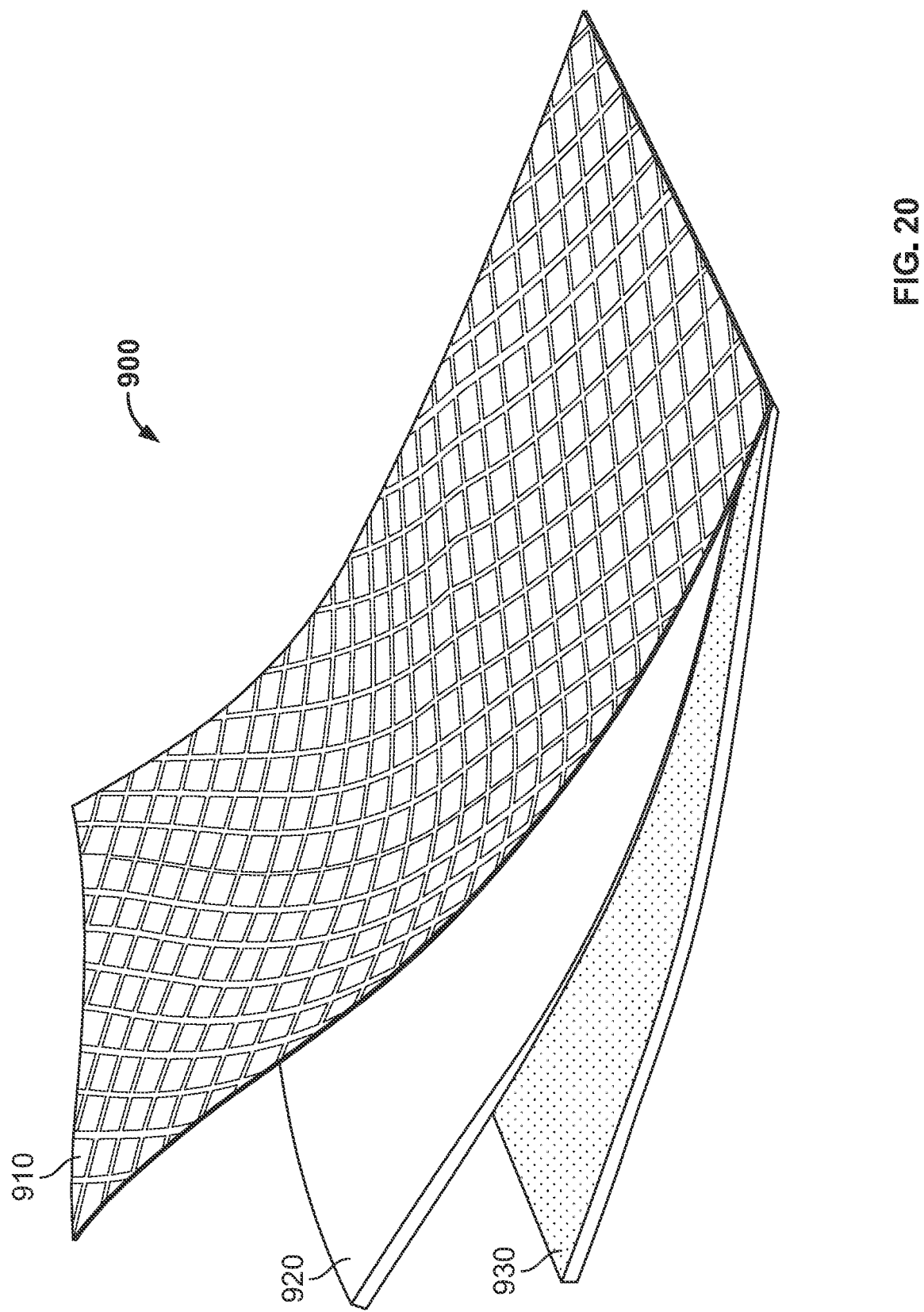

FIG. 20 shows an roofing shingle 900, in accordance with the description herein. As shown, the roofing shingle 900 may include a first layer 910, a second layer 920, and a third layer 930. The first layer 910 may be an embossed TPO (thermoplastic polyolefin) sheet. In some embodiments, the first layer 910 includes one or more of the embodiments of the patterns as described herein, including the pattern 26 and the pattern 450. The second layer 920 may be an adhesive layer, such as a butyl adhesive.

The third layer 930 may be a fire-retardant layer. In some embodiments, the fire-retardant layer may be a fiberglass-reinforced fire-retardant layer. In some embodiments, the third layer 930 may be configured to be mechanically attached to a roof deck, such as either directly to the roof deck, or to an underlayment on the roof deck. Each of the components of roofing shingle 900 may be as described herein.

Figure 21:
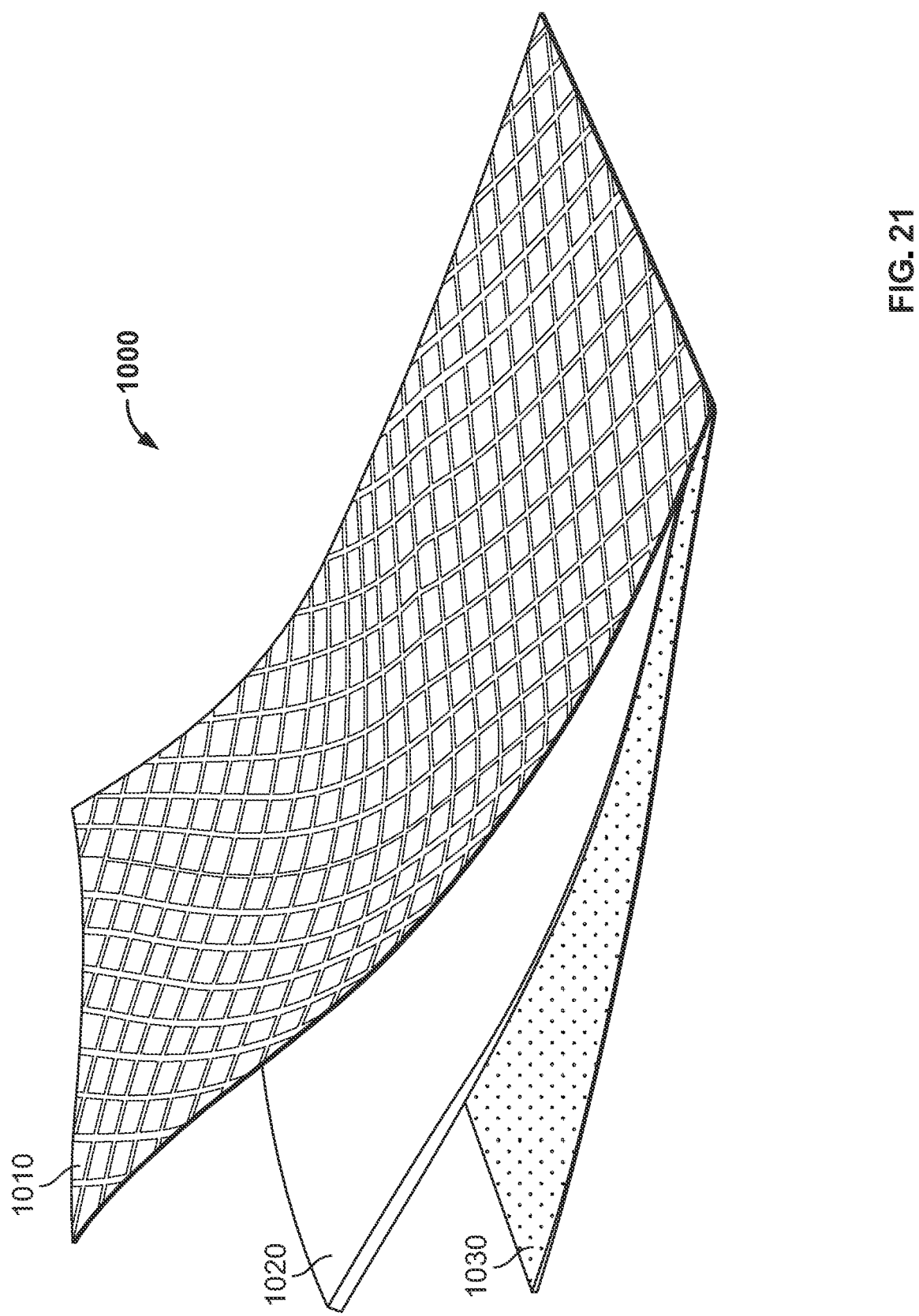

FIG. 21 shows an roofing shingle 1000, in accordance with the description herein. As shown, the roofing shingle 1000 may include a first layer 1010, a second layer 1020, and a third layer 1030. The first layer 1010 may be an embossed TPO (thermoplastic polyolefin) sheet. In some embodiments, the first layer 1010 includes one or more of the embodiments of the patterns as described herein, including the pattern 26 and the pattern 450. The second layer 1020 may be an adhesive layer, such as a butyl adhesive.

The third layer 1030 may be a shingle membrane layer. In some embodiments, the shingle membrane layer may be an asphalt shingle layer. In some embodiments, the third layer 1030 may be configured to be mechanically attached to a roof deck, such as either directly to the roof deck, or to an underlayment on the roof deck. Each of the components of roofing shingle 1000 may be as described herein.

Figure 22:
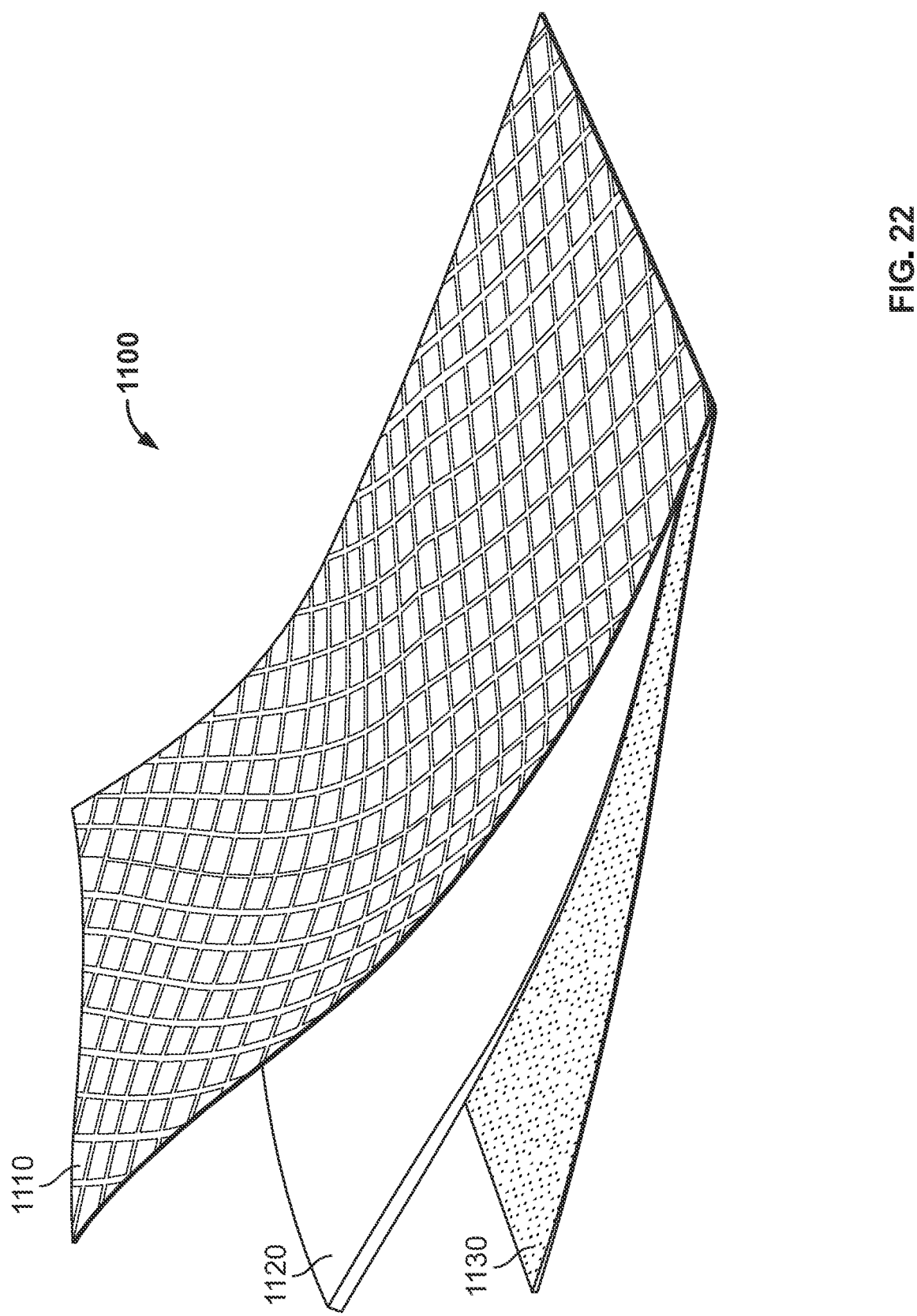

FIG. 22 shows an roofing shingle 1100, in accordance with the description herein. As shown, the roofing shingle 1100 may include a first layer 1110, a second layer 1120, and a third layer 1130. The first layer 1110 may be an embossed TPO (thermoplastic polyolefin) sheet. In some embodiments, the first layer 1110 includes one or more of the embodiments of the patterns as described herein, including the pattern 26 and the pattern 450. The second layer 1120 may be an adhesive layer, such as a butyl adhesive.

The third layer 1130 may be a torchable membrane layer. In some embodiments, the third layer 1130 may be configured to be mechanically attached, by melting, to a roof deck, such as either directly to the roof deck, or to an underlayment on the roof deck. Each of the components of roofing shingle 1100 may be as described herein.

What is claimed is:

1. A system, comprising:
    a plurality of photovoltaic modules installed on a roof deck,
        wherein each of the plurality of photovoltaic modules includes a plurality of solar cells; and
    a plurality of roofing shingles installed on the roof deck, wherein each of the plurality of roofing shingles includes:
    a first end and a second end opposite the first end,
    a cap layer, wherein the cap layer is composed of metal, and
        wherein the cap layer includes a first surface and a pattern on the first surface,
        wherein the pattern includes a depiction of a plurality of solar cells,
        wherein the pattern includes a plurality of pads, wherein the plurality of pads depicts a visual appearance of electrical bussing, wherein the plurality of pads is arranged in a plurality of sets, each of which includes a first pad and a second pad, and wherein the plurality of sets is arranged in a plurality of rows and a plurality of columns, and
    a core layer underneath the cap layer.
2. The system of claim 1, wherein the core layer includes a first layer and a second layer, and wherein at least one of the first layer and the second layer is composed of metal.
3. The system of claim 2, wherein the first layer is composed of metal and the second layer is composed of metal.
4. The system of claim 2, wherein the core layer includes a third layer between the first layer and the second layer, wherein the third layer is composed of metal.

5. The system of claim 4, wherein the cap layer has a thickness of 10 mil to 50 mil, wherein each of the first layer of the core layer and the second layer of the core layer has a thickness of 4 mil to 15 mil, and wherein the third layer has a thickness of 20 mil to 100 mil.

6. The system of claim 1, wherein the first pad and the second pad in each set of each column are spaced apart from one another by 20 mm to 150 mm, and wherein each of the sets of pads of one of the rows in each column is spaced apart from another of the sets of pads in another adjacent one of the rows by 10 mm to 50 mm.

7. The system of claim 6, wherein the second pad of each of the sets of pads in one of the rows in one of the columns is spaced apart from the first pad of another of set of pads in the one of the rows of another adjacent one of the columns by 1 mm to 15 mm.

8. The system of claim 6, wherein each of the plurality of pads includes a length of 5 mm to 30 mm and a width of 1 mm to 10 mm.

9. The system of claim 1, the depiction of a plurality of solar cells is composed of a plurality of dots, and wherein the each of the plurality of dots has a diameter of 1 mm to 5 mm.

10. The system of claim 1, wherein the pattern includes shading that is composed of a color in a CMYK color bracket of [0, 0, 0, X], and wherein X is 60 to 100.

11. The system of claim 10, wherein the shading of the pattern is substantially constant from the first end to the second end.

12. The system of claim 10, wherein X increases from the first end to the second end.

13. The system of claim 10, wherein X decreases from the first end to the second end.

14. The system of claim 1, wherein the core layer is composed of a polymer.

15. A roofing shingle, comprising:
   a cap layer,
      wherein the cap layer is composed of metal, and
      wherein the cap layer includes a first surface and a pattern on the first surface,
      wherein the pattern includes a depiction of a plurality of solar cells,
      wherein the pattern includes a plurality of pads, wherein the plurality of pads depicts a visual appearance of electrical bussing, wherein the plurality of pads is arranged in a plurality of sets, each of which includes a first pad and a second pad, and wherein the plurality of sets is arranged in a plurality of rows and a plurality of columns, and
   a core layer underneath the cap layer.

16. The roofing shingle of claim 15, wherein the core layer includes a first layer and a second layer, and wherein at least one of the first layer and the second layer is composed of metal.

17. The roofing shingle of claim 16, wherein the first layer is composed of metal and the second layer is composed of metal.

18. The roofing shingle of claim 16, wherein the core layer includes a third layer between the first layer and the second layer, and wherein the third layer is composed of metal.

19. A system, comprising:
   a plurality of photovoltaic modules installed on a roof deck,
      wherein each of the plurality of photovoltaic modules includes a plurality of solar cells; and
   a plurality of roofing shingles installed on the roof deck, wherein each of the plurality of roofing shingles includes:
   a cap layer, wherein the cap layer is composed of metal, and
      wherein the cap layer includes a first surface and a pattern on the first surface,
      wherein the pattern includes a depiction of a plurality of solar cells,
      wherein the pattern includes a plurality of pads, wherein the plurality of pads depict a visual appearance of electrical bussing of the depiction of the plurality of solar cells, wherein the plurality of pads is arranged in a plurality of sets, each of which includes a first pad and a second pad, and wherein the sets of the first and second pads are arranged in a matrix including a plurality of rows and a plurality of columns, and
   a core layer underneath the cap layer.

20. The roofing shingle of claim 15, wherein the core layer is composed of a polymer.

* * * * *